US010756068B2

(12) United States Patent
Takeya et al.

(10) Patent No.: US 10,756,068 B2
(45) Date of Patent: Aug. 25, 2020

(54) DISPLAYING APPARATUS HAVING LIGHT EMITTING DEVICE, METHOD OF MANUFACTURING THE SAME AND METHOD OF TRANSFERRING LIGHT EMITTING DEVICE

(71) Applicant: Seoul Semiconductor Co., Ltd., Ansan-si (KR)

(72) Inventors: Motonobu Takeya, Ansan-si (KR); Seong Su Son, Ansan-si (KR); Jong Ik Lee, Ansan-si (KR); Jae Hee Lim, Ansan-si (KR); Jong Hyeon Chae, Ansan-si (KR); Seung Sik Hong, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 16/207,692

(22) Filed: Dec. 3, 2018

(65) Prior Publication Data
US 2019/0229097 A1    Jul. 25, 2019

Related U.S. Application Data

(60) Provisional application No. 62/595,010, filed on Dec. 5, 2017, provisional application No. 62/610,489, filed
(Continued)

(51) Int. Cl.
| H01L 33/62 | (2010.01) |
| H01L 33/00 | (2010.01) |
| H01L 25/075 | (2006.01) |
| H01L 33/36 | (2010.01) |
| H01L 33/08 | (2010.01) |

(Continued)

(52) U.S. Cl.
CPC ...... *H01L 25/0753* (2013.01); *H01L 21/6835* (2013.01); *H01L 25/167* (2013.01);
(Continued)

(58) Field of Classification Search
CPC ............. H01L 25/0753; H01L 21/6835; H01L 25/167; H01L 33/0079; H01L 33/504;
(Continued)

(56) References Cited

U.S. PATENT DOCUMENTS

| 2011/0096134 A1* | 4/2011 | Kang ........................ B41J 2/45 347/224 |
| 2015/0362165 A1 | 6/2015 | Bower et al. |

(Continued)

FOREIGN PATENT DOCUMENTS

| WO | 2017/034379 | 3/2017 |

OTHER PUBLICATIONS

European Search Report dated Sep. 2, 2019, issued in the European Patent Application No. 18210238.4.

*Primary Examiner* — Ly D Pham
(74) *Attorney, Agent, or Firm* — H.C. Park & Associates, PLC

(57) ABSTRACT

A displaying apparatus including: a panel substrate; a plurality of light emitting devices arranged on the panel substrate; and at least one connection tip disposed on one surface of each of the light emitting devices. Each of the light emitting devices includes a light emitting structure including a first conductivity type semiconductor layer, a second conductivity type semiconductor layer, and an active layer interposed between the first and second conductivity type semiconductor layers; and first and second electrode pads disposed on the light emitting structure.

20 Claims, 51 Drawing Sheets

Related U.S. Application Data on Dec. 26, 2017, provisional application No. 62/694,353, filed on Jul. 5, 2018.

(51) Int. Cl.
| | |
|---|---|
| *H01L 51/52* | (2006.01) |
| *H01L 21/683* | (2006.01) |
| *H01L 25/16* | (2006.01) |
| *H01L 33/50* | (2010.01) |
| *H01L 33/60* | (2010.01) |

(52) U.S. Cl.
CPC ........ *H01L 33/0079* (2013.01); *H01L 33/504* (2013.01); *H01L 33/60* (2013.01); *H01L 33/62* (2013.01); *H01L 2221/68377* (2013.01); *H01L 2933/0041* (2013.01); *H01L 2933/0058* (2013.01); *H01L 2933/0066* (2013.01)

(58) Field of Classification Search
CPC ............... H01L 33/60; H01L 33/62; H02L 2221/68377; H02L 2933/0041; H02L 2933/0058; H02L 2933/0066
USPC .......................................................... 257/91
See application file for complete search history.

(56) References Cited

U.S. PATENT DOCUMENTS

| | | | |
|---|---|---|---|
| 2016/0099388 A1* | 4/2016 | Jung | H01L 33/502 438/16 |
| 2016/0351764 A1* | 12/2016 | Cha | H01L 33/58 |
| 2017/0077348 A1* | 3/2017 | Lim | H01L 33/14 |
| 2017/0236866 A1* | 8/2017 | Lee | H01L 27/156 257/89 |
| 2017/0288093 A1* | 10/2017 | Cha | H01L 25/0756 |
| 2017/0294479 A1* | 10/2017 | Cha | H01L 25/0655 |
| 2017/0338212 A1 | 11/2017 | Kuo et al. | |
| 2017/0358624 A1* | 12/2017 | Takeya | H01L 27/156 |
| 2018/0012949 A1* | 1/2018 | Takeya | H01L 25/167 |
| 2018/0175264 A1* | 6/2018 | Lee | F21K 9/27 |
| 2018/0277524 A1 | 9/2018 | Moon et al. | |
| 2019/0288049 A1* | 9/2019 | Takeya | H01L 51/5237 |

* cited by examiner

DISPLAYING APPARATUS HAVING LIGHT EMITTING DEVICE, METHOD OF MANUFACTURING THE SAME AND METHOD OF TRANSFERRING LIGHT EMITTING DEVICE

CROSS-REFERENCE TO RELATED APPLICATIONS

This application claims priority from and the benefit of U.S. Provisional Application No. 62/595,010, filed on Dec. 5, 2017, U.S. Provisional Application No. 62/610,489, filed on Dec. 26, 2017, and U.S. Provisional Application No. 62/694,353, filed on Jul. 5, 2018, which are hereby incorporated by reference for all purposes as if fully set forth herein.

BACKGROUND

Field

Exemplary embodiments of the invention relate generally to a displaying apparatus having light emitting devices, a method of manufacturing the same, and a method of transferring light emitting devices.

Discussion of the Background

Light emitting devices are semiconductor devices using light emitting diodes which are inorganic light sources, and are used in various fields such as displaying apparatuses, automobile lamps, general lighting, and the like. Light emitting diodes have advantages such as long lifespan, low power consumption, and rapid response, and thus are rapidly replacing existing light sources.

In the meantime, a conventional light emitting diode has been mainly used as a light source of a backlight unit in a displaying apparatus. Recently, a micro LED used in a displaying apparatus implementing a direct image using a light emitting diode has been developed.

A displaying apparatus generally implements various colors by using mixed colors of blue, green and red. The displaying apparatus comprises a plurality of pixels to implement various images, and each pixel has blue, green, and red subpixels. A color of a particular pixel is determined through colors of these subpixels, and an image is implemented by a combination of these pixels.

In the case of a micro LED display, micro LEDs are arranged on a two-dimensional plane corresponding to each sub-pixel, and thus it is necessary that a large number of micro LEDs are arranged on one substrate. However, the micro LED whose size is less than 200 microns, further less than 100 microns is very small, and various problems occur because of these small sizes. In particular, it is difficult to handle light emitting diodes of a small size and it is not easy to mount a light emitting diode on a display panel.

The above information disclosed in this Background section is only for understanding of the background of the inventive concepts, and, therefore, it may contain information that does not constitute prior art.

SUMMARY

Exemplary embodiments of the inventive concepts provide a method of manufacturing a displaying apparatus by which a plurality of light emitting devices formed on a growth substrate can be easily mounted on a display panel substrate and a displaying apparatus manufactured through the method.

Exemplary embodiments of the inventive concepts also provide a method of transferring light emitting devices capable of safely transferring a large amount of light emitting devices to a display panel substrate.

Additional features of the inventive concepts will be set forth in the description which follows, and in part will be apparent from the description, or may be learned by practice of the inventive concepts.

A displaying apparatus according to an exemplary embodiment may comprise: a panel substrate; a plurality of light emitting devices arranged on the panel substrate; and at least one connection tip disposed on one surface of each of the light emitting devices, wherein each of the light emitting devices may comprise a light emitting structure comprising a first conductivity type semiconductor layer, a second conductivity type semiconductor layer and an active layer interposed between the first and second conductivity type semiconductor layers; and first and second electrode pads disposed on the light emitting structure.

A method of transferring light emitting device according to an exemplary embodiment may comprise: forming a plurality of light emitting devices regularly arranged on a substrate; forming a mask layer covering the plurality of light emitting devices, and having at least one hole over each of the light emitting devices; forming a connection layer on the mask layer, the connection layer being connected to the light emitting devices through the holes; coupling a first temporary substrate to an upper surface of the connection layer; removing the substrate and the mask layer from the light emitting devices; coupling a second temporary substrate to lower surfaces of the light emitting devices; and separating the light emitting devices from the connection layer.

A method of transferring light emitting devices according to an exemplary embodiment may comprise: forming a plurality of light emitting devices regularly arranged on a substrate; forming a first mask layer covering the plurality of light emitting devices; coupling a first temporary substrate to an upper surface of the first mask layer; removing the substrate from the light emitting devices; forming a second mask layer under the first mask layer, and having at least one hole under each of the light emitting devices; forming a connection layer under the second mask layer, the connection layer being connected to the light emitting devices through the holes; coupling a second temporary substrate to a lower surface of the connection layer; removing the first temporary substrate and the first and second mask layers from the light emitting devices; and separating the light emitting devices from the connection layer.

A method of manufacturing a displaying apparatus according to an exemplary embodiment may comprise: forming a plurality of light emitting devices regularly arranged on a substrate; forming a mask layer covering the plurality of light emitting devices, and having at least one hole over each of the light emitting devices; forming a connection layer on the mask layer, the connection layer being connected to the light emitting devices through the holes; coupling a first temporary substrate to an upper surface of the connection layer; removing the substrate and the mask layer from the light emitting devices; coupling a second temporary substrate to lower surfaces of the light emitting devices; separating the light emitting devices from the connection layer; and separating at least one light emitting device among the plurality of light emitting devices disposed on the second temporary substrate from the second temporary substrate.

A method of manufacturing a displaying apparatus according to an exemplary embodiment may comprise: forming a plurality of light emitting devices regularly arranged on a substrate; forming a first mask layer covering the plurality of light emitting devices; coupling a first temporary substrate onto the first mask layer; removing the substrate from the light emitting devices; forming a second mask layer under the first mask layer, and having at least one hole under each of the light emitting devices; forming a connection layer on the second mask layer, the connection layer being connected to the light emitting devices through the holes; coupling a second temporary substrate to a lower surface of the connection layer; removing the first temporary substrate and the first and second mask layers from the light emitting devices; and separating at least one light emitting device among the light emitting devices on the second temporary substrate from the connection layer.

It is to be understood that both the foregoing general description and the following detailed description are exemplary and explanatory and are intended to provide further explanation of the invention as claimed.

BRIEF DESCRIPTION OF DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
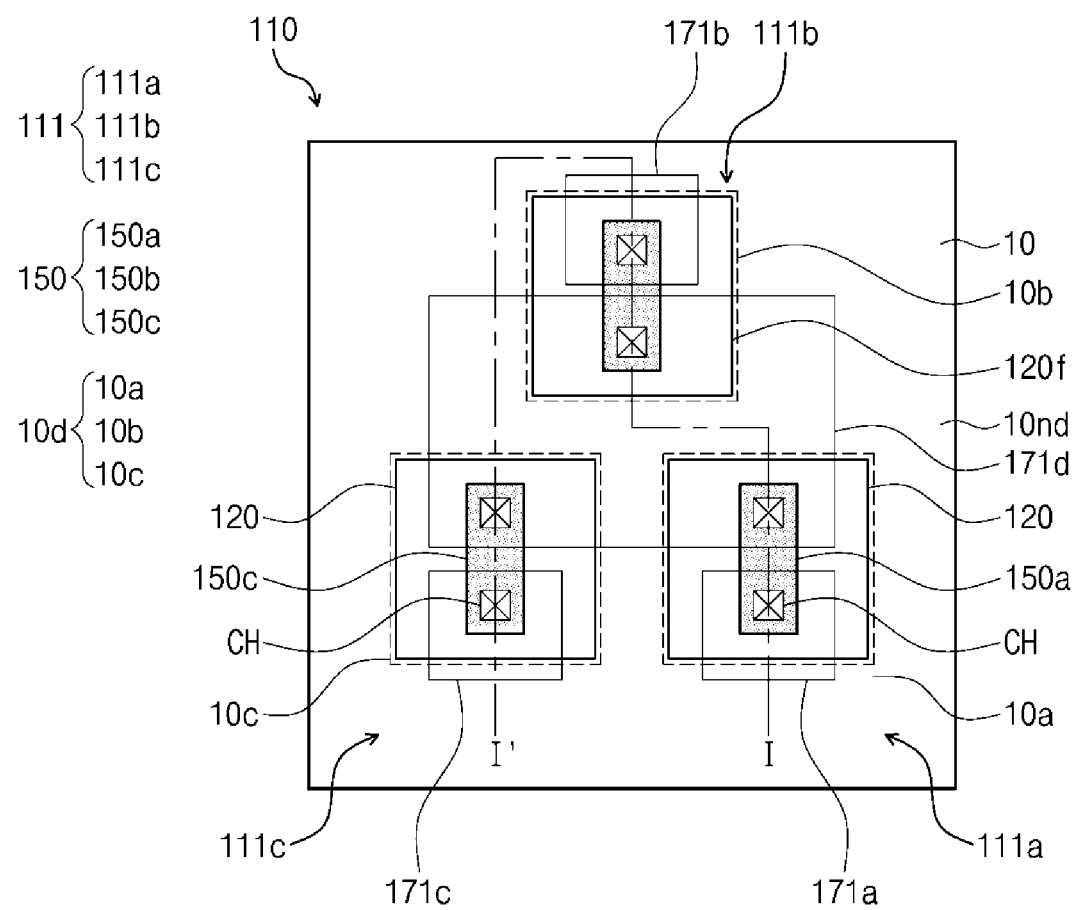
FIG. 1A is a plan view showing a light emitting apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A displaying apparatus according to an exemplary embodiment may comprise: a panel substrate; a plurality of light emitting devices arranged on the panel substrate; and at least one connection tip disposed on one surface of each of the light emitting devices, wherein each of the light emitting devices may comprise a light emitting structure comprising a first conductivity type semiconductor layer, a second conductivity type semiconductor layer and an active layer interposed between the first and second conductivity type semiconductor layers; and first and second electrode pads disposed on the light emitting structure.

In one exemplary embodiment, the at least one connection tip is disposed on the light emitting structure, and may be disposed between the first and second electrode pads.

A thickness of the at least one connection tip may be smaller than thicknesses of the first and second electrode pads. Accordingly, an upper end of the connection tip is located lower than upper ends of the first and second electrode pads.

In one exemplary embodiment, the at least one connection tip may be disposed on an opposite side of the light emitting structure opposite to the first and second electrode pads.

The at least one connection tip may contact the first conductivity type semiconductor layer.

In addition, a plurality of connection tips may be disposed on each of the light emitting devices, and wherein the plurality of connection tips arranged on each of the light emitting devices may be disposed asymmetrically to at least one alignment direction of the light emitting devices arranged on the panel substrate.

Here, the at least one connection tip may comprise three connection tips arranged in triangular shape, wherein one of the three connection tips may be disposed along a first row, and the others may be disposed along another row adjacent to the first row.

The at least one connection tip may further comprise a connection tip disposed at a center of the light emitting device, wherein the connection tip disposed at the center of the light emitting device may be disposed in the triangle formed by the three connection tips.

Furthermore, the connection tips may have right triangular shapes. In addition, the connection tip disposed at the center of the light emitting device may be disposed in a different direction from that of the other connection tips.

The plurality of connection tips may have different thicknesses.

In the meantime, an area ratio of the connection tip to a planar area of the light emitting device may be 1.2% or less.

The first electrode pad may be electrically connected to the first conductivity type semiconductor layer through a via-hole formed in the second conductivity type semiconductor layer and the active layer.

In addition, the light emitting device may further comprise an insulation layer covering the second conductivity type semiconductor layer and side surfaces of the first conductivity type semiconductor layer.

The light emitting device may further comprise an ohmic-layer disposed on the second conductivity type semiconductor layer, and the insulation layer may cover the ohmic-layer and side surfaces of the first conductivity type semiconductor layer.

The displaying apparatus may further comprise: bumps electrically connected to the light emitting devices; a base substrate disposing opposite to the bumps and transmitting light emitted from the light emitting devices; a step adjustment layer disposed between the bumps and the light emitting devices to cover the light emitting devices; and an adhesive layer disposed between the base substrate and the light emitting devices to adhere the light emitting devices to the base substrate, wherein the step adjustment layer and the adhesive layer cover side surfaces of the light emitting device.

In addition, the displaying apparatus may further comprise a protection layer covering side surfaces of the bumps and the step adjustment layer.

Furthermore, the connection tip may be buried in the adhesive layer.

The base substrate may have irregularities on the surface thereof.

The displaying apparatus may further comprise: a light blocking layer disposed between the adhesive layer and the base substrate, wherein the light blocking layer may have a window transmitting light generated in the light emitting device, and a width of the window may be smaller than that of the light emitting device.

A method of transferring light emitting device according to another exemplary embodiment may comprise: forming a plurality of light emitting devices regularly arranged on a substrate; forming a mask layer covering the plurality of light emitting devices, and having at least one hole over each of the light emitting devices; forming a connection layer on the mask layer, the connection layer being connected to the light emitting devices through the holes; coupling a first temporary substrate to an upper surface of the connection layer; removing the substrate and the mask layer from the light emitting devices; coupling a second temporary substrate to lower surfaces of the light emitting devices; and separating the light emitting devices from the connection layer.

Furthermore, the method of transferring light emitting device may further comprise transferring at least one light emitting device among the plurality of light emitting devices disposed on the second temporary substrate to another substrate.

Here, separating the light emitting devices from the connection layer may be performed by applying an external force to one side of the second temporary substrate in a direction opposite to the first temporary substrate.

As the connection layer and the light emitting devices are separated by the external force, connection tips as portions of the connection layer may remain on the light emitting devices.

In addition, in the step of coupling the first temporary substrate, the first temporary substrate may be coupled to the upper surface of the connection layer so as to dispose a film portion between the connection layer and the first temporary substrate.

The method may further comprise, after the mask layer is removed, removing the first temporary substrate disposed over the light emitting devices from the film portion, wherein the second temporary substrate may be coupled to lower surfaces of the light emitting devices after the first temporary substrate is removed.

A method of transferring light emitting device according to another exemplary embodiment may comprise: forming a plurality of light emitting devices regularly arranged on a substrate; forming a first mask layer covering the plurality of light emitting devices; coupling a first temporary substrate to an upper surface of the first mask layer; removing the substrate from the light emitting devices; forming a second mask layer under the first mask layer, and having at least one hole under each of the light emitting devices; forming a connection layer under the second mask layer, the connection layer being connected to the light emitting devices through the holes; coupling a second temporary substrate to a lower surface of the connection layer; removing the first temporary substrate and the first and second mask layers from the light emitting devices; and separating the light emitting devices from the connection layer.

When the light emitting devices are separated from the connection layer, a portion of the connection layer may remain on at least one of the light emitting devices to form a connection tip.

A method of manufacturing a displaying apparatus according to another exemplary embodiment may comprise: forming a plurality of light emitting devices regularly arranged on a substrate; forming a mask layer covering the plurality of light emitting devices, and having at least one hole over each of the light emitting devices; forming a connection layer on the mask layer, the connection layer being connected to the light emitting devices through the holes; coupling a first temporary substrate to an upper surface of the connection layer; removing the substrate and the mask layer from the light emitting devices; coupling a second temporary substrate to lower surfaces of the light emitting devices; separating the light emitting devices from the connection layer; and separating at least one light emitting device among the plurality of light emitting devices disposed on the second temporary substrate from the second temporary substrate.

Separating the light emitting devices from the connection layer may be performed by applying an external force to one side of the second temporary substrate in a direction perpendicular to the first temporary substrate.

A method of manufacturing a displaying apparatus according to another exemplary embodiment may comprise: forming a plurality of light emitting devices regularly arranged on a substrate; forming a first mask layer covering the plurality of light emitting devices; coupling a first temporary substrate onto the first mask layer; removing the substrate from the light emitting devices; forming a second mask layer under the first mask layer, and having at least one hole under each of the light emitting devices; forming a connection layer on the second mask layer, the connection layer being connected to the light emitting devices through the holes; coupling a second temporary substrate to a lower surface of the connection layer; removing the first temporary substrate and the first and second mask layers from the light emitting devices; and separating at least one light emitting device among the light emitting devices on the second temporary substrate from the connection layer.

Here, when the light emitting device is separated from the connection layer, a portion of the connection layer may remain on the light emitting device to form a connection tip.

The present disclosure may be variously modified and realized in many different forms, and thus specific embodiments will be exemplified in the drawings and described in detail hereinafter. However, the present disclosure should not be limited to the specific disclosed forms, and be construed to include all modifications, equivalents, or replacements included in the inventive concepts.

The present disclosure relates a light emitting device including a pixel. The light emitting device in the present disclosure includes a displaying apparatus and/or a lighting device including a light emitting device. In the light emitting device, in a case where light emitting devices are used as pixels that display an image, the light emitting device may be used as the displaying apparatus. The displaying apparatus includes a television set, a tablet computer, an e-book displaying apparatus, a computer monitor, a kiosk, a digital camera, a game console, a mobile phone, a personal digital assistant (PDA), a large-sized outdoor/indoor display board, or the like. The lighting device may include a backlight used for the displaying apparatus, an indoor/outdoor lighting device, a street light device, or a vehicle lighting device.

The light emitting device according to an exemplary embodiment includes micro-light emitting devices. The micro-light emitting devices may be elements with a width or length of about 1 micrometer to about 800 micrometers scale, about 1 micrometer to about 500 micrometers scale, or about 10 micrometers to about 300 micrometers scale. However, the micro-light emitting devices do not need to have the width or length in the above-mentioned ranges and, if necessary, may have a smaller or larger width or length.

Hereinafter, exemplary embodiments will be explained in detail with reference to the accompanying drawings.

Figure 1B:
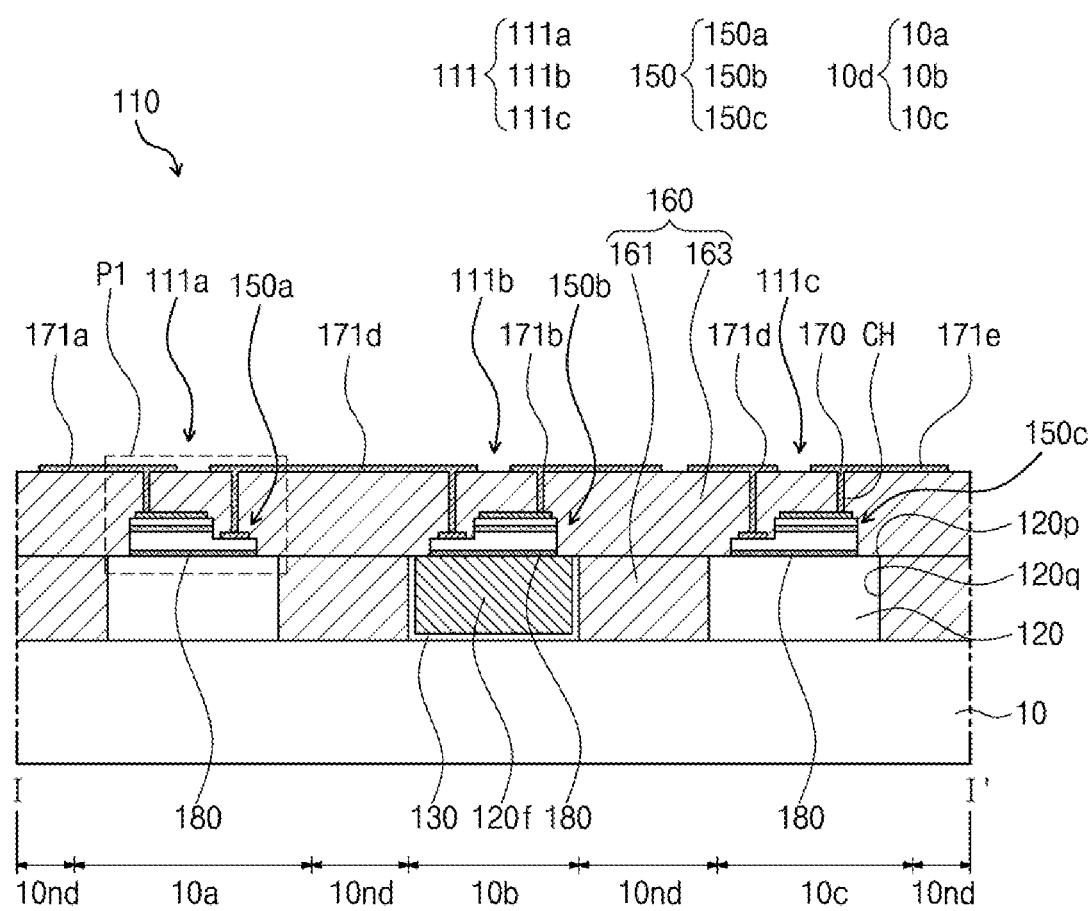
FIG. 1B is a cross-sectional view taken along the line I-I' of FIG. 1A.

FIG. 1A is a plan view showing a light emitting device according to an exemplary embodiment, and FIG. 1B is a cross-sectional view taken along the line I-I' of FIG. 1A.

Referring to FIGS. 1A and 1B, the light emitting apparatus according to the exemplary embodiment includes a substrate 10 and a pixel unit 110 disposed above the substrate 10 and including at least one pixel 111.

The substrate 10 includes at least one pixel area 10*d* and a non-pixel area 10*nd* surrounding the pixel area 10*d*. The pixel area 10*d* corresponds to an area in which the pixel 111 is disposed and through which a light exiting from a light emitting device 150 described later travels to be perceived by a user. The non-pixel area 10*nd* corresponds to an area except for the pixel area 10*d*. The non-pixel area 10*nd* is provided adjacent to at least one side portion of the pixel 111, and in the exemplary embodiment, the non-pixel area 10*nd* is provided to surround the pixel area 10*d*.

The substrate 10 may be formed of a light transmitting insulating material. The expression of "the substrate 10 has the light transmitting property" indicates various cases where the substrate 10 is transparent to transmit the light entirely, the substrate 10 is semi-transparent to transmit only light having a specific wavelength, and the substrate 10 is partially transparent to transmit only a portion of the light having the specific wavelength.

As the material for the substrate 10, a glass, a quartz, an organic polymer, or an organic-inorganic composite material may be used, however it should not be limited thereto or thereby. That is, the material for the substrate 10 should not be particularly limited as long as the material is optically transparent and insulative.

Each pixel unit 110 is a minimum unit that displays the image and the pixel unit is provided in plural in the display. Each pixel unit 110 may emit a white light and/or a color light. Each pixel unit 110 may include one pixel 111 emitting one color or may include plural pixels 111 different from each other to emit the white light and/or the color light obtained by combining different colors. For example, each pixel unit 110 may include first, second, and third pixels 111a, 111b, and 111c.

The pixel 111 is provided in the pixel area 10d of the substrate 10. The pixel 111 is provided in one pixel area 10d in a group or one-to-one fashion according to embodiments. In other words, each pixel unit 110 may be provided with at least one pixel 111, for example, each pixel unit 110 may include the first, second, and third pixels 111a, 111b, and 111c. The first, second, and third pixels 111a, 111b, and 111c are provided in first, second, and third pixel areas 10a, 10b, and 10c, respectively. The first, second, and third pixels 111a, 111b, and 111c may be implemented by first, second, and third light emitting devices 150a, 150b, and 150c that emit lights having different wavelength bands from each other. That is, when the lights emitted by the first, second, and third light emitting devices 150a, 150b, and 150c are referred to as "first, second, and third lights", respectively, the first to third lights may have different wavelength bands. In the exemplary embodiment, the first, second, and third lights may correspond to blue, red, and green wavelength bands, respectively. However, the wavelength bands of the lights emitted by the pixels 111 included in each pixel unit 110 should not be limited thereto or thereby, and the wavelength bands may correspond to cyan, magenta, and yellow wavelength bands. Hereinafter, a structure in which each pixel unit 110 includes the first, second, and third pixels 111a, 111b, and 111c that respectively emit blue, red, and green lights will be described as an example.

The pixel 111 includes a light passing layer 120 provided on the substrate 10, the light emitting device 150 provided on the light passing layer 120, an insulation layer 160 provided on the light emitting device 150, and a terminal part 170 provided on the insulation layer 160.

The light passing layer 120 is a layer through which a light emitted from the light emitting device 150 passes and is provided in the pixel area 10d. The light passing layer 120 may be provided in each pixel area 10d in a one-to-one fashion. For example, when the first, second, and third pixels 111a, 111b, and 111c are provided, the light passing layer 120 is provided in every first, second, and third pixels areas 10a, 10b, and 10c in which the first, second, and third pixels 111a, 111b, and 111c are respectively provided. In FIG. 1A, the light passing layer 120 is shown smaller than the pixel area 10d, however, this is just for the convenience of explanation. The light passing layer 120 and the pixel area 10d may correspond to each other and may have different sizes from those shown in drawings. For instance, an area of the light passing layer 120 when viewed in a plan view may be slightly smaller than, equal to, or slightly larger than an area of the pixel area 10d. However, the light passing layer 120 respectively provided in the pixel areas 10d adjacent to each other are spaced apart from each other and do not meet or make contact with each other.

When viewed in a plan view, the light passing layer 120 is provided in a shape corresponding to a shape of the pixel area 10d. when viewed in a cross section, the light passing layer 120 has a rectangular shape with an upper surface 120p and a side surface 120q. In the exemplary embodiment, the upper surface 120p may be substantially parallel to a surface of the substrate 10 disposed thereunder such that the light emitting device 150 may be provided on the upper surface 120p.

The light reaching the light passing layer 120 from the light emitting device 150 passes through the light passing layer 120 after being incident into the light passing layer 120 and exits to the outside. The light passing layer 120 transmits at least a portion (e.g., at least a portion of light amount and/or at least a portion of specific wavelength) of the light from the light emitting device 150.

The light passing through the light passing layer 120 may maintain a wavelength thereof when being incident into the light passing layer 120 or may be converted to a light with a wavelength different from the wavelength when being incident into the light passing layer 120.

In the case where the light passing through the light passing layer 120 maintains the same wavelength before and after passing through the light passing layer 120, the light passing layer 120 may serve as a waveguide. In the case where the light passing through the light passing layer 120 have different wavelengths before and after passing through the light passing layer 120, the light passing layer 120 may serve as a light conversion layer 120f In the present exemplary embodiment, for the convenience of explanation, when the light passing layer 120 serves as the light conversion layer 120f, the light passing layer 120 will be referred to as the "light conversion layer" 120f and will be assigned with a separate reference numeral. However, it should be understood that the light conversion layer 120f has been explained as a component included in the light passing layer 120 depending on situations.

As described above, the light conversion layer 120f absorbs the wavelength of the light from the light emitting device 150 and emits the light having the different wavelength. The light conversion layer 120f absorbs the light of relatively shorter wavelength and emits the light having longer wavelength than that of the absorbed light. The light conversion layer 120f may selectively include materials that are able to absorb a light having a predetermined wavelength and emit a light having a different wavelength. As an example, the light conversion layer 120f may include a nano-structure such as a fluorescent substance and a quantum dot, an organic material capable of converting color, or a combination thereof. For example, when the fluorescent substance is used as the material for the light conversion layer 120f, the fluorescent substance may absorb a blue light and may emit a red light. The fluorescent substance may be provided in a mixed form with a transparent or semi-transparent binder, such as PDMS (polydimethylsiloxane), PI (polyimide), PMMA (poly(methyl 2-methylpropenoate)), or ceramic.

The light emitting device 150 is provided on the light conversion layer 120f such that an adhesive layer 180 is disposed between the light emitting device 150 and the light conversion layer 120f. The adhesive layer 180 may include a non-conductive material and may include a material with the light transmitting property. For instance, the adhesive layer 180 may be an optically clear adhesive (OCA). The material for the adhesive layer 180 should not be particularly limited as long as the material is optically clear and stably attaches the light emitting device 150. The adhesive layer 180 is provided in the pixel area 10*d* corresponding to an area to which the light emitting device 150 is attached and has an area corresponding to an area of the light emitting device 150 when viewed in a plan view.

The light emitting device 150, for example, the first, second, and third light emitting devices 150*a*, 150*b*, and 150*c* are provided on the light passing layers, respectively, with the adhesive layer 180 therebetween.

The light emitting device 150 may be provided in each pixel 111 to emit the lights of various wavelengths.

In the exemplary embodiment, the first, second, and third lights may have blue, red, and green wavelength bands. In this case, the first, second, and third light emitting devices 150*a*, 150*b*, and 150*c* may be implemented by a blue light emitting diode, a red light emitting diode, and a green light emitting diode. However, the first, second, and third lights need not have the blue, red, and green wavelength bands, respectively, to display the blue, red, and green colors. Although the first to third lights have the same wavelength band, the color of the light finally emitted may be controlled by using the light conversion layer 120*f* that converts at least a portion of the first to third lights to a light having a different wavelength band. This is because the light conversion layer 120*f* includes the material, such as the fluorescent substance or the quantum dot, that converts the light having the predetermined wavelength to the light having the different wavelength. In other words, the first, second, and third pixels 111*a*, 111*b*, and 111*c* do not necessarily use the green, red, and blue light emitting diodes to implement the green, red, and/or blue colors, and light emitting diodes other than the above-mentioned color may be used. As an example, the red light emitting diode may be used to implement the red color, however, when using the light conversion layer 120*f* that absorbs the blue light or the ultraviolet light and emit the red light, the blue or ultraviolet light emitting diode may used to implement the red color.

The light conversion layer 120*f* may selectively include materials that are able to absorb a light having a predetermined wavelength and emit a light having a different wavelength. The light conversion layer 120*f* may include the nano-structure such as the fluorescent substance and the quantum dot, an organic material capable of converting colors, or the combination thereof. A color filter layer 130 may be further disposed at a portion adjacent to the light conversion layer 120*f* to increase a purity of the color of the light finally emitted.

In the exemplary embodiment, it will be described that the first light emitting device 150*a* is green light emitting diode, the second light emitting device is a blue light emitting diode and the third light emitting device 150*c* is a blue light emitting diode, as an example In the exemplary embodiment, the first, second, and third light emitting devices 150*a*, 150*b*, and 150*c* are shown to have the same size, however, the first, second, and third light emitting devices 150*a*, 150*b*, and 150*c* may have the same size or different sizes from each other.

As shown in drawings, the first, second, and third light emitting devices 150*a*, 150*b*, and 150*c* are shown to have the same height, however the first, second, and third light emitting devices 150*a*, 150*b*, and 150*c* may have the same height as or different heights from each other. According to embodiments, at least one light emitting device of the first, second, and third light emitting devices 150*a*, 150*b*, and 150*c* may have a different height from those of the other light emitting devices. The height of the first, second, and third light emitting devices 150*a*, 150*b*, and 150*c* may vary depending on the materials and optical characteristics of the first, second, and third light emitting devices 150*a*, 150*b*, and 150*c*. For example, the first light emitting device 150*a* emitting the green light may have the height greater than that of the third light emitting device 150*c* emitting the blue light. However, in the exemplary embodiment, although the first, second, and third light emitting devices 150*a*, 150*b*, and 150*c* have different heights from each other, the heights of the first, second, and third light emitting devices 150*a*, 150*b*, and 150*c* are lower than those of a conventional light emitting device since the first, second, and third light emitting devices 150*a*, 150*b*, and 150*c* are manufactured by a manufacturing method described later and transferred onto the substrate by a transferring method described later. That is, first to third light emitting devices used in the conventional light emitting apparatus are transferred onto a substrate with a growth substrate when being employed in the conventional light emitting apparatus. However, since the first to third light emitting devices used in the light emitting apparatus according to the exemplary embodiment are transferred right after being separated from the growth substrate, the heights of the light emitting devices are lower than those of the conventional light emitting device. For instance, in the exemplary embodiment, the height from an upper surface of the substrate to an active layer may be in a range from about 2 micrometers to about 15 micrometers. As another way, in the exemplary embodiment, the height from the upper surface of the substrate to the active layer may be in a range from about 5 micrometers to about 10 micrometers.

In the exemplary embodiment, the first, second, and third light emitting devices 150*a*, 150*b*, and 150*c* are provided separated from an element substrate (e.g., a sapphire substrate) for growth of a semiconductor layer. Accordingly, it is possible to thin the device. In particular, in a case of the light emitting devices emitting the green and blue lights, for example, since the first and third light emitting devices may be provided without the sapphire substrate, a thickness of the light emitting device may be equal to or smaller than about 15 micrometers. When the sapphire substrate is provided, the thickness of the light emitting device has a remarkably larger value (e.g., about 50 micrometers to about 100 micrometers) than that when the sapphire substrate is not provided. Therefore, in the exemplary embodiment, a difference in thickness between the light emitting devices depending on the presence or absence of the element substrate may be reduced, and defects caused by a difference in height may be prevented in the following other processes described later.

The insulation layer 160 is provided on the light emitting device 150. The insulation layer 160 is provided in all the pixel area 10*d* and the non-pixel area 10*nd*. The insulation layer 160 covers an upper surface of the light passing layer 120 and the light emitting device 150 in an area corresponding to the pixel area 10*d*. A space between the pixel area 10*d* and another pixel area 10*d* is filled with the insulation layer 160 in an area corresponding to the non-pixel area 10*nd*, and the insulation layer 160 makes contact with the upper surface of the substrate 10. The insulation layer 160 is provided between the light passing layers 120 respectively provided in the pixel areas 10*d*. Accordingly, the light passing layers 120 are separated by the insulation layer 160.

Therefore, all the upper surface and the side surface of the light passing layer 120 are covered by the insulation layer 160.

The insulation layer 160 includes a non-conductive material. The insulation layer 160 may include a material that transmits the light or a material that does not transmit the light. According to embodiments, when a color mixture occurs between the pixels 111 adjacent to each other, the insulation layer 160 may include a non-transmitting material, and when the color mixture is required or there is no possibility of color mixture, the insulation layer 160 may include a transmitting material.

As the transmitting material, an organic polymer, such as epoxy, polysiloxane, or photoresist, may be used. As an example, PDMS (polydimethylsiloxane) may be used as the polysiloxane material. However, the material for the insulation layer 160 should not be limited thereto or thereby, and materials, such as HSSQ (Hydrogen Silsesquioxane), MSSQ (Methyksilsesquioxane), polyimide, Divinyl Siloxane, DVS-BCS (bis-Benzocyclobutane), PFCB (Perfluorocyclobutane), and PAE (Polyarylene Ether) may be used.

The non-transmitting material may include a light absorbing material and may include a material substantially having a light transmittance equal to or smaller than about 10%. For example, the insulation layer 160 may have a black color, and particularly may include a black matrix material used in a displaying apparatus. In the present exemplary embodiment, the insulation layer 160 may include a black photoresist and may include a carbon black. In the case where the insulation layer 160 includes the black photoresist, the insulation layer 160 may be easily patterned using a photolithography process. However, the material for the insulation layer 160 should not be limited thereto or thereby, and various materials may be used for the insulation layer 160.

The insulation layer 160 may have a single-layer structure or a multi-layer structure. In the exemplary embodiment, the insulation layer 160 may include a first insulation layer 161 provided on the substrate 10 and a second insulation layer 163 provided on the first insulation layer 161. The first insulation layer 161 may be provided on the substrate 10 and disposed in the non-pixel area 10nd between the light passing layers 120. The second insulation layer 163 may be provided on the light passing layer 120 and the light emitting device 150 and may be provided in all the pixel area 10d and the non-pixel area 10nd. In the present exemplary embodiment, the first insulation layer 161 and the second insulation layer 163 may include the same material as or different materials from each other.

A plurality contact holes is defined by partially removing the insulation layer 160 to expose at least a portion of first and second electrodes 159p and 159q of the light emitting device 150.

The terminal part 170 is provided on the insulation layer 160 and connected to the light emitting device 150.

The terminal part 170 may include a common pad 171d used to apply a common voltage to the light emitting device 150 and a data pad used to apply image signals, i.e., data signals, to the light emitting device 150. The data pad includes first, second, and third data pads 171a, 171b, and 171c that respectively apply the data signals to the first, second, and third light emitting devices 150a, 150b, and 150c.

The terminal part 170 is electrically connected to each light emitting device 150 through the contact hole CH defined through the insulation layer 160. That is, the common pad 171d and the first data pad 171a are connected to the first light emitting device 150a through the contact hole CH. The common pad 171d and the second data pad 171b are connected to the second light emitting device 150b through the contact hole CH. The common pad 171d and the third data pad 171c are connected to the third light emitting device 150c through the contact hole CH.

Figure 2:
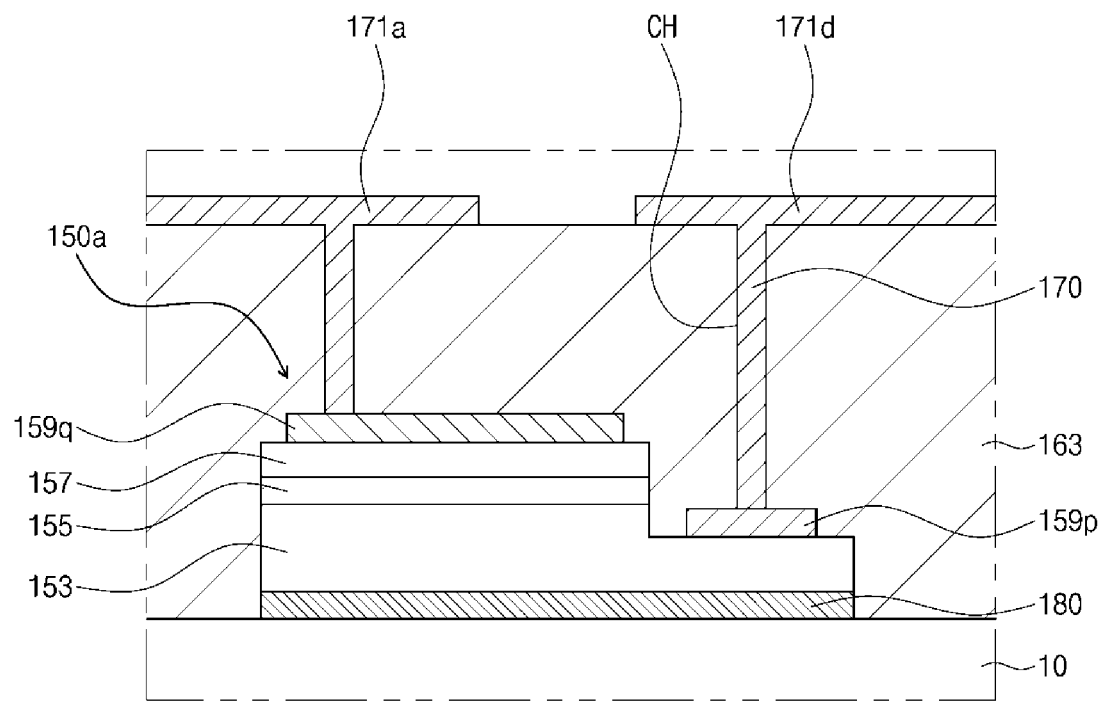
FIG. 2 is a cross-sectional view showing a light emitting device according to an exemplary embodiment.

Various types of light emitting diodes may be employed as the first, second, and third light emitting devices 150a, 150b, and 150c. FIG. 2 is a cross-sectional view showing the light emitting device 150 according to an exemplary embodiment, and a lateral-type light emitting diode is employed as the light emitting device 150. The light emitting device 150 shown in FIG. 2 may be one of the first, second, and third light emitting devices 150a, 150b, and 150c, and the first light emitting device 150a will be described as a representative example in the present exemplary embodiment.

Referring to FIG. 2, the first light emitting device 150a includes a first semiconductor layer 153, an active layer 155, a second semiconductor layer 157, the first electrode 159p, the second electrode 159q, the insulation layer 160, the common pad 171d, and the first data pad 171a.

In an embodiment, in a case of the light emitting device 150 that emits the green light, the first semiconductor layer 153, the active layer 155, and the second semiconductor 157 may include indium gallium nitride (InGaN), gallium nitride (GaN), aluminum indium gallium nitride (AlInGaN), gallium phosphide (GaP), aluminum gallium indium phosphide (AlGaInP), and aluminum gallium phosphide (AlGaP). In an embodiment, in a case of the light emitting device 150 that emits the red light, the first semiconductor layer 153, the active layer 155, and the second semiconductor 157 may include aluminum gallium arsenide (AlGaAs), gallium arsenide phosphide (GaAsP), aluminum gallium indium phosphide (AlGaInP), and gallium phosphide (GaP). In an embodiment, in a case of the light emitting device 150 that emits the blue light, the first semiconductor layer 153, the active layer 155, and the second semiconductor 157 may include gallium nitride (GaN), indium gallium nitride (InGaN), aluminum indium gallium nitride (AlInGaN), and zinc selenide (ZnSe).

In the present exemplary embodiment, the first and second semiconductor layers may be doped with impurities of opposite types and may be an n-type or p-type semiconductor layer depending on the type of impurity. For example, the first semiconductor layer may be the n-type semiconductor layer, and the second semiconductor layer may be the p-type semiconductor layer. On the contrary, the first semiconductor layer may be the p-type semiconductor layer, and the second semiconductor layer may be the n-type semiconductor layer. In the following descriptions, a configuration in which the first semiconductor layer is the n-type semiconductor layer and the second semiconductor layer is the p-type semiconductor layer will be described as a representative example.

In FIG. 2, each of the first semiconductor layer 153 and the second semiconductor layer 157 has the single-layer structure, however according to embodiments, each of the first semiconductor layer 153 and the second semiconductor layer 157 may have a multi-layer structure and may include a superlattice layer. The active layer 155 may have a single quantum well structure or a multiple quantum well structure, and a composition ratio of a nitride-based semiconductor of the active layer 155 is controlled to emit a desired wavelength. As an example, the active layer 155 may emit the blue light or the ultraviolet light.

The first electrode 159p is disposed on the first semiconductor layer 153 on which the active layer 155 and the second semiconductor layer 157 are not provided, and the second electrode 159q is disposed on the second semiconductor layer 157.

The first electrode 159p and/or the second electrode 159q may have a single- or multi-layer structure of metal. The first electrode 159p and/or the second electrode 159q may include various metals of Al, Ti, Cr, Ni, Au, Ag, Cr, or Cu and an alloy thereof.

In the present exemplary embodiment, a plurality of concavo-convex portions may be provided on a rear surface (i.e., an opposite surface of the surface on which the active layer 155 is provided) of the first semiconductor layer 153 to increase a light emitting efficiency. The concavo-convex portions may be provided in various shapes, such as a polygonal pyramid, a hemisphere, or a surface having a roughness, on which the concavo-convex portions are randomly arranged. As an example, the rear surface of the first semiconductor layer 153 may be textured through various etching processes. As another way, various shapes of concavo-convex portions may be formed on the first semiconductor layer 153 by forming the first semiconductor layer 153 on the patterned sapphire substrate and separating the sapphire substrate.

The insulation layer 160 is provided on the first and second electrodes 159p and 159q, and the common pad 171d connected to the first electrode 159p through the contact hole CH and the data pad 171a are provided on the insulation layer 160. In the present exemplary embodiment, the first electrode 159p is connected to the common pad 171d, and the second electrode 159q is connected to the data pad 171a, however this is for the convenience of explanation, and they should not be limited thereto or thereby. For example, the first data pad 171a may be connected to the first electrode 159p, and the common pad 171d may be connected to the second electrode 159q.

The common pad 171d and/or the first data pad 171a may include a single- or multi-layer of metal. The common pad 171d and/or the first data pad 171a may include various metals of Al, Ti, Cr, Ni, or Au and an alloy thereof.

In the exemplary embodiment, the light emitting device 150 is roughly described with reference to drawings. The light emitting device 150 may further include a layer with additional functionality in addition to the above-mentioned layers. For instance, various layers, such as a reflection layer that reflects the light, an additional insulation layer that insulates specific components, and a solder prevention layer that prevents a solder from being diffused, may be included in the light emitting device 150.

In addition, when the lateral-type light emitting device is formed, a mesa may be formed in various shapes, and locations and shapes of the first and second electrodes may be changed in various ways.

According to the light emitting apparatus of the exemplary embodiment, the light emitting device 150 is turned on in response to the common voltage and the data signal applied thereto to emit the light, and the emitted light travels to the rear surface of the substrate 10 after passing through the substrate 10 thereunder.

According to the light emitting apparatus of the exemplary embodiment, since the pixels and the terminal part are sequentially formed on the substrate, the light emitting apparatus may be manufactured without using a separate printed circuit board. In a case where the light emitting apparatus is manufactured by mounting the light emitting device on the separate printed circuit board, a process for forming a conductive electrode on the printed circuit board and/or a process for connecting a wire are required. However, the forming and connecting processes may be omitted in the exemplary embodiment. The manufacturing method of the displaying apparatus will be described later.

According to the light emitting apparatus of the above-described embodiment, the manufacturing process is simplified, and color purity and color reproducibility are also improved.

In a conventional displaying apparatus, when a pixel is formed by mounting a light emitting apparatus on a substrate, the light emitting apparatus is mounted on a transparent insulation layer formed on the substrate. In a case where the insulation layer used on the substrate is transparent, the transparent insulation layer is used as a waveguide, and thus there is a problem in which a light is propagated from one pixel to another pixel adjacent to the one pixel. However, according to the exemplary embodiment, since the insulation layer that does not transmit the light is provided in each pixel area 10d, the insulation layer is not used as the waveguide. In particular, the insulation layer may be provided to have the black color, and thus the light may be prevented from traveling to adjacent pixels. Accordingly, the color mixture or a light interference between the pixels adjacent to each other may be prevented, and the final color purity and color reproducibility may be improved In addition, since the area displayed in the black color increases, a contrast ratio between the black area and the light emitted from each light emitting apparatus increases, and characteristics of the displaying apparatus is improved.

Further, according to the exemplary embodiment, a color filter layer or a color filter part may be additionally used in addition to the light conversion layer. Therefore, the color purity and the color reproducibility may be further improved. The light that is not completely converted by the light conversion layer or the light traveling from the adjacent pixel are blocked once again by the color filter layer or the color filter part.

According to the exemplary embodiment, the light emitting apparatus may have various configurations without departing from the inventive concepts.

Figure 3:
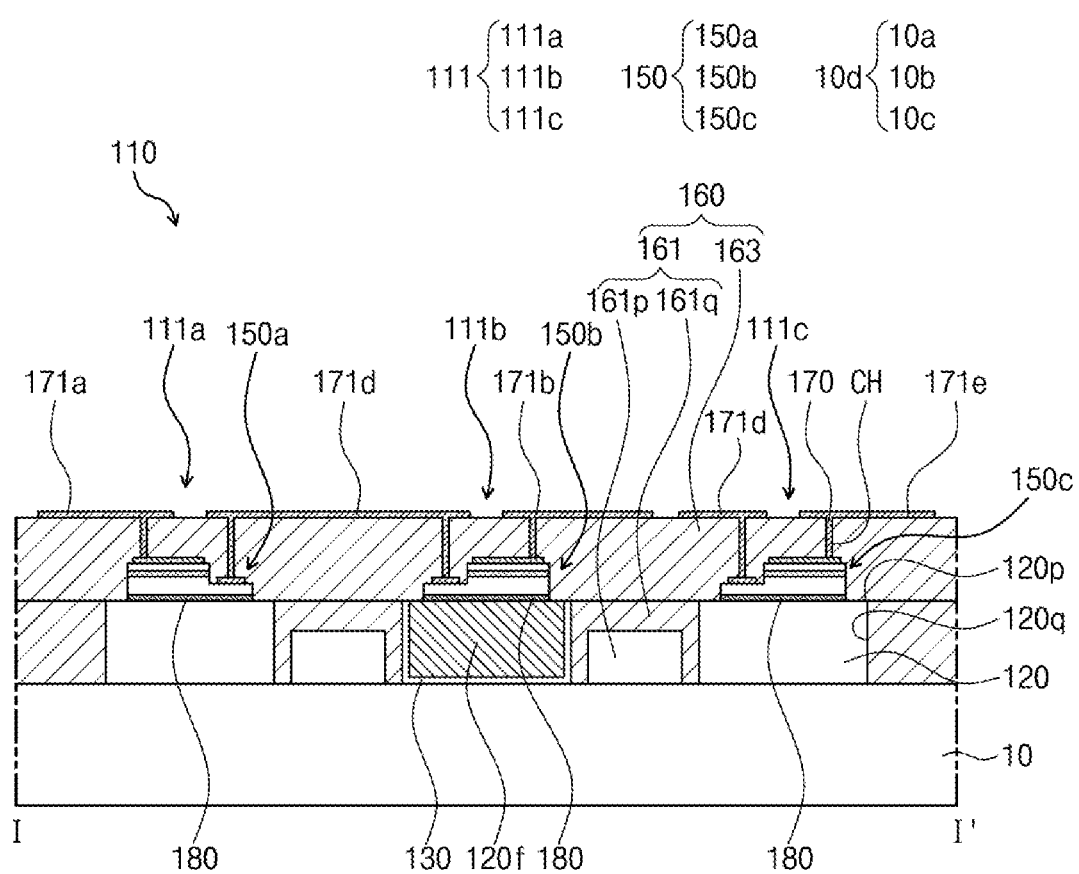
FIG. 3 is a cross-sectional view showing a light emitting apparatus according to an exemplary embodiment, which is taken along the line I-I' of FIG. 1A.

FIG. 3 is a cross-sectional view showing a light emitting apparatus according to an exemplary embodiment, which is taken along a line I-I' of FIG. 1A. In the following embodiments, different features from those of the above-described embodiments will be mainly described in order to avoid redundancy. Unexplained portions are similar to those of the above-described embodiments.

Referring to FIG. 3, an insulation layer 160 may be formed in a way different from that of the above-described embodiments to prevent the color mixture between the pixels 111 adjacent to each other. The insulation layer 160 according to the exemplary embodiment may have a structure that blocks the light as much as possible to prevent the color mixture between the pixels 111 adjacent to each other. To this end, a first insulation layer 161 may include a first sub-insulation layer 161p and a second sub-insulation layer 161q completely covering the first sub-insulation layer 161p.

The first sub-insulation layer 161p may be provided on a substrate 10 to directly make contact with the substrate 10, and a side surface and an upper surface of the first sub-insulation layer 161p may be completely covered by the second sub-insulation layer 161q. As another way, the first sub-insulation layer 161p may be provided at the same height as a light passing layer 120, and in this case, the upper surface of the first sub-insulation layer 161p may be covered by a second insulation layer 163.

The first sub-insulation layer 161*p* may be provided as a white insulation layer 160. The second sub-insulation layer 161*q* may be provided as a black insulation layer 160. When the white insulation layer 160 and the black insulation layer 160 are combined with each other, most of the wavelength bands, particularly, most of the light in the visible light band, which is emitted from one pixel, may be prevented from traveling to other pixels 111 adjacent to each other.

In the present exemplary embodiment, the first sub-insulation layer 161*p* may include an insulating material having the white color, such as an organic polymer or an organic-inorganic composite material. The second sub-insulation layer 161*q* may include a non-light transmitting material as the second insulation layer 163 and may include the same material as the second insulation layer 163.

The light emitting apparatus according to the exemplary embodiment may further include various additional components to improve the light emitting efficiency.

Figure 4:
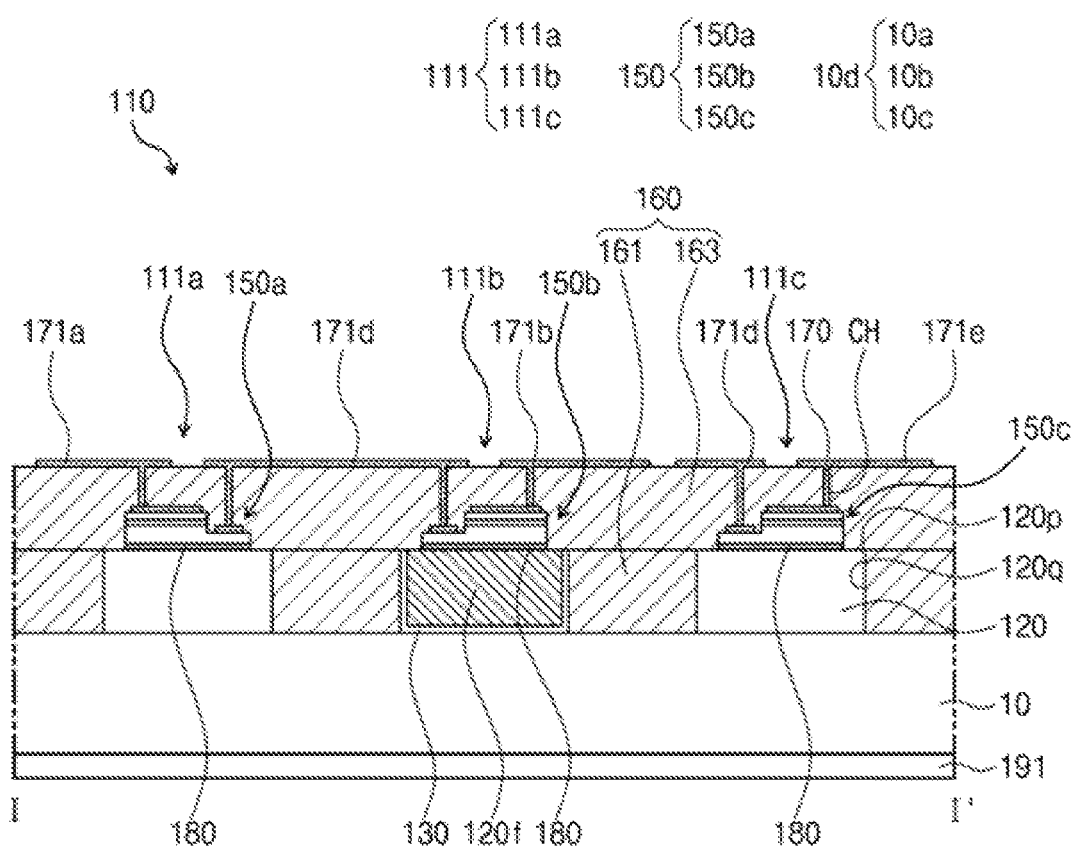
FIG. 4 is a cross-sectional view showing a light emitting apparatus according to an exemplary embodiment.

FIG. 4 is a cross-sectional view showing a light emitting apparatus according to an exemplary embodiment.

Referring to FIG. 4, a diffusion plate 191 is disposed on a rear surface of a substrate 10. The diffusion plate 191 diffuses the light emitting from each pixel 111 to prevent a dark dot or a bright dot. Since a light emitting device 150 or a light emitting area of the light emitting device 150 is smaller in size than the pixel 111, the dark dot or the bright dot may appear due to a difference in contrast between a portion corresponding to the light emitting area and a portion not corresponding to the light emitting area. In the present exemplary embodiment, since the diffusion plate 191 is disposed on the rear surface of the substrate 10 to which the light travels, the light may be properly diffused in each pixel 111, and thus the light may be uniformly emitted without causing the dark or bright dot.

In the exemplary embodiment, the diffusion plate 191 is described as a representative example, however various optical sheets for improving the light efficiency may be further disposed on the rear surface of the substrate 10. For example, a prism sheet for linearity of light and/or a filter for blocking or transmitting a light having a specific wavelength may be further disposed on the rear surface of the substrate 10. The optical sheets may be arranged in various orders depending on desired functions.

The light emitting apparatus according to the exemplary embodiment may further include additional components to improve the light emitting efficiency and prevent the color mixture of the light between pixels adjacent to each other.

Figure 5:
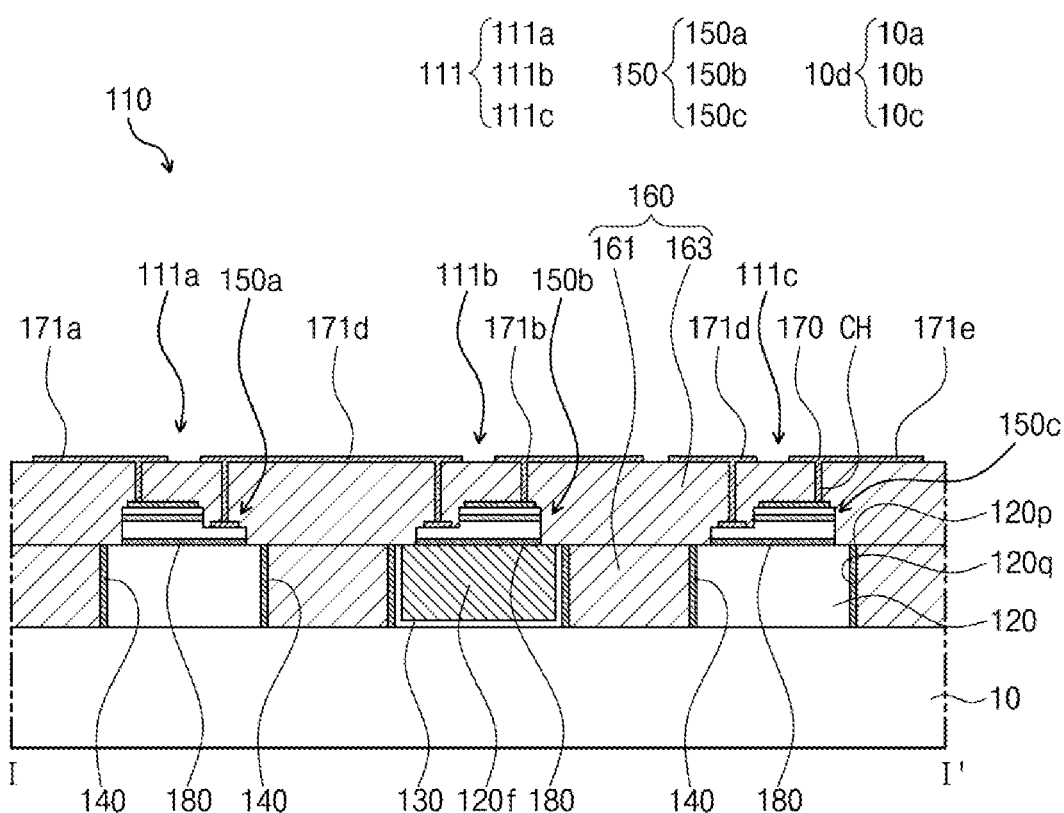
FIG. 5 is a cross-sectional view showing a light emitting apparatus according to an exemplary embodiment.

FIG. 5 is a cross-sectional view showing a light emitting apparatus according to an exemplary embodiment.

Referring to FIG. 5, a reflection layer 140 is provided on a side surface of a light passing layer 120. In detail, the reflection layer 140 may be provided between an insulation layer 160, particularly, a first insulation layer 161 and the side surface of the light passing layer 120. The reflection layer 140 may be also provided even though the light passing layer 120 is used as a light conversion layer 120*f*.

The reflection layer 140 may include a conductive or non-conductive material that reflects the light emitted from the light emitting device 150. As the conductive material, a metal or metal alloy may be used, and as the non-conductive material, an organic-inorganic composite material or a dielectric mirror may be used.

The metal or metal alloy may include a metal material with high reflectance, e.g., silver, aluminum, copper, platinum, and gold.

The organic-inorganic composite material may be provided in the form of an inorganic filler having a small particle diameter mixed with a polymer resin. The inorganic filler may include barium sulfate, calcium sulfate, magnesium sulfate, barium carbonate, calcium carbonate, magnesium chloride, aluminum hydroxide, magnesium hydroxide, calcium hydroxide, titanium dioxide, alumina, silica, talc, or zeolite, however it should not be limited thereto or thereby.

The dielectric mirror may have a structure in which insulation layers having different refractive indices from each other are stacked one on another. A material for the dielectric mirror should not be particularly limited, and various organic or inorganic materials may be used as the dielectric mirror.

In the exemplary embodiment, the material and structure of the reflection layer 140 may be determined in accordance with the wavelength band of the light emitted from the light emitting device 150 of the corresponding pixel 111. Since specific materials or metals have different reflectances depending on the wavelength, it is advantageous to select the material of the reflection layer 140 among materials with high reflectance in the wavelength band of the light from the light emitting device 150. As an example, in a case where the light emitting device 150 emits a light having an ultraviolet wavelength band, aluminum or an aluminum alloy having high reflectance in the ultraviolet wavelength band may be selected as the material for the reflection layer 140, and the reflectance of the dielectric mirror in the ultraviolet wavelength band may increase by adjusting the material or the number of stacked layers.

In the present exemplary embodiment, the reflection layer 140 provided between the first insulation layer 161 and the side surface 120*q* of the light passing layer 120 is described, however it should not be limited thereto or thereby. According to another embodiment, the reflection layer 140 may be also provided on the upper surface 120*p* of the light passing layer 120, i.e., between the light passing layer 120 and the second insulation layer 163. However, in a case where the reflection layer 140 includes the conductive material such as the metal material, the reflection layer 140 is provided in an insulated state not to be electrically connected to a terminal part 170 of the light emitting device 150.

According to the exemplary embodiment, the light emitted from the light emitting device 150 travels through the corresponding light passing layer 120 by the reflection layer 140 and the traveling of the light to the adjacent pixels 111 is prevented as much as possible. As a result, the color mixture in which the light from the specific pixel 111 is mixed with the light from the adjacent pixels 111 may be prevented.

The light emitting apparatus according to the exemplary embodiment may implement the color light using various light emitting devices having different wavelength from the above-mentioned embodiment and the light conversion layer corresponding to the light emitting devices.

Figure 6:
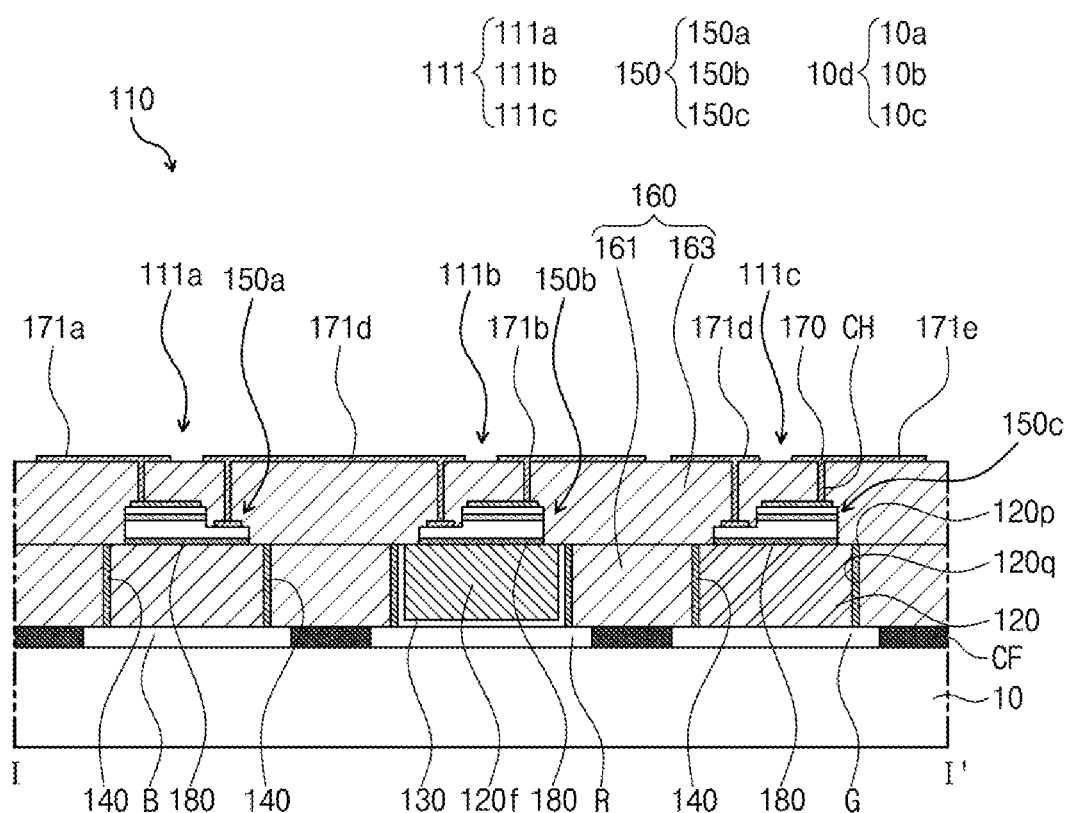
FIG. 6 is a cross-sectional view showing a light emitting apparatus according to an exemplary embodiment.

FIG. 6 is a cross-sectional view showing a light emitting apparatus according to an exemplary embodiment.

Referring to FIG. 6, in the light emitting apparatus according to the exemplary embodiment, all light emitting devices 150 may emit a light having ultraviolet wavelength band, and a light passing layer 120 may be provided as a light conversion layer 120*f* that converts an ultraviolet light to a light having a specific color.

In the present exemplary embodiment, first, second, and third light emitting devices 150*a*, 150*b*, and 150*c* respectively provided in first, second, and third pixels 111*a*, 111*b*, and 111*c* may emit the ultraviolet light, and the light conversion layer 120*f* is provided in all the first pixel 111*a* to the third pixel 111*c*. Accordingly, the light conversion layer 120*f* of the first pixel 111*a* may include a light conversion material that converts the ultraviolet light emitted from the first light emitting device 150*a* to a blue light, the light conversion layer 120*f* of the second pixel 111*b* may include a light conversion material that converts the ultraviolet light emitted from the second light emitting device 150*b* to a red light, and the light conversion layer 120*f* of the third pixel 111*c* may include a light conversion material that converts the ultraviolet light emitted from the third light emitting device 150*c* to a green light.

The light conversion material may include a nano-structure such as a fluorescent substance and a quantum dot, an organic material capable of converting colors, or a combination thereof and may be selected depending on desired colors.

In the present exemplary embodiment, a color filter part CF may be further provided between a substrate 10 and the light passing layer 120. The color filter part CF may include color filters B, R, and G provided in a pixel area 10*d* corresponding to each pixel 111 and a black matrix BM provided corresponding to a non-pixel area 10*nd*. The color filters B, R, and G may be provided corresponding to the color of each pixel 111 and may include a blue color filter B, a red color filter R, and a green color filter G.

The color filters B, R, and G may improve the color purity of the light converted by each light conversion layer 120*f* and may substantially simultaneously block the light that is not converted among the lights emitted from the light emitting device 150. In particular, in the case where the light emitting device 150 emits the ultraviolet light, a portion of the ultraviolet light may not be converted to the specific color, such as blue, red, and green colors, and the color filter may block the ultraviolet light that is not converted.

The light emitting apparatus according to an exemplary embodiment may implement the color light using various light emitting devices having different wavelength from that in the exemplary embodiment of FIG. 6 and the light conversion layer corresponding to the light emitting devices.

Figure 7:
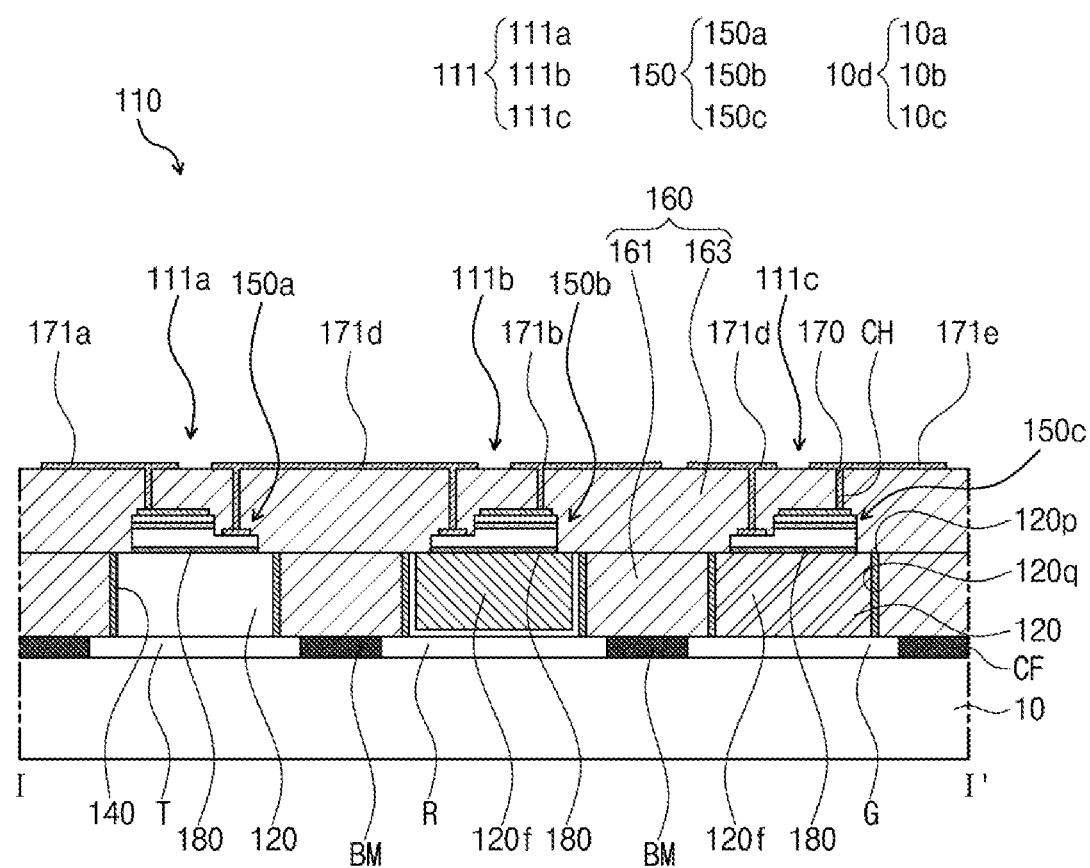
FIG. 7 is a cross-sectional view showing a light emitting apparatus according to an exemplary embodiment.

FIG. 7 is a cross-sectional view showing a light emitting apparatus according to an exemplary embodiment.

Referring to FIG. 7, in the light emitting apparatus according to the exemplary embodiment, all light emitting devices 150 may emit a light having blue wavelength band, and a light passing layer 120 may be provided as a light conversion layer 120*f* that converts the blue color to a specific color in some pixels 111.

In the present exemplary embodiment, first, second, and third light emitting devices 150*a*, 150*b*, and 150*c* respectively provided in first, second, and third pixels 111*a*, 111*b*, and 111*c* may emit the blue light. Accordingly, the first pixel 111*a* corresponding to the blue pixel 111 does not need the light conversion, and the light passing layer 120 that transmits all the lights emitted from the light emitting device 150 is provided. Since the second pixel 111*b* and the third pixel 111*c* need the light conversion, the light conversion layer 120*f* is provided in the second pixel 111*b* and the third pixel 111*c*. That is, the light conversion layer 120*f* of the second pixel 111*b* may include a light conversion material that converts the blue light emitted from the second light emitting device 150*b* to the red light, and the light conversion layer 120*f* of the third pixel 111*c* may include a light conversion material that converts the blue light emitted from the third light emitting device 150*c* to the green light.

The light conversion material may include a nano-structure such as a fluorescent substance and a quantum dot, an organic material capable of converting colors, or a combination thereof and may be selected depending on desired colors.

In the present exemplary embodiment, a color filter part CF may be further provided between a substrate 10 and the light passing layer 120. However, since the blue light is emitted from the light emitting device 150 in the case of the first pixel 111*a*, a blue color filter that additionally blocks ultraviolet light is not required. Accordingly, the blue color filter may be omitted with respect to the first pixel 111*a*, and a transparent insulation layer T may be provided in the first pixel 111*a*. On the other hand, since there may be the blue light that is not completely converted by the light conversion layer 120*f* in the second and third pixels 111*b* and 111*c*, a red color filter R and a green color filter G may be respectively provided in the pixel areas 10*d* to block the blue light that is not completely converted.

In the above-described embodiments, the configuration in which at least one light passing layer among the light passing layers is the light conversion layer is described, however according to the exemplary embodiment, the light emitting apparatus may be manufactured without employing the light conversion layer.

Figure 8A:
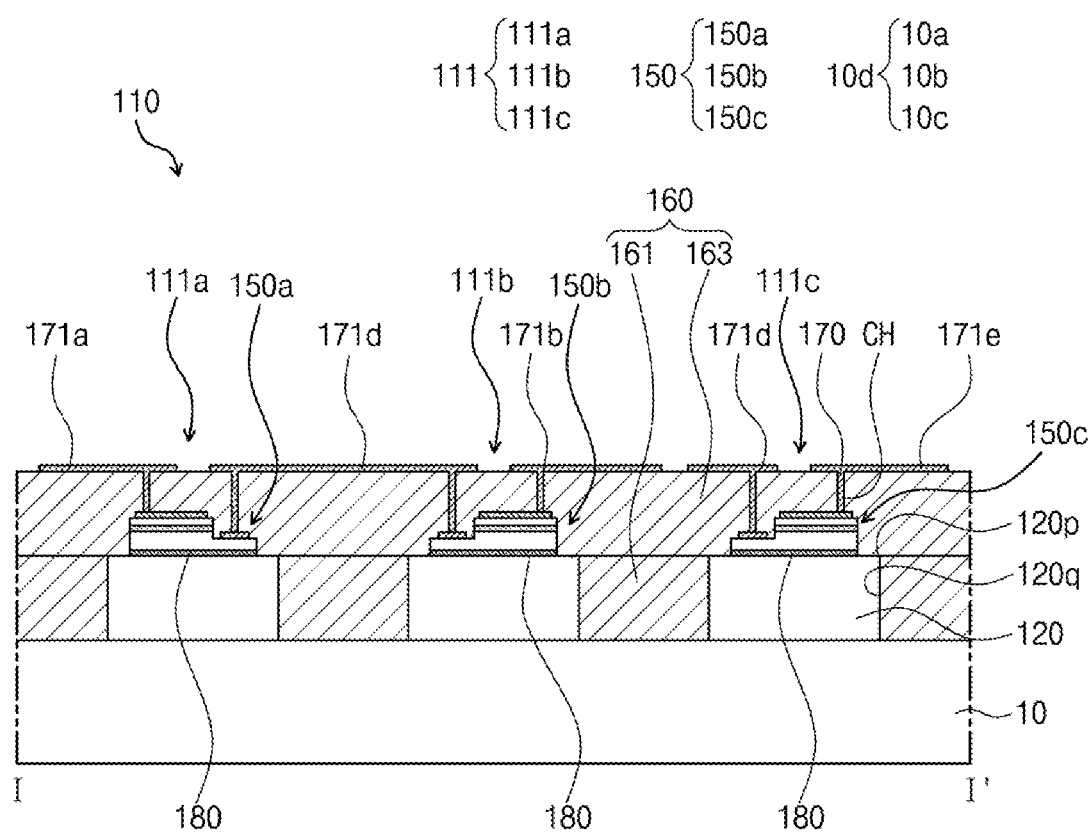
FIGS. 8A and 8B are cross-sectional views showing a light emitting apparatus according to an exemplary embodiment.
Figure 8B:
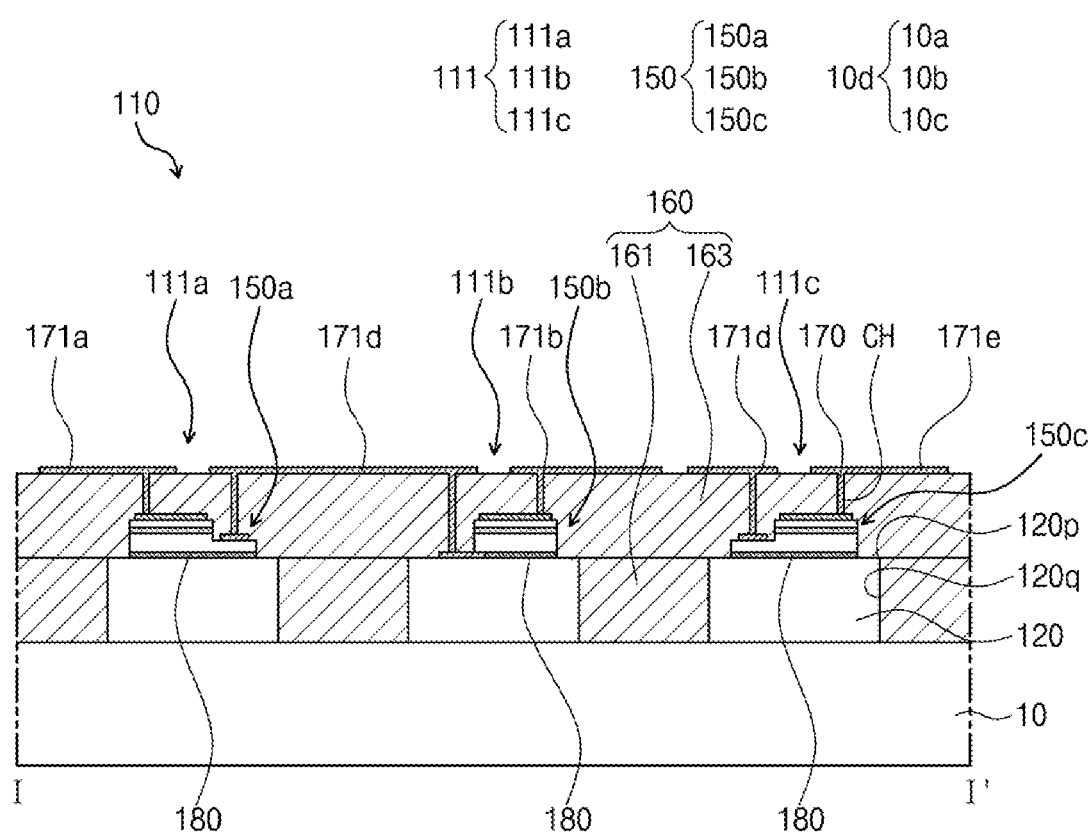

FIGS. 8A and 8B are cross-sectional views showing a light emitting apparatus according to an exemplary embodiment. FIGS. 8A and 8B show a light emitting apparatus employing a lateral-type light emitting device and a light emitting apparatus employing vertical-type light emitting device without the light conversion layer.

Referring to FIG. 8A, the first, second, and third light emitting devices 150*a*, 150*b*, and 150*c* may emit blue, red, and green lights, respectively. To this end, the first, second, and third light emitting devices 150*a*, 150*b*, and 150*c* may be manufactured by selecting any one of semiconductor materials that respectively emit the blue, red, and green lights.

For example, in an embodiment, the first light emitting device 150*a* may include gallium nitride (GaN), indium gallium nitride (InGaN), aluminum indium gallium nitride (AlInGaN), and zinc selenide (ZnSe), and particularly may include aluminum indium gallium nitride (AlInGaN).

In an embodiment, the second light emitting device 150*b* may include aluminum gallium arsenide (AlGaAs), gallium arsenide phosphide (GaAsP), aluminum gallium indium phosphide (AlGaInP), and gallium phosphide (GaP), and particularly may include aluminum gallium indium phosphide (AlGaInP).

In an embodiment, the third light emitting device 150*c* may include indium gallium nitride (InGaN), gallium nitride (GaN), aluminum indium gallium nitride (AlInGaN), and zinc selenide (ZnSe), and particularly may include aluminum indium gallium nitride (AlInGaN).

In the present exemplary embodiment, since each of the first, second, and third light emitting devices 150*a*, 150*b*, and 150*c* emits the color light having the specific wavelength, no separate light conversion layer is required, and the light emitting apparatus may be manufactured in a relatively simple manner.

Referring to FIG. 8B, not only the lateral-type light emitting device but also the vertical-type light emitting device may be used as the first, second, and third light emitting devices 150*a*, 150*b*, and 150*c*. In the exemplary embodiment, the vertical-type light emitting device may be used as the second light emitting device 150*b* that emits the red light. The second light emitting device 150*b* may include a semiconductor layer that emits the red light and may include, for example, aluminum gallium indium phosphide (AlGaInP).

In the present exemplary embodiment, first and second electrodes of the second light emitting device 150b may be respectively provided on upper and lower side surfaces, and each of the first and second electrodes may be electrically connected to a common pad 171d or a second data pad 171b through a contact hole. In the exemplary embodiment, the vertical-type light emitting device has an advantage of occupying less area than the lateral-type light emitting device when viewed in a plan view, and thus the vertical-type light emitting devices can be formed in a higher density than the lateral-type light emitting devices.

As described above, according to the exemplary embodiment, when the light emitting device that emits the light having the specific color is manufactured, it is possible to select the type of the light emitting device that is relatively easy to manufacture among the vertical-type or the lateral-type in accordance with the substrate or material used.

It has been previously described that the lateral or vertical type devices are used, but a light emitting device is not limited to these type devices.

The light emitting apparatus according to the exemplary embodiment may be employed in various apparatuses and, for example, may be employed in a backlight unit used in the displaying apparatus.

Figure 9A:
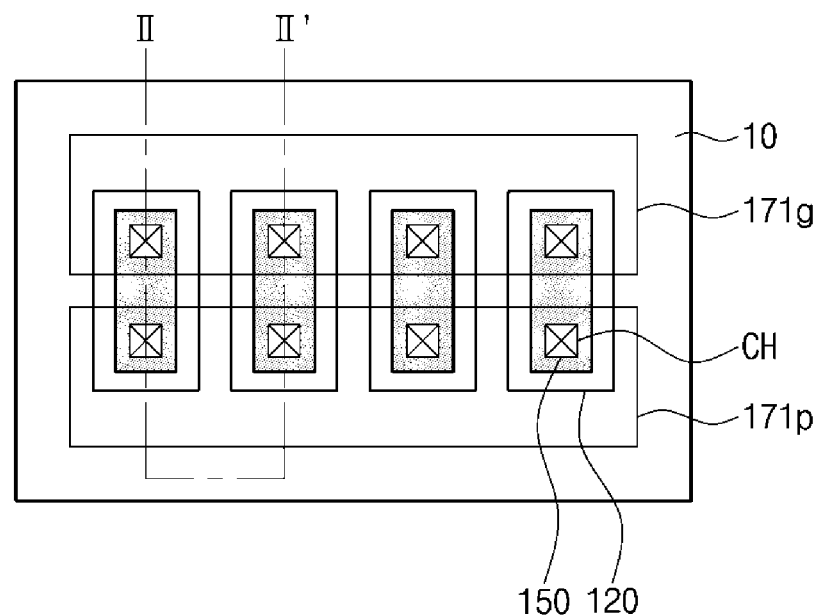
FIG. 9A is a plan view showing a light emitting device including light emitting devices connected to each other in parallel according to an exemplary embodiment.
Figure 9B:
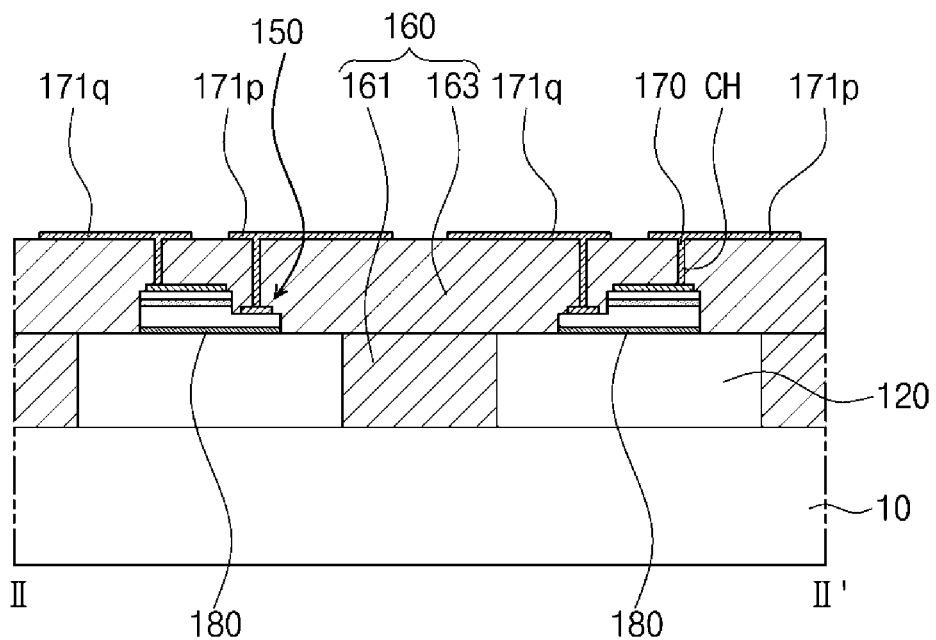
FIG. 9B is a cross-sectional view taken along a line II-IF of FIG. 9A.
Figure 10:
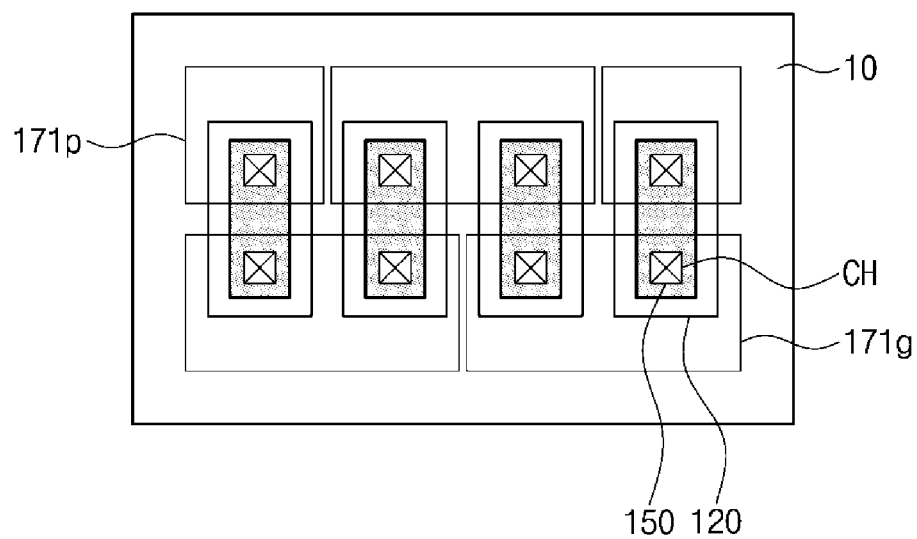
FIG. 10 is a plan view showing a light emitting apparatus including light emitting devices connected to each other in series according to an exemplary embodiment.

FIG. 9A is a plan view showing a light emitting apparatus including light emitting devices connected to each other in parallel according to an exemplary embodiment, and FIG. 9B is a cross-sectional view taken along a line II-IF of FIG. 9A. FIG. 10 is a plan view showing a light emitting apparatus including light emitting devices connected to each other in series according to an exemplary embodiment. In the present exemplary embodiment, the light emitting apparatus may have substantially the same structure as the pixel unit 110 in the above-described embodiment, and thus, for the convenience of explanation, a light emitting unit in which one light emitting device 150 is provided will be referred to as a "pixel" 111 similar to the above-described embodiments.

Referring to the above-described embodiments and FIGS. 9A and 9B, the light emitting apparatus includes the substrate 10 and the pixel 111 mounted on the substrate 10. Each pixel 111 includes the substrate 10, the light passing layer 120 provided on the substrate 10, the light emitting device 150 provided on the light passing layer 120, the insulation layer 160 covering the light emitting device 150 and the light passing layer 120, and the terminal part 170 provided on the insulation layer 160.

In the present exemplary embodiment, the terminal part 170 includes the common pad 171p used to apply the common voltage to one electrode of the first and second electrodes of the light emitting device 150 and the data pad 171q used to apply the light emitting signal to the other electrode of the first and second electrodes. The common pad 171p and the data pad 171q may be spaced apart from each other and may extend in one direction. One electrode of the first and second electrodes of each light emitting device 150 may be connected to the common pad 171p through the contact hole CH, and the other electrode of the first and second electrodes of each light emitting device 150 may be connected to the data pad 171q through the contact hole CH. Consequently, each light emitting device 150 is connected in parallel between the common pad 171p and the data pad 171q.

FIG. 10 is a plan view showing a light emitting apparatus including a light emitting device 150 connected in series according to an exemplary embodiment. There is no big difference between the light emitting apparatus shown in FIG. 10 and the light emitting apparatus shown in FIG. 9A except that a shape of the terminal part 170 of FIG. 10 is partially different from that of FIG. 9A and a connection relation of both ends at which the common pad 171p and the data pad 171q of the light emitting device 150 are provided of FIG. 10 is different from that of FIG. 9A, and thus details thereof will be omitted.

The light emitting apparatus having the above-mentioned structure according to the exemplary embodiments may be manufactured by preparing the substrate and sequentially forming components on the substrate. In particular, the light emitting apparatus may be manufactured through preparing light emitting devices and transferring the light emitting devices to a substrate.

Hereinafter, a method of forming and transferring light emitting devices is first described in sequence, and then a light emitting apparatus will be described.

Figure 11:
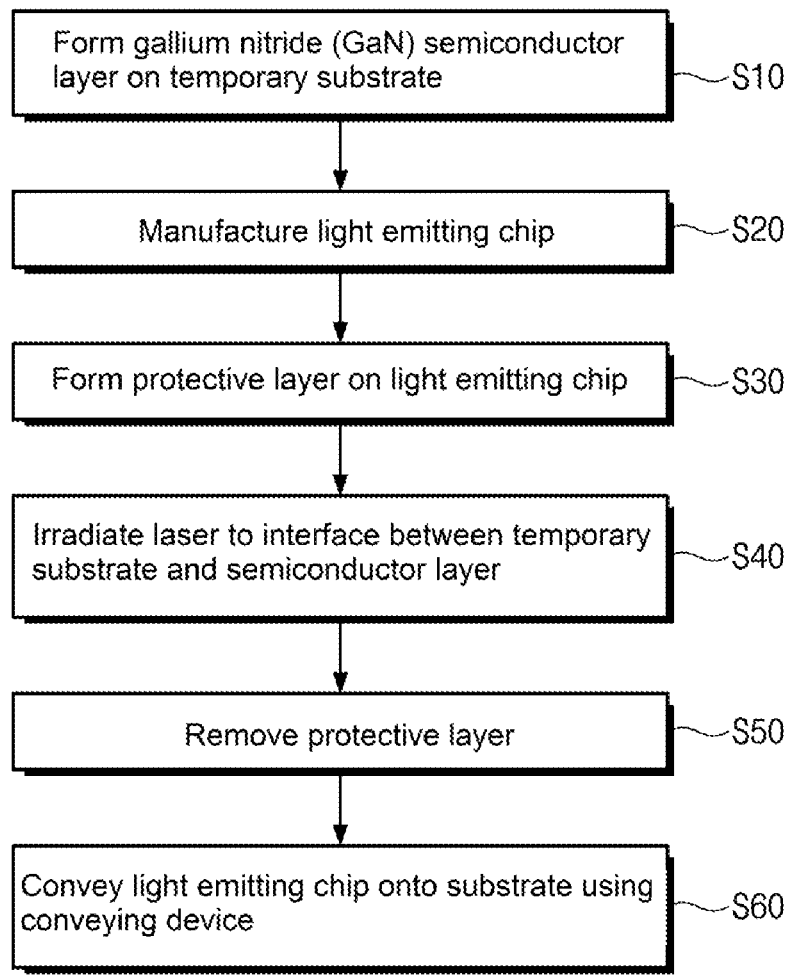
FIG. 11 is a flowchart showing a transferring method after manufacturing a light emitting device in a manufacturing method of a light emitting apparatus according to an exemplary embodiment.

FIG. 11 is a flowchart showing the transferring method after manufacturing the light emitting device in the manufacturing method of the light emitting apparatus according to an exemplary embodiment. The light emitting device manufactured in the following embodiment may use the gallium nitride (GaN) semiconductor and may be the blue light emitting device or the green light emitting device.

Referring to FIG. 11, the manufacturing and transferring method of the light emitting device according to the exemplary embodiment includes forming a gallium nitride (GaN) semiconductor layer on a temporary substrate S10, manufacturing the light emitting device by forming an electrode part on the semiconductor layer S20, forming a protective layer on the manufactured light emitting device S30, irradiating a laser to an interface between the temporary substrate and the semiconductor layer S40, removing the protective layer S50, and transferring the light emitting device onto the substrate using a conveying apparatus S60.

Figure 12A:
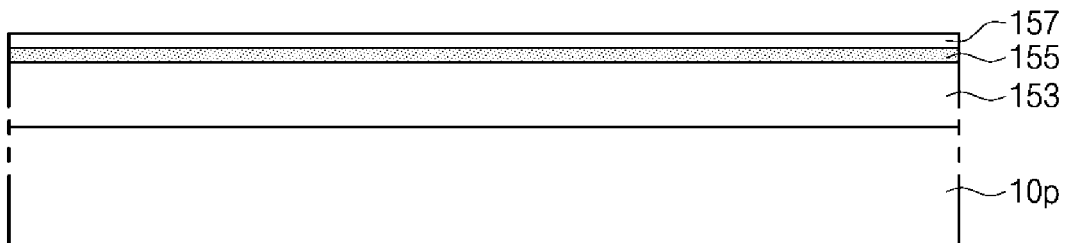
FIGS. 12A, 12B, 12C, 12D, 12E, 12F, 12G, 12H, 12I, 12J, 12K, 12L, 12M, and 12N are cross-sectional views showing in detail a manufacturing method of a light emitting device and a transferring method of the light emitting device in order.
Figure 12B:
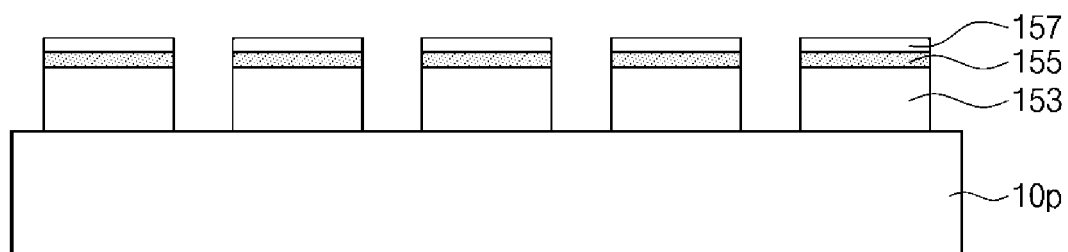
Figure 12C:
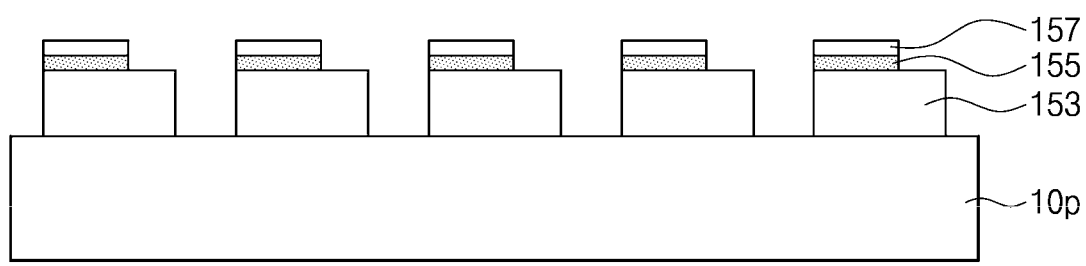
Figure 12D:
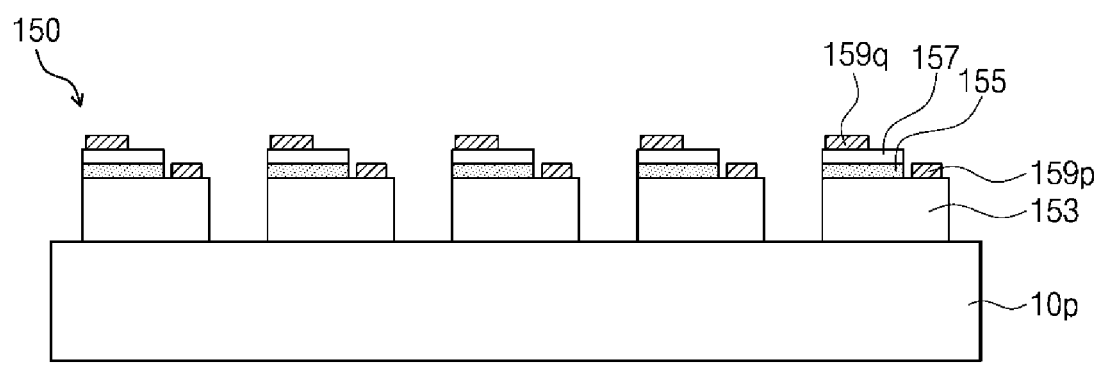
Figure 12E:
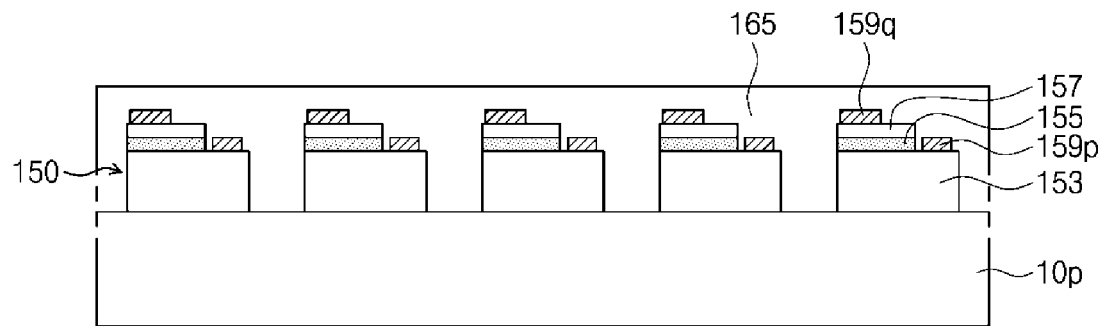
Figure 12F:
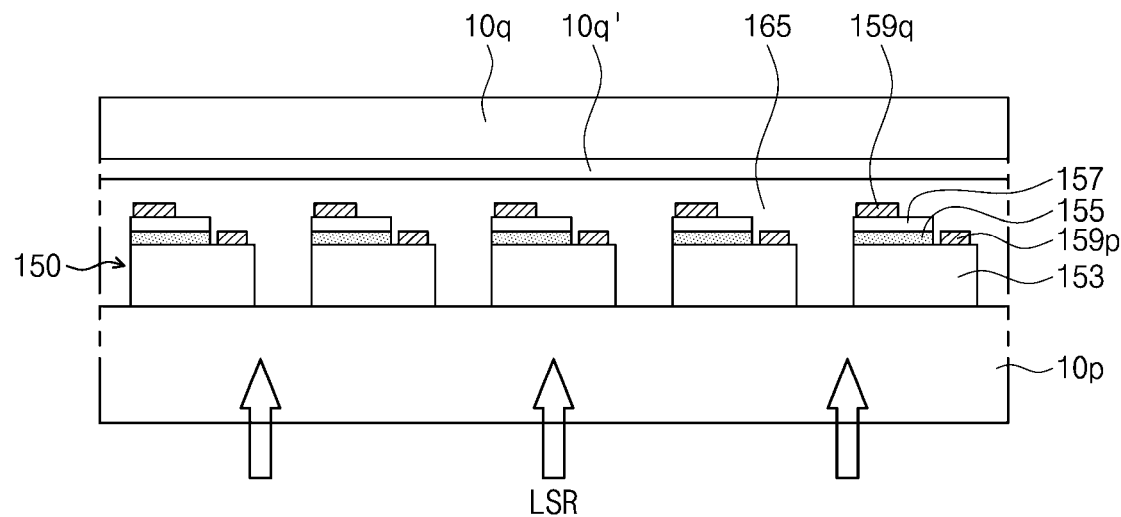
Figure 12G:
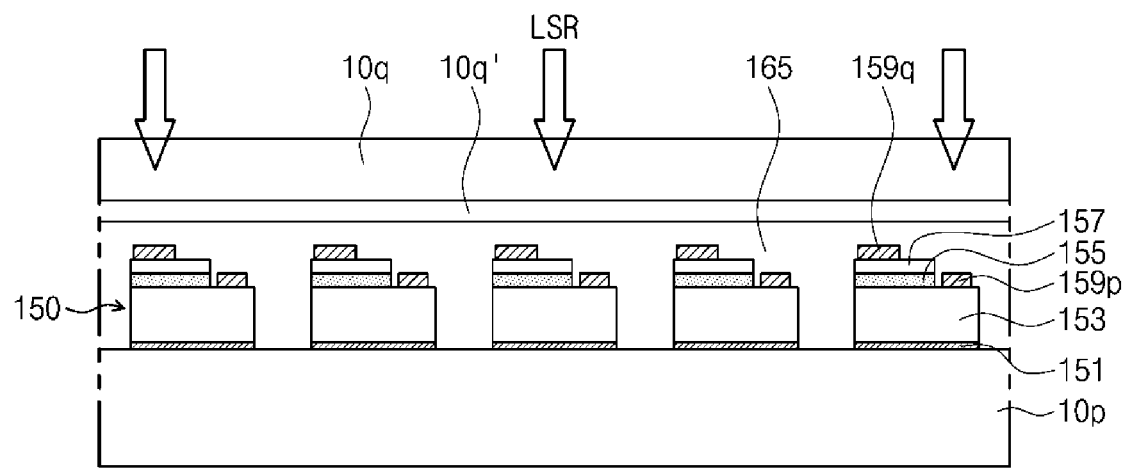
Figure 12H:
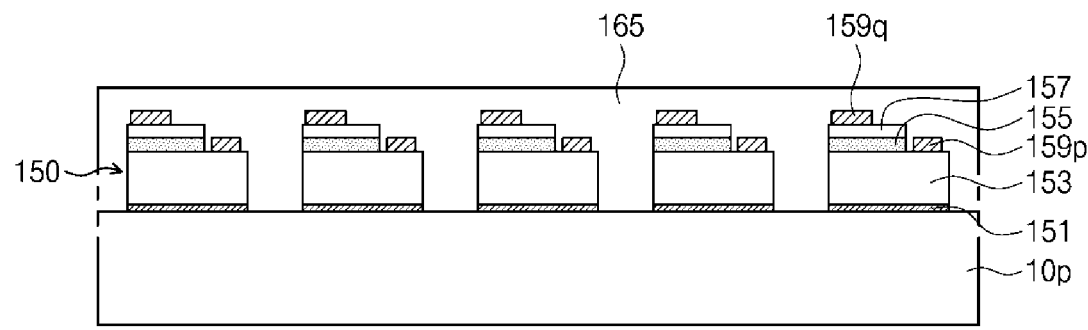
Figure 12I:
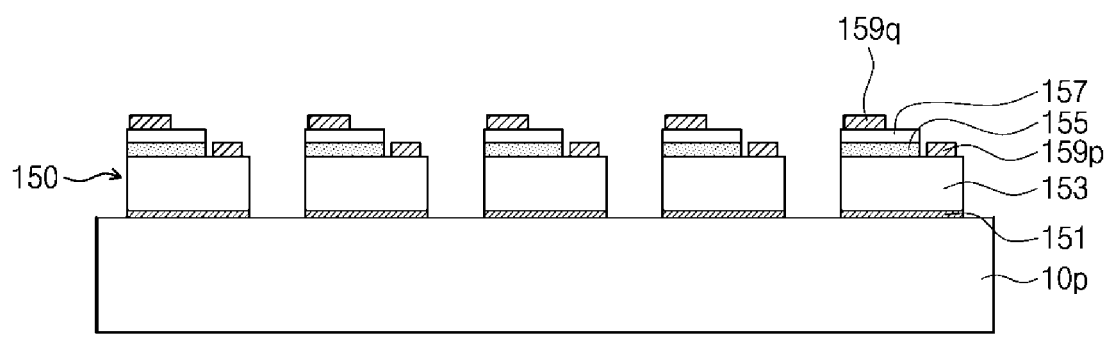
Figure 12J:
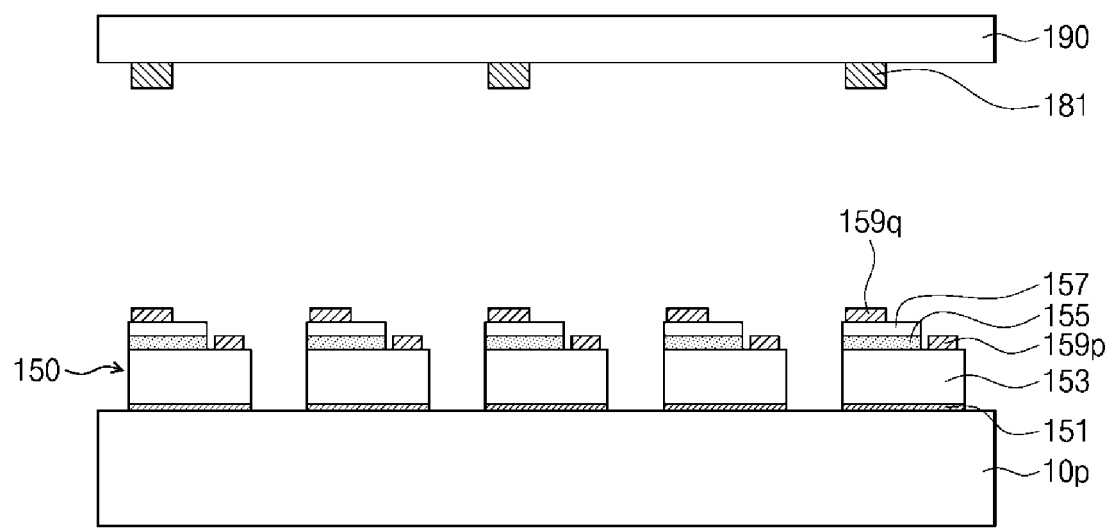
Figure 12K:
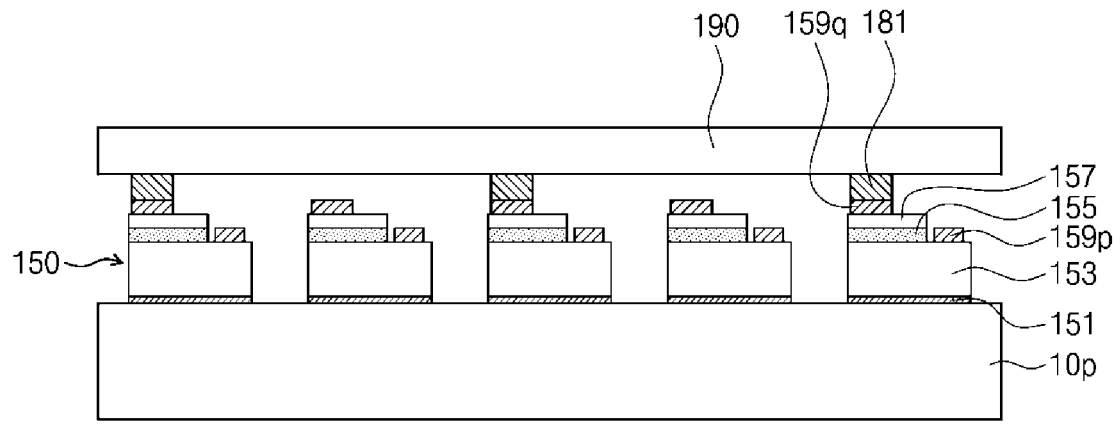
Figure 12L:
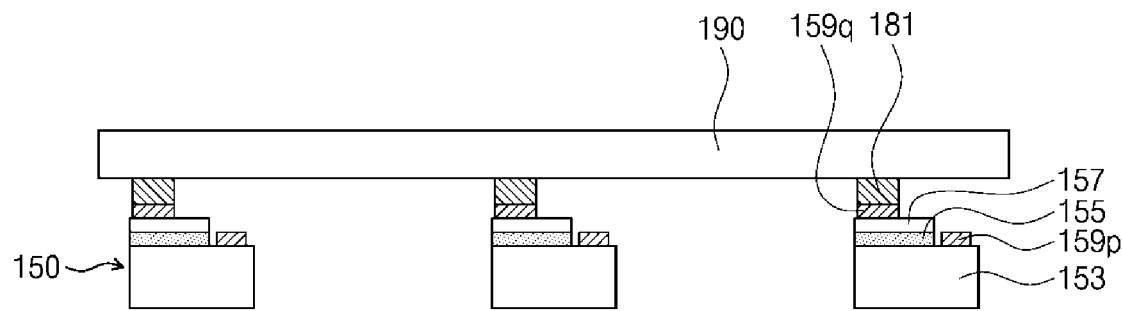
Figure 12L:
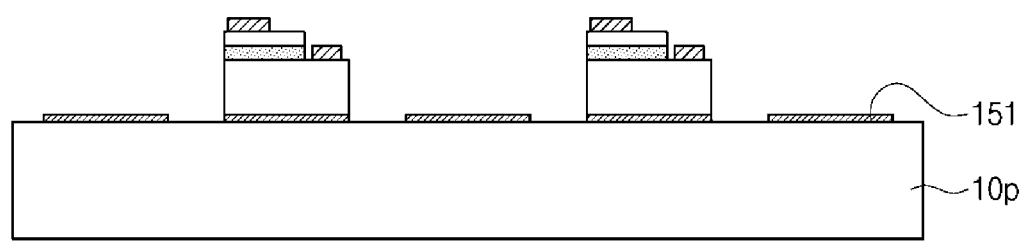
Figure 12M:
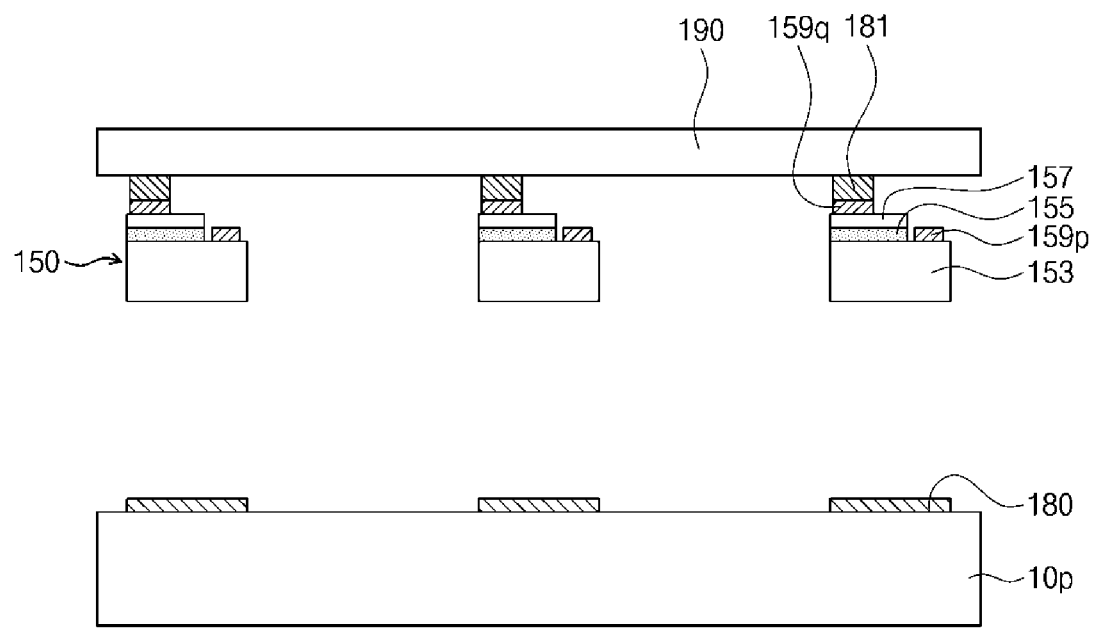
Figure 12N:
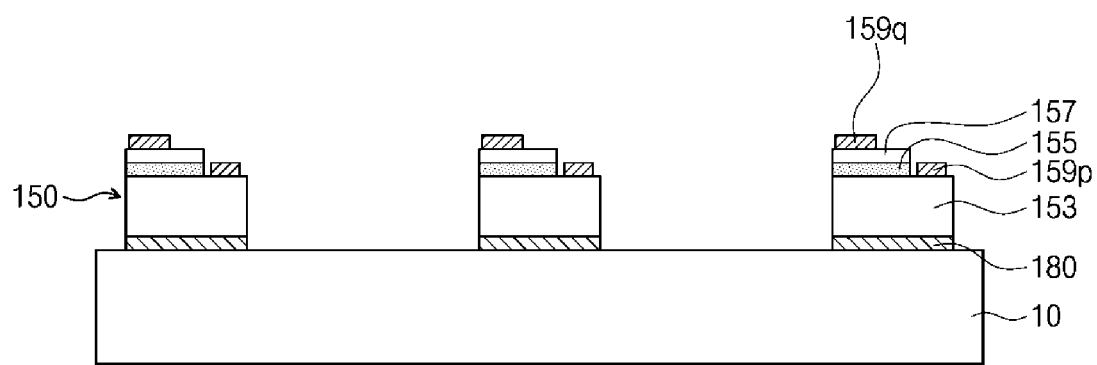

FIGS. 12A to 12N are cross-sectional views showing in detail the manufacturing and transferring method of the light emitting device in order.

Referring to FIG. 12A, an epitaxial stack is formed on a first temporary substrate 10p. The epitaxial stack may include a semiconductor layer including the first semiconductor layer 153, the active layer 155, and the second semiconductor layer 157. In the exemplary embodiment, the first temporary substrate 10p may be a sapphire substrate. The semiconductor layer may be the gallium nitride (GaN) semiconductor layer. For instance, the first semiconductor layer 153, the active layer 155, and the second semiconductor layer 157 may be an n-type gallium nitride (GaN) semiconductor layer, an aluminum indium gallium nitride (AlInGaN) semiconductor layer, and a p-type gallium nitride (GaN) semiconductor layer, respectively.

Referring to FIG. 12B, the epitaxial stack formed on the first temporary substrate 10p is isolated into each light emitting device unit. Each light emitting device unit is a minimum unit required to manufacture one light emitting device, and the light emitting devices adjacent to each other are physically separated.

Referring to FIG. 12C. a mesa structure is formed in the epitaxial stack corresponding to each light emitting device. That is, the epitaxial stack has the mesa structure in which some portions are protruded upward and the other portions are recessed downward. To this end, some portions of the first semiconductor layer 153, the active layer 155, and the second semiconductor layer 157 among layers of the epitaxial stack are removed, and thus the first semiconductor 153 is exposed upward. In the exemplary embodiment, portions of the n-type semiconductor layer, the active layer, and the p-type semiconductor layer are removed, and thus the n-type semiconductor layer may be exposed upward.

Referring to FIG. 12D, the electrode part is formed on the epitaxial stack manufactured on the first temporary substrate 10p, and thus the light emitting device is manufactured. The electrode part includes the first electrode 159p connected to the first semiconductor layer 153 and the second electrode 159q connected to the second semiconductor layer 157. The first electrode 159p is formed on the first semiconductor layer 153 on which the active layer 155 and the second semiconductor layer 157 are not provided, and the second electrode 159q is formed on the second semiconductor layer 157. The first and/or second electrodes 159p and 159q may have a single- or multi-layer structure of the metal material.

Referring to FIG. 12E, the protective layer 165 is formed on the light emitting device 150 manufactured on the first temporary substrate 10p. The protective layer 165 is used to temporarily protect the light emitting device in the manufacturing process of the light emitting device. Accordingly, the protective layer 165 may be formed of a material that is easily removed after being formed to completely cover the light emitting device 150. The material for the protective layer 165 should not be particularly limited and may include, for example, organic/inorganic polymers, such as epoxy, polysiloxane, or photoresist. As an example, PDMS (polydimethylsiloxane) may be used as the polysiloxane material. However, the material for the protective layer 165 should not be particularly limited, and materials, such as HSSQ (Hydrogen Silsesquioxane), MSSQ (Methyksilsesquioxane), polyimide, Divinyl Siloxane, DVS-BCS (bis-Benzocyclobutane), PFCB (Perfluorocyclobutane), and PAE (Polyarylene Ether), may be used as the material of the protective layer 165.

Referring to FIG. 12F, a second temporary substrate 10q is provided above the protective layer 165 with a separation layer 10q' interposed therebetween. The second temporary substrate 10q is a support substrate to support each light emitting device 150 and the protective layer 165 from above. The separation layer 10q' attaches the second temporary substrate 10q to the protective layer 165 but is used to easily separate the second temporary substrate 10q from the protective layer 165.

In the exemplary embodiment, the second temporary substrate 10q may be a sapphire substrate, and the separation layer 10q' may include a metal oxide material, such as indium tin oxide (ITO). However, the second temporary substrate 10q and the separation layer 10q' should not be limited thereto or thereby. That is, the second temporary substrate 10q and the separation layer 10q' may include various materials as long as they sufficiently support the protective layer 165 and the light emitting devices 150 in the protective layer 165 and are easily removed.

In the present exemplary embodiment, the laser LSR is irradiated to the interface between the light emitting devices 150 and the first temporary substrate 10p while the light emitting devices 150 and the protective layer 165 are supported by the second temporary substrate 10q. In detail, the laser LSR is irradiated to the interface between the first semiconductor layer 153 and the first temporary substrate 10p.

The laser LSR is used to pyrolyze molecules in the interface between the first semiconductor layer 153 and the first temporary substrate 10p. In the exemplary embodiment, the first semiconductor layer 153 includes gallium nitride (GaN), the gallium nitride (GaN) is pyrolyzed by the irradiation of the laser LSR, and as a result, nitrogen atoms are removed as nitrogen gas ($N_2$). Accordingly, an auxiliary layer 151 containing gallium (Ga) is formed between the first semiconductor layer 153 and the first temporary substrate 10p after removing nitride (N) from the gallium nitride (GaN). In this case, since the gallium (Ga) still remains between the first semiconductor layer 153 and the first temporary substrate 10p, the light emitting device is continuously attached onto the substrate due to an adhesion of the gallium (Ga). However, the adhesion between the first semiconductor layer 153 and the first temporary substrate 10p after irradiating the laser LSR is markedly weakened when compared with the adhesion between the first semiconductor layer 153 and the first temporary substrate 10p before irradiating the laser LSR.

The second temporary substrate 10q prevents the light emitting device 150 and the protective layer 165 from being lifted when the laser LSR is irradiated to the interface between the first semiconductor layer 153 and the first temporary substrate 10p. The light emitting device 150 and/or the protective layer 165 adjacent to the light emitting device 150 may be lifted due to heat and gas generated when the laser LSR is irradiated, however, since the second temporary substrate 10q supports the light emitting devices 150 and the protective layer 165 while downwardly pressing the light emitting devices 150 and the protective layer 165, the lift of the light emitting devices 150 and the protective layer 165 may be minimized.

Referring to FIG. 12G, the laser LSR is irradiated between the second temporary substrate 10q and the protective layer 165, in detail, to the separation layer 10q' provided between the second temporary substrate 10q and the protective layer 165.

Referring to FIG. 12H, when the laser LSR is irradiated to the separation layer 10q', the adhesion between the second temporary substrate 10q and the protective layer 165 is weakened, and thus the second temporary substrate 10q is easily removed.

Referring to FIG. 12I, the protective layer 165 is removed. The protective layer 165 may be easily removed using a wet or dry etching process. Accordingly, the light emitting device 150 is finally formed on the first temporary substrate 10p, and the auxiliary layer 151 having weak adhesion is formed between the first temporary substrate 10p and the first semiconductor layer 153 of the light emitting device 150.

Referring to FIG. 12J, the conveying apparatus 190 is disposed above the light emitting device 150 to be conveyed. A temporary adhesive layer 181 is provided on a surface of the conveying apparatus 190, which faces the light emitting device 150. Since the temporary adhesive layer 181 is provided only to areas corresponding to the light emitting devices 150 to be conveyed, locations of the temporary adhesive layer 181 may be determined by taking into account final locations of the light emitting devices 150 to be conveyed.

Referring to FIG. 12K, the light emitting device 150 is attached to the temporary adhesive layer 181 by making contact the temporary adhesive layer 181 of the conveying apparatus 190 with the light emitting device 150.

Referring to FIG. 12L, the conveying apparatus 190 moves spaced apart from the first temporary substrate 10p while the light emitting device 150 is attached to the temporary adhesive layer 181. Due to the movement of the conveying apparatus 190, the light emitting device 150 attached to the temporary adhesive layer 181 is separated from the first temporary substrate 10p. In this case, the adhesion of the temporary adhesive layer 181 is larger than the adhesion of the auxiliary layer 151 including gallium (Ga). Since the adhesion of the auxiliary layer 151 including gallium (Ga) is very weak, the light emitting device 150 is very easily separated from the first temporary substrate 10p by using the temporary adhesive layer 181.

Referring to FIG. 12M, a substrate on which the light emitting device 150 is finally mounted is prepared, and the adhesive layer 180 is provided on the substrate to attach the light emitting device 150. In FIG. 7M, for the convenience of explanation, some components are omitted, and other components are not disposed on the substrate 10 and the adhesive layer 180. However, various components of the displaying apparatus, e.g., the light passing layer, the light conversion layer, or the reflection layer, may be further interposed between the substrate 10 and the adhesive layer 180.

In the exemplary embodiment, the light emitting devices 150 attached to the conveying apparatus 190 are aligned on and attached to the substrate 10 on which the adhesive layer 180 is formed. In this case, an attachment area between the light emitting device 150 and the adhesive layer 180 may be wider than an attachment area between the light emitting devices 150 and the temporary adhesive layer 181 on the conveying apparatus 190.

Referring to FIG. 12N, the conveying apparatus 190 is separated from the first light emitting device 150 after the light emitting devices 150 are attached to the adhesive layer 180. Although the temporary adhesive layer 181 on the conveying apparatus 190 has substantially the same adhesion as that of the adhesive layer 180 on the substrate 10, the conveying apparatus 190 (in detail, the temporary adhesive layer 181 on the conveying apparatus 190) may be easily separated from the light emitting devices 150 since the adhesion between the light emitting device 150 and the adhesive layer 180 is high when the attachment area between the light emitting device 150 and the adhesive layer 180 is wider than the attachment area between the light emitting device 150 and the temporary adhesive layer 181 on the conveying apparatus 190.

As described above, according to the exemplary embodiment, the light emitting device formed on the separate substrate may be easily transferred on the desired substrate. In more detail, according to the exemplary embodiment, it is possible to form the epitaxial stack on the growth substrate, such as the sapphire substrate, and to directly transfer the light emitting device from the growth substrate onto the substrate, on which the light emitting device is to be formed. In addition, since it is possible to precisely and selectively align only the light emitting devices corresponding to desired locations on the substrate using the conveying apparatus after forming the light emitting devices on the growth substrate, such as the sapphire substrate, defects caused by misalignment of the light emitting devices in the manufacturing process of the light emitting apparatus are reduced. Further, since it is possible to directly transfer the light emitting device without additional processes, a polishing or breaking process is not needed. Therefore, the manufacturing process of the light emitting apparatus may be simplified, a production yield of the light emitting apparatus may increase, and a manufacturing cost of the light emitting device may be reduced.

In addition, although not shown in drawings, the light emitting device that does not use the gallium nitride (GaN) semiconductor, e.g., the red light emitting device, may be transferred onto the substrate after being manufactured in various ways other than the above-described method. In the exemplary embodiment, the method of manufacturing and transferring the red light emitting device on the gallium arsenide (GaAs) semiconductor substrate may be performed by forming a sacrificial layer on the gallium arsenide (GaAs) semiconductor substrate, forming aluminum gallium indium phosphide (AlGaInP) semiconductor layer on the sacrificial layer, forming the electrode part on the semiconductor layer to manufacture the red light emitting device, removing the sacrificial layer, and conveying the red light emitting device onto the substrate using the conveying apparatus.

In the exemplary embodiment, the light emitting device may be manufactured and transferred as described in FIGS. 12A to 12N, however according to another embodiment, other types of light emitting device may be manufactured and transferred using other types of substrates. For example, a light emitting device provided with concavo-convex portions formed on a lower portion thereof may be manufactured using a patterned substrate provided with predetermined concavo-convex portions formed on an upper portion thereof and may be transferred onto the substrate.

FIGS. 13A to 13E are cross-sectional views showing a manufacturing method of a light emitting device and a transferring method of the light emitting device according to another exemplary embodiment. For the convenience of explanation, only the main processes are illustrated in FIGS. 8A to 8E. In the exemplary embodiment shown in FIGS. 13A to 13E, the manufacturing and transferring method of the light emitting device are substantially the same as those of the embodiment shown in FIGS. 12A to 12N except for the patterned substrate, i.e., a patterned sapphire substrate (PSS), used as a first temporary substrate 10p. Accordingly, hereinafter, different features from those of the above-described embodiments will be mainly described in order to avoid redundancy.

Figure 13A:
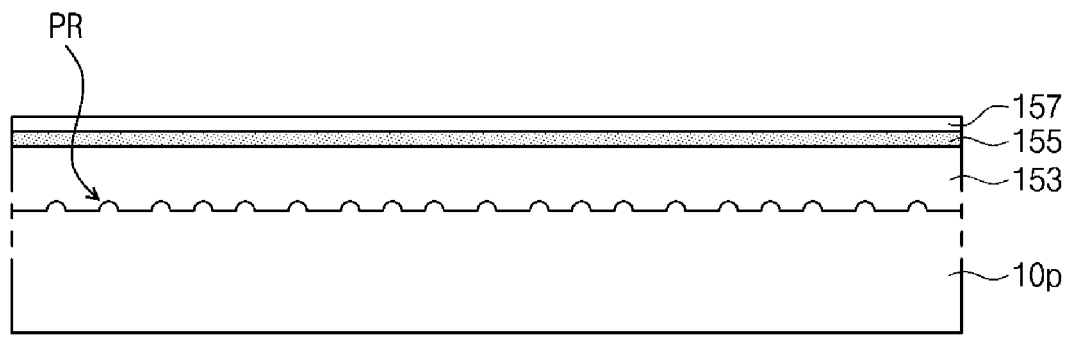
FIGS. 13A, 13B, 13C, 13D, and 13E are cross-sectional views showing a manufacturing method of a light emitting device and a transferring method of the light emitting device according to another exemplary embodiment.

Referring to FIG. 13A, the patterned first temporary substrate 10p is provided as the first temporary substrate 10p, and an epitaxial stack including a first semiconductor layer 153, an active layer 155, and a second semiconductor layer 157 is formed on the patterned first temporary substrate 10p.

The patterned first temporary substrate 10p has the concavo-convex portions PR, and each concavo-convex portion PR may be provided in various shapes, such as a polygonal pyramid, a hemisphere, or a surface having a roughness, on which the concavo-convex portions are randomly arranged. In FIG. 13A, for the convenience of explanation, the upper surface of the first temporary substrate 10p has semi-circular convex portions in cross-section as a representative example.

Figure 13B:
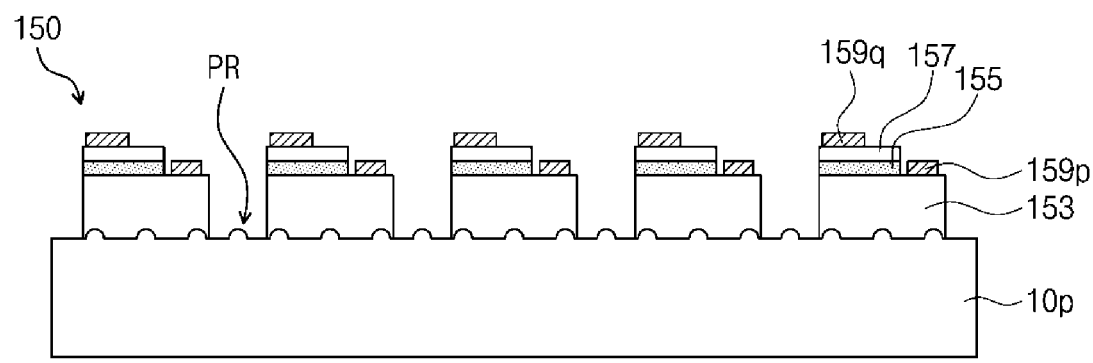

Referring to FIG. 13B, light emitting devices 150 are formed on the first temporary substrate 10p through separating and etching processes of the epitaxial stack and forming of an electrode part.

Figure 13C:
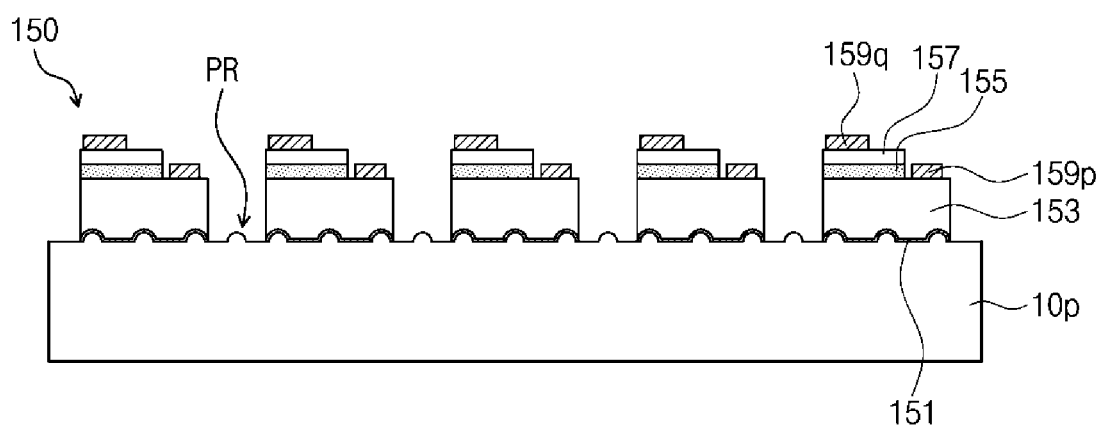

Referring to FIG. 13C, a laser LSR is irradiated to an interface between the first semiconductor layer 153 and the first temporary substrate 10p to form an auxiliary layer 151. In this case, since the auxiliary layer 151 is formed along an upper surface of the first temporary substrate 10p, the auxiliary layer 151 has substantially the same shape as that of the concavo-convex portions PR.

Figure 13D:
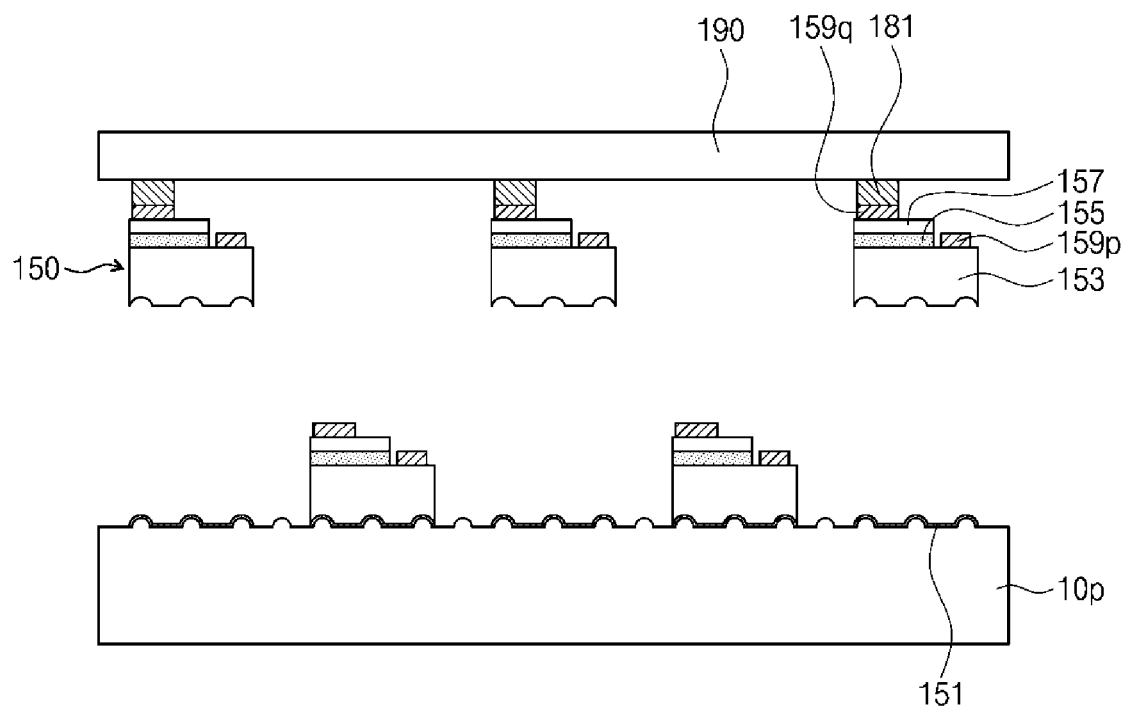

Referring to FIG. 13D, the light emitting device 150 is separated from the first temporary substrate 10p using a conveying apparatus 190. In this case, a lower surface of the light emitting device 150 has a shape corresponding to the upper surface of the patterned first temporary substrate 10p.

That is, the lower surface of the light emitting device 150 has a reverse shape of the concavo-convex portions PR on the upper surface of the first temporary substrate 10p, and thus the concavo-convex portions PR are formed on the lower surface of the light emitting device 150.

Figure 13E:
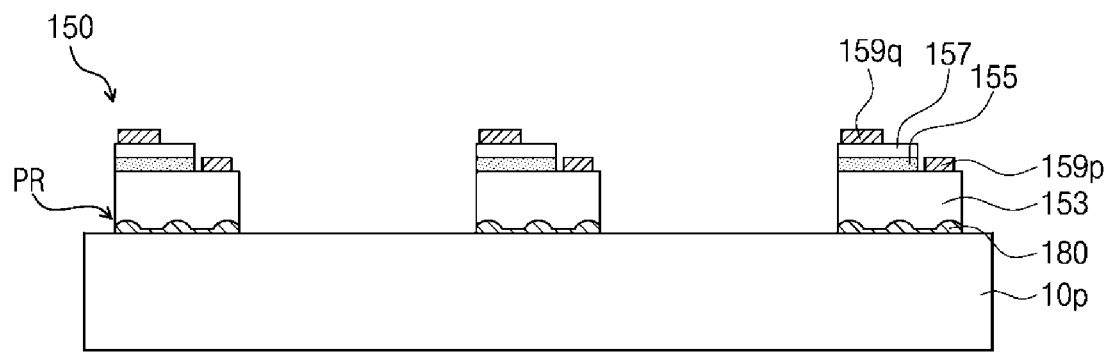

Referring to FIG. 13E, the light emitting device 150 including the concavo-convex portions PR formed on the lower surface thereof is attached to a substrate 10 with an adhesive layer 180 interposed therebetween.

As described above, when the concavo-convex portions are formed in the light emitting device, the light emitting efficiency increases. There may be a difference in intensity between lights emitted from the light emitting devices, and the difference in intensity may cause a difference in visibility. Accordingly, the concavo-convex portions may be selectively formed in the light emitting device in accordance with the light emitting efficiency.

In the exemplary embodiments, the light emitting apparatuses according to the above-described embodiments may be manufactured through substantially the same method with some structural differences. Hereinafter, a method of manufacturing the light emitting apparatus shown in FIGS. 1A and 1B using the manufacturing and transferring methods of the light emitting device shown in FIGS. 11 to 13 will be described. The manufacturing and transferring methods of the light emitting device shown in FIGS. 11 to 13 may be employed in operations of transferring the light emitting device onto the substrate on which the light passing layer (and/or the light conversion layer) and the color filter layer are formed after the light passing layer (and/or the light conversion layer) and a color filter layer are formed on the substrate, and thus the manufacturing and transferring methods of the light emitting device will be described with the operations of forming the light passing layer and the color filter layer on the substrate. In the following embodiments, for the convenience of explanation, some components are omitted, and some components are shown. Unexplained portions are assumed to be the same as or similar to those of the above-described embodiments.

FIGS. 14A to 14M are cross-sectional views showing a manufacturing method of the light emitting apparatus according to an exemplary embodiment.

Figure 14A:
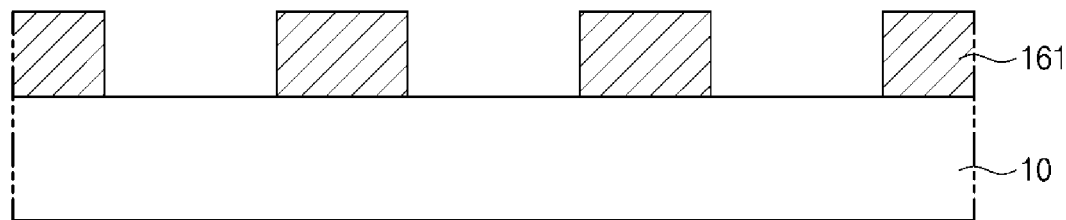
FIGS. 14A, 14B, 14C, 14D, 14E, 14F, 14G, 14H, 14I, 14J, 14K, 14L, and 14M are cross-sectional views showing a manufacturing method of a light emitting apparatus according to an exemplary embodiment

Referring to FIG. 14A, the substrate 10 is prepared, the first insulation layer 161 is formed on the substrate 10. The first insulation layer 161 may be formed through various methods. As an example, the first insulation layer 161 may be formed by coating an insulating material on the substrate 10 and patterning the insulating material using a photolithography process.

Figure 14B:
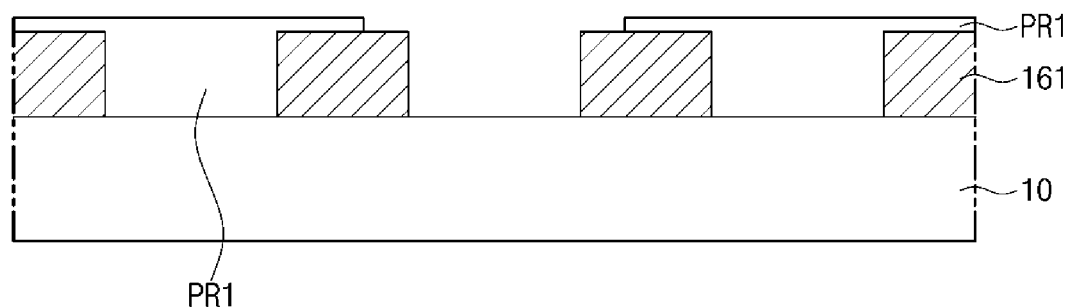

Referring to FIG. 14B, a photoresist is coated on the substrate 10 on which the first insulation layer 161 is formed, and the photoresist is exposed and developed to form a first photoresist pattern PR1. Here, an area from which the photoresist is removed corresponds to the area in which the light conversion layer 120f is formed, and in the present exemplary embodiment, the area corresponds to a second pixel area.

Figure 14C:
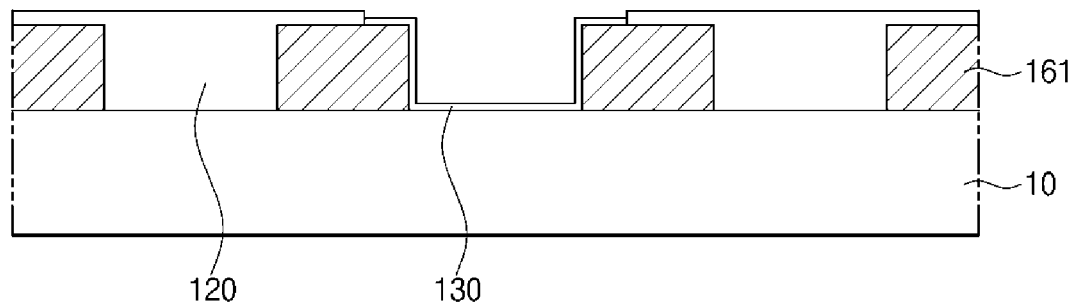

Referring to FIG. 14C, the color filter layer 130 is selectively formed in the second pixel area in which the first photoresist pattern PR1 is not formed. The color filter layer 130 may be formed by a spin coating method, a screen printing method, or the like. The color filter layer 130 may be formed on an entire surface of the substrate 10 on which the first photoresist pattern PR1 is formed or formed by patterning the color filter layer 130 formed on the entire surface of the substrate 10. Although the color filter layer 130 is formed on the entire surface of the substrate 10, the color filter layer 130 may not be patterned since the color filter layer 130 may be partially removed by a polishing process described later.

In the drawings according to the present exemplary embodiment, a process of forming the reflection layer is not shown, however the reflection layer may be further formed on the substrate 10, on which the first insulation layer 161 is formed, before the color filter layer 130 is formed. The reflection layer may be formed, for example, by forming the metal layer or the dielectric mirror layer and patterning the metal layer or the dielectric mirror layer using a photolithography process.

Figure 14D:
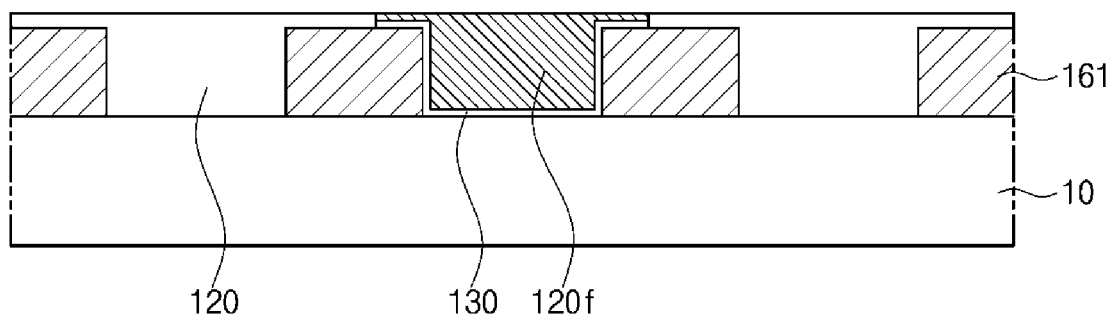

Referring to FIG. 14D, the light conversion layer 120f is formed in the second pixel area in which the first photoresist pattern PR1 is not formed. The light conversion layer 120f may be provided in the second pixel area by coating or dropping the light conversion layer in fluid form and may be cured.

Figure 14E:
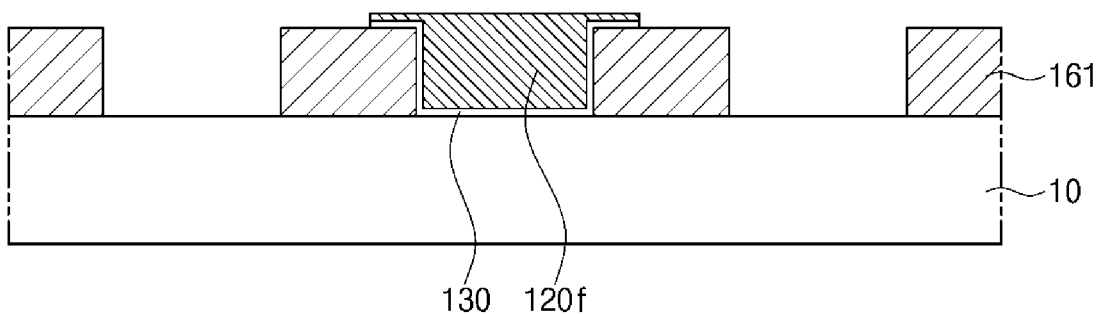

Referring to FIG. 14E, the first photoresist pattern PR1 is removed from an area except for the area in which the light conversion layer 120f is formed. After the first photoresist pattern PR1 is removed, the upper surface of the substrate 10, which corresponds to a first pixel area and a third pixel area, is exposed.

Figure 14F:
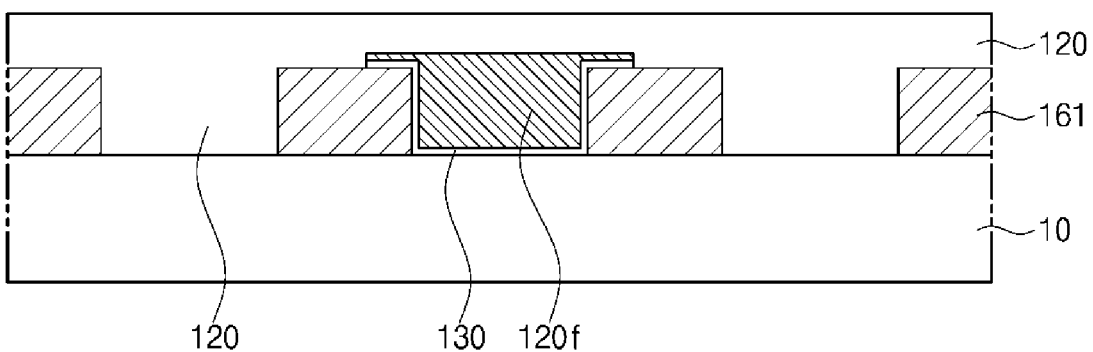

Referring to FIG. 14F, the light passing layer 120 is formed on the entire surface of the substrate 10 including the first and third pixel areas. In this case, the light passing layer 120 does not include a portion of the light passing layer, which serves as the light conversion layer 120f, and the light passing layer 120 may be formed to have a thickness sufficient to cover the whole of the light conversion layer 120f.

Figure 14G:
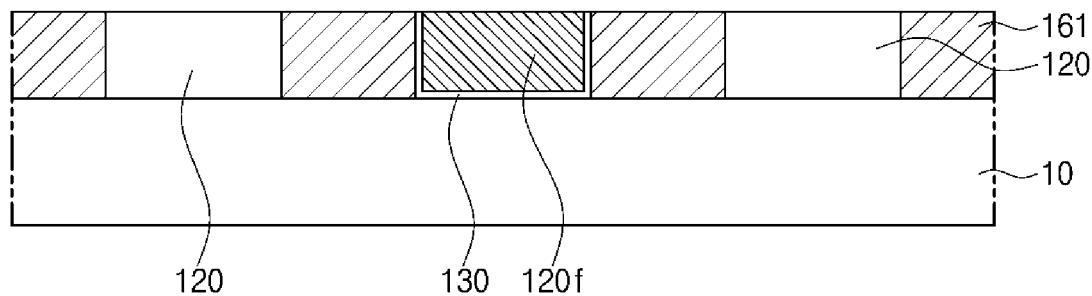

Referring to FIG. 14G, an upper surface of the light passing layer 120, which is formed at the sufficient thickness and includes the light conversion layer 120f, may be polished, and a height of the first insulation layer 161 and the light passing layer 120 (including the light conversion layer 120f) is flattened. The upper surface of the light passing layer 120 may be flattened by using a chemical or physical polishing.

Figure 14H:
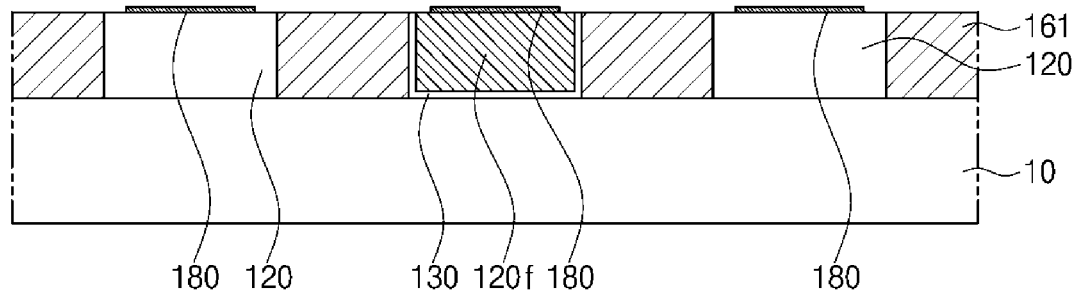

Referring to FIG. 14H, the adhesive layer 180 is formed on the light passing layer 120 of the flattened substrate 10. The adhesive layer 180 may be provided at an amount and a height, by which the light emitting device is attached well, and the adhesive layer 180 may be provided using an organic polymer having fluidity and may be cured after the light emitting device 150 is mounted thereon.

Figure 14I:
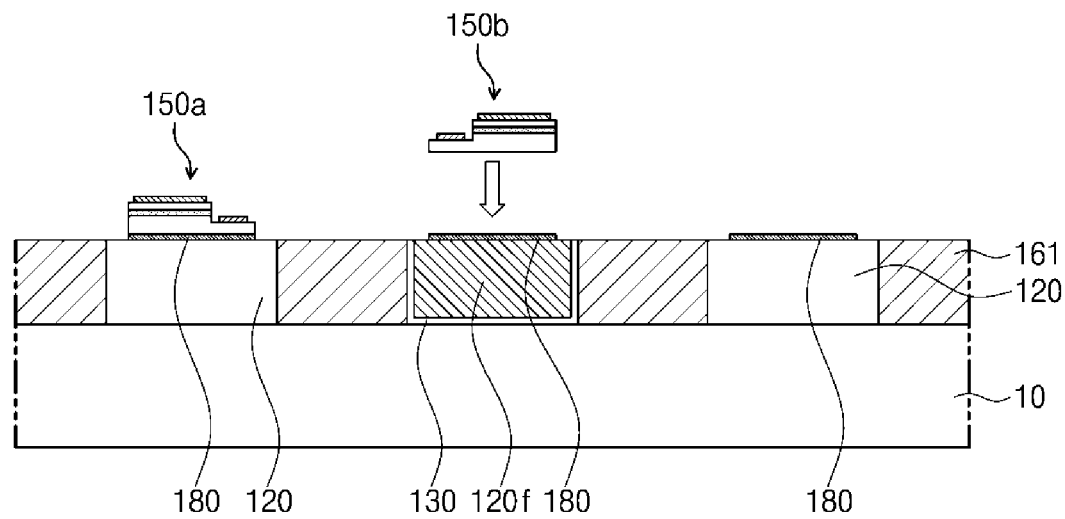

Referring to FIG. 14I, the light emitting device 150 is attached onto the substrate 10 on which the adhesive layer 180 is provided. Each light emitting device 150 may be transferred onto the substrate 10 after being manufactured on a separate substrate 10.

Figure 14J:
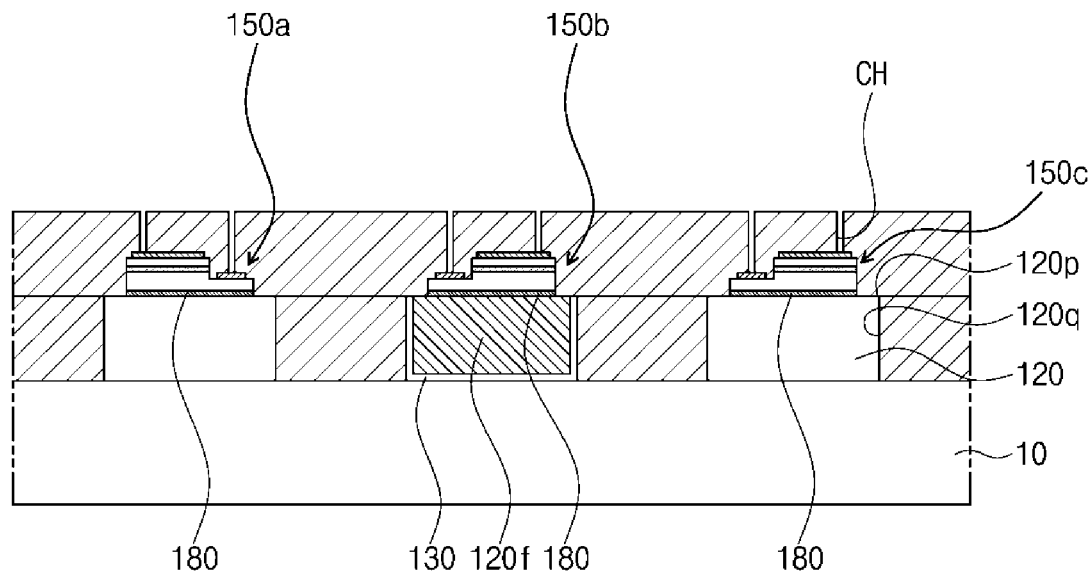

Referring to FIG. 14J, the second insulation layer 163 is formed on the substrate 10 on which the light emitting device 150 is attached. The second insulation layer 163 may cover the light passing layer 120, the first insulation layer 161, and the first, second, and third light emitting devices 150a, 150b, and 150c and may be provided in various ways. The contact holes CH are defined through the second insulation layer 163 to expose the electrodes of the first, second, and third light emitting devices 150a, 150b, and 150c, and the second insulation layer 163 through which the contact holes CH are defined may be easily formed using a photolithography process after being coated.

Figure 14K:
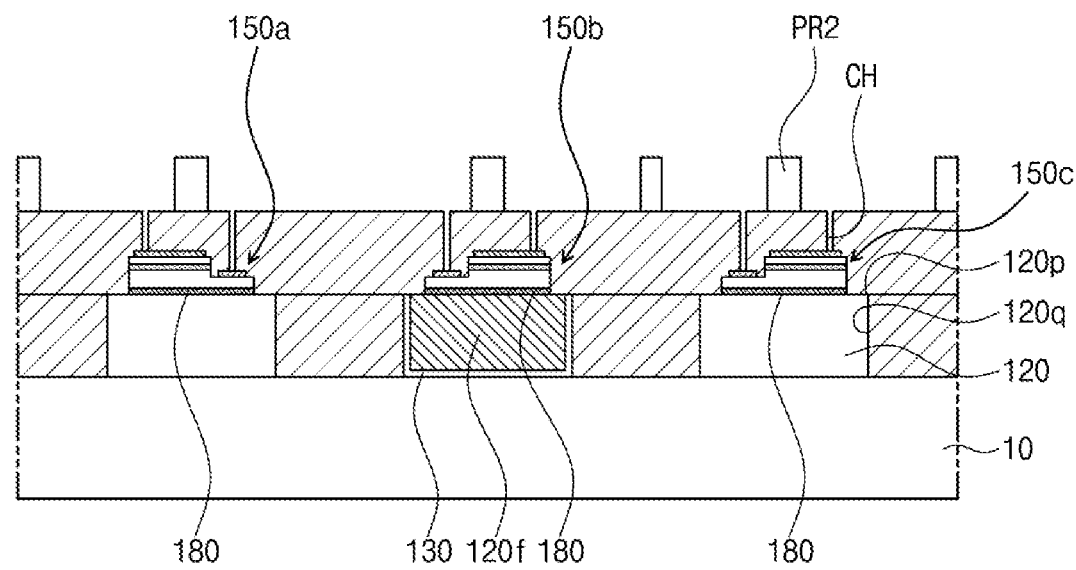
Figure 14L:
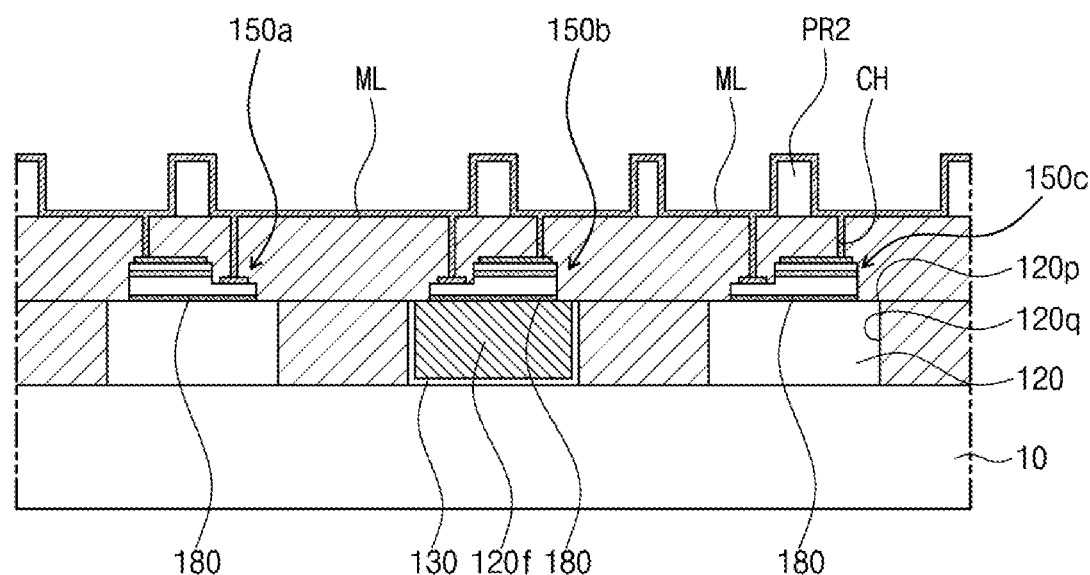
Figure 14M:
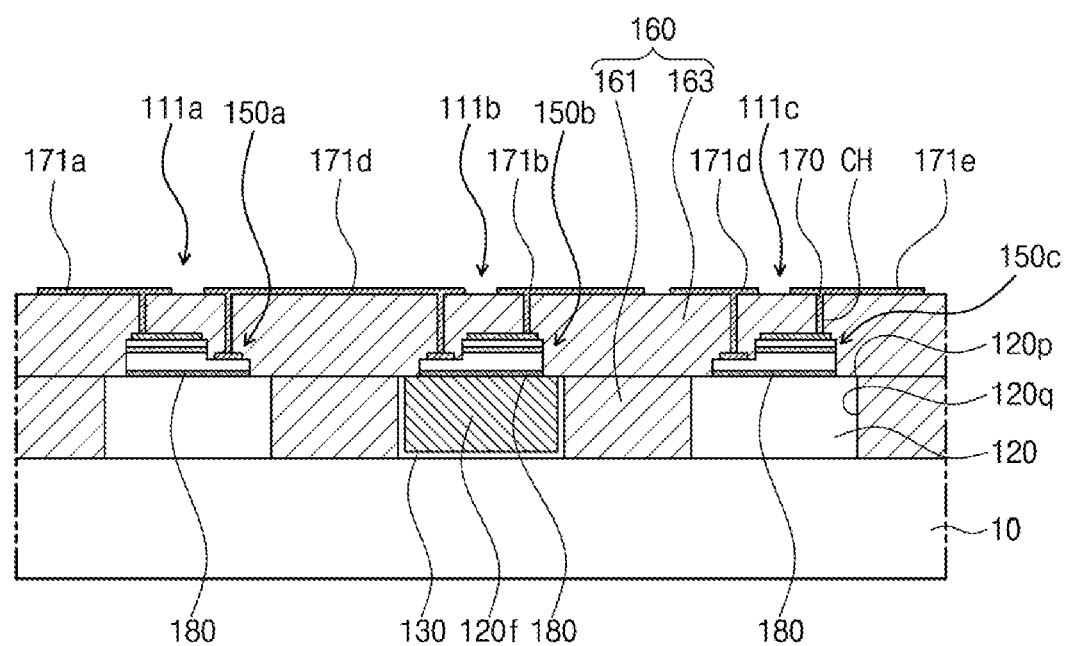

FIGS. 14K to 14M show a process for forming the terminal part 170 on the second insulation layer 163 using a lift-off method as a representative example.

First, as shown in FIG. 14K, a second photoresist pattern PR2 is formed on the second insulation layer 163. The second photoresist pattern PR2 is formed by coating a photoresist and exposing/developing the photoresist. In this case, an area from which the photoresist is removed corresponds to an area in which the terminal part 170 is formed.

Then, as shown in FIG. 14L, a conductive layer ML is formed on the entire surface of the substrate 10 on which the second photoresist pattern PR2 is formed. The conductive layer ML may include the material for forming the terminal part 170 and may have the single- or multi-layer structure of the metal and/or metal alloy.

After that, as shown in FIG. 14M, the second photoresist pattern PR2 is removed with the metal layer formed thereon, and thus the terminal part 170 is formed on the second insulation layer 163.

The light emitting apparatus according to the exemplary embodiment may be easily formed using the above-described method. In particular, since the pixels and the terminal part may be sequentially formed on the substrate using the conventional processes, e.g., a coating process, a silk-screen process, and a photolithography process, processes for separately manufacturing the pixel units and mounting the pixel units on the separate substrate are not necessary.

In the conventional art, a light emitting apparatus is completed by separately manufacturing a light emitting device chip, separately manufacturing a PCB substrate on which a terminal part and wirings are formed, and attaching the light emitting device chip to the PCB substrate using a conductive paste. In this case, the terminal part and the wirings are formed on the PCB substrate through complex processes of forming thru-holes penetrating through top and bottom of the PCB substrate and forming additional electrode and connection wirings, which are electrically connected to each other through the thru-holes. In addition, since areas are additionally required in the PCB substrate to form the thru-holes, it is difficult to miniaturize pixels. The areas for the thru-holes may be reduced by decreasing a diameter of the thru-holes, however in this case, it is difficult to form the thru-holes due to the decreased diameter of the thru-holes, and a difficulty and a cost in fabricating sharply increase.

In contrast, the light emitting apparatus according to the exemplary embodiment is manufactured by forming the contact holes through the insulation layer without employing the separate printed circuit board and connecting the terminal part through the contact holes. Thus, the pixel may be miniaturized, and the light emitting apparatus may be simply manufactured at a low cost.

In the above drawings, the light emitting apparatus is shown with respect to one pixel unit, however plural pixel units may be substantially simultaneously formed on a large-sized substrate, and the large-sized substrate may be divided into individual display units of various sizes through a cutting process. The term "display unit" means a unit in which one or plural pixel units are mounted on one substrate. The divided individual display units are assembled and mounted on a base substrate on which wirings or driving circuits are mounted, for example, on the printed circuit board, and thus the light emitting apparatus or displaying apparatus of various sizes may be manufactured.

According to the exemplary embodiment, the manufacturing method of the displaying apparatus includes the transferring method of stably and efficiently transferring plural light emitting devices. FIGS. 15A to 15D are conceptual views sequentially showing the method of simultaneously transferring the plural light emitting devices. In the following descriptions, the red, green, and blue lights are implemented, and a case that uses the light conversion layer while the blue light emitting diode is used as the light emitting device instead of the red light emitting diode to display the red light will be described as a representative example. Accordingly, the blue light emitting device, the green light emitting device, and the blue light emitting device are respectively provided in the red pixel, the green pixel, and the blue pixel.

Figure 15A:
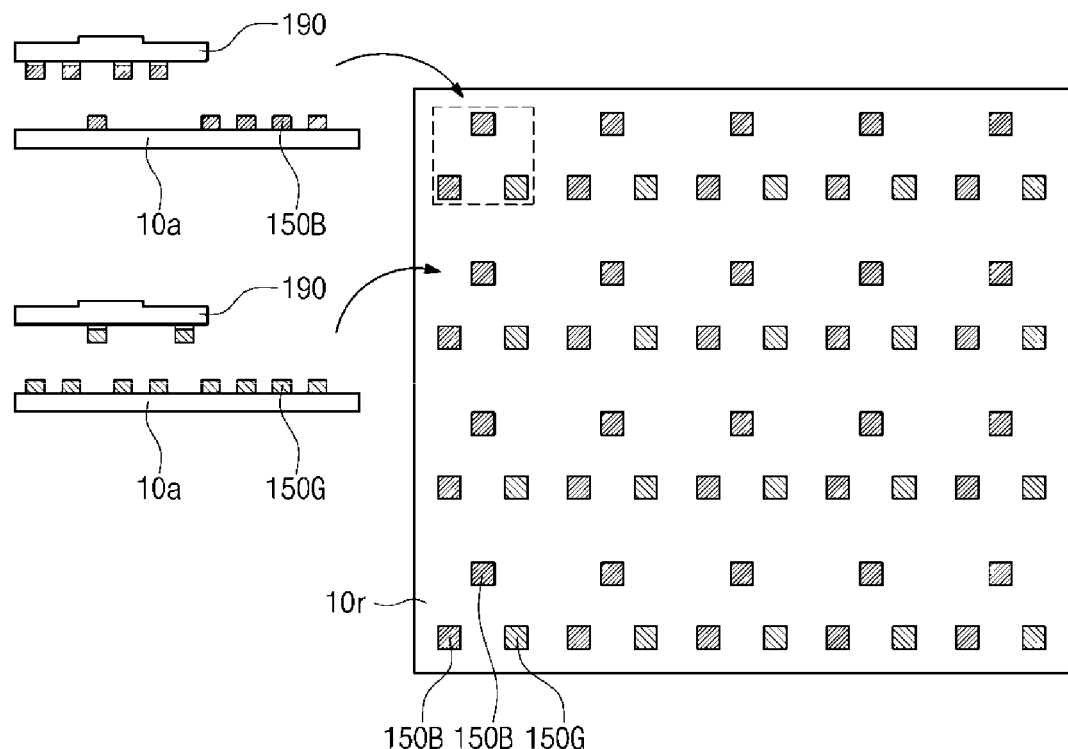
FIGS. 15A, 15B, 15C, 15D and 15E are conceptual views sequentially showing a method of simultaneously transferring plural light emitting devices.

Referring to FIG. 15A, a plurality of blue light emitting devices 150B is formed on a first temporary substrate 10p, and a plurality of green light emitting devices 150G is formed on a separate first temporary substrate 10p.

The green light emitting devices 150G and the blue light emitting devices 150B, which are formed on the separate temporary substrate 10p, are transferred onto a third temporary substrate 10r using a conveying apparatus 190. The third temporary substrate 10r may have heat resistance, flexibility, and/or viscosity and may be provided in the form of sheet. The third temporary substrate 10r is a temporary substrate on which the light emitting devices are temporarily aligned before the blue light emitting devices 150B or the green light emitting devices 150G are transferred onto a final substrate.

The light emitting devices 150, which are to be finally mounted, are arranged on the third temporary substrate 10r to correspond to the pixels.

An additional process, e.g., a process of forming the electrode part, may be performed on the light emitting devices 150 on the third temporary substrate 10r. A temporary adhesive layer 183 is provided on the third temporary substrate 10r, the light emitting devices 150 is attached on the temporary adhesive layer.

Figure 15B:
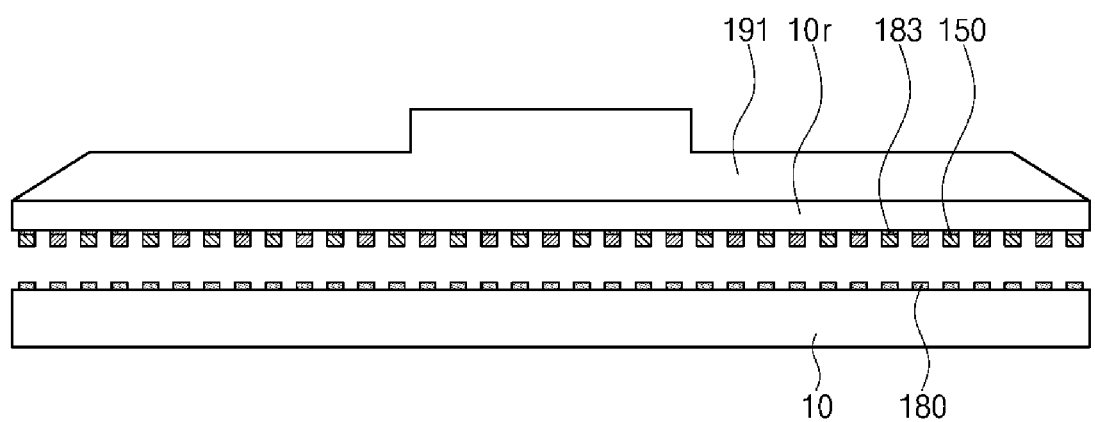

Referring to FIG. 15B, the substrate 10, on which the light emitting devices 150 are finally formed, is prepared. The adhesive layer 180 is provided in locations corresponding to the light emitting devices 150. Here, the adhesive layer 180 may include an organic or inorganic polymer or may be a solder. In the exemplary embodiment, the solder of the adhesive layer 180 may include a eutectic material.

The third temporary substrate 10r on which the light emitting devices 150 are formed is gripped by the conveying apparatus 190 and inverted to face the substrate 10 with the light emitting devices 150 interposed therebetween.

Figure 15C:
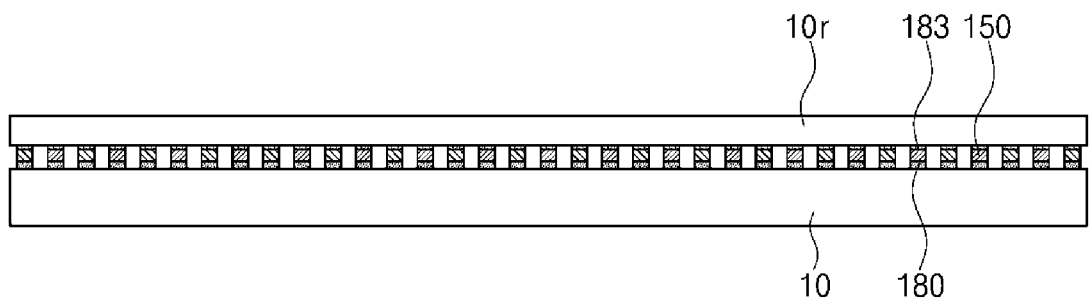

Referring to FIG. 15C, the third temporary substrate 10r is pressed downward, and thus the light emitting devices 150 are attached to the adhesive layer 180. In the case where the adhesive layer 180 includes the eutectic material, the third temporary substrate 10r may be pressed at a eutectic temperature or more and a eutectic bonding is possible through reflow. Since the third temporary substrate 10r may have flexibility, the light emitting devices 150 are effectively pressed downward and attached to the adhesive layer 180, and the light emitting devices may be prevented from being separated from their locations and from being attached in an inclined manner.

Figure 15D:
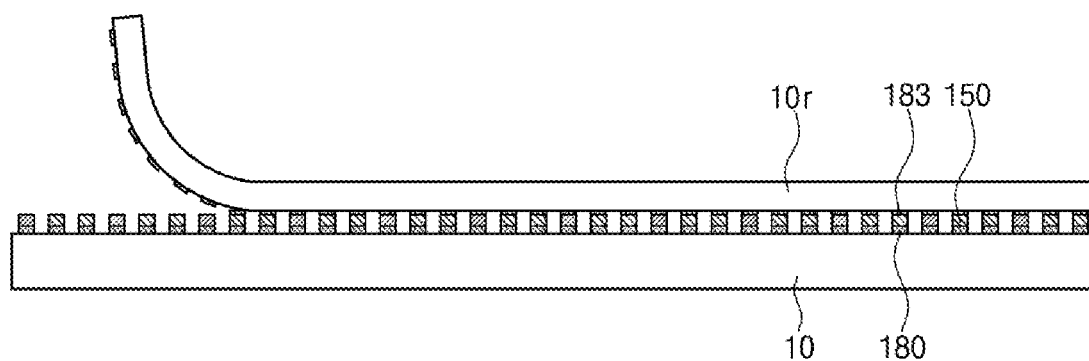
Figure 15E:
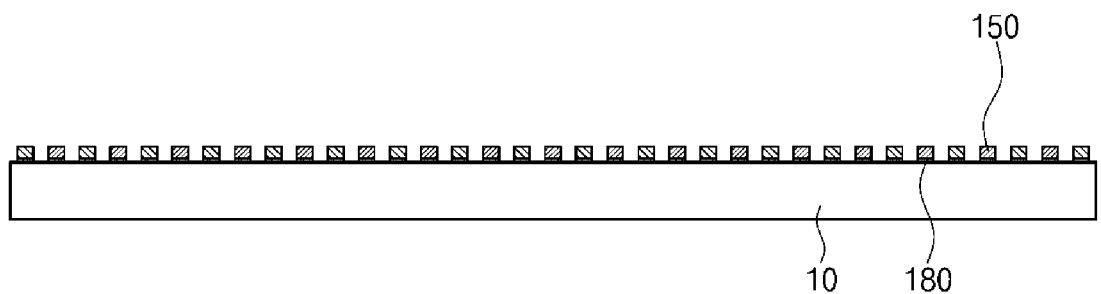

Referring to FIG. 15D, after the light emitting devices 150 are completely attached to the adhesive layer 180 on the substrate 10, for example, after the light emitting devices 150 are completely attached by the eutectic solder, the third temporary substrate 10r is removed. As a result, the light emitting devices 150 are massively transferred onto the substrate 10 as shown in FIG. 15E.

According to the above-described embodiment, it is possible to manufacture the display apparatus in which the defects, for example, the light emitting devices are separated from their locations or the light emitting devices are inclinedly attached, are prevented as much as possible.

Figure 16:
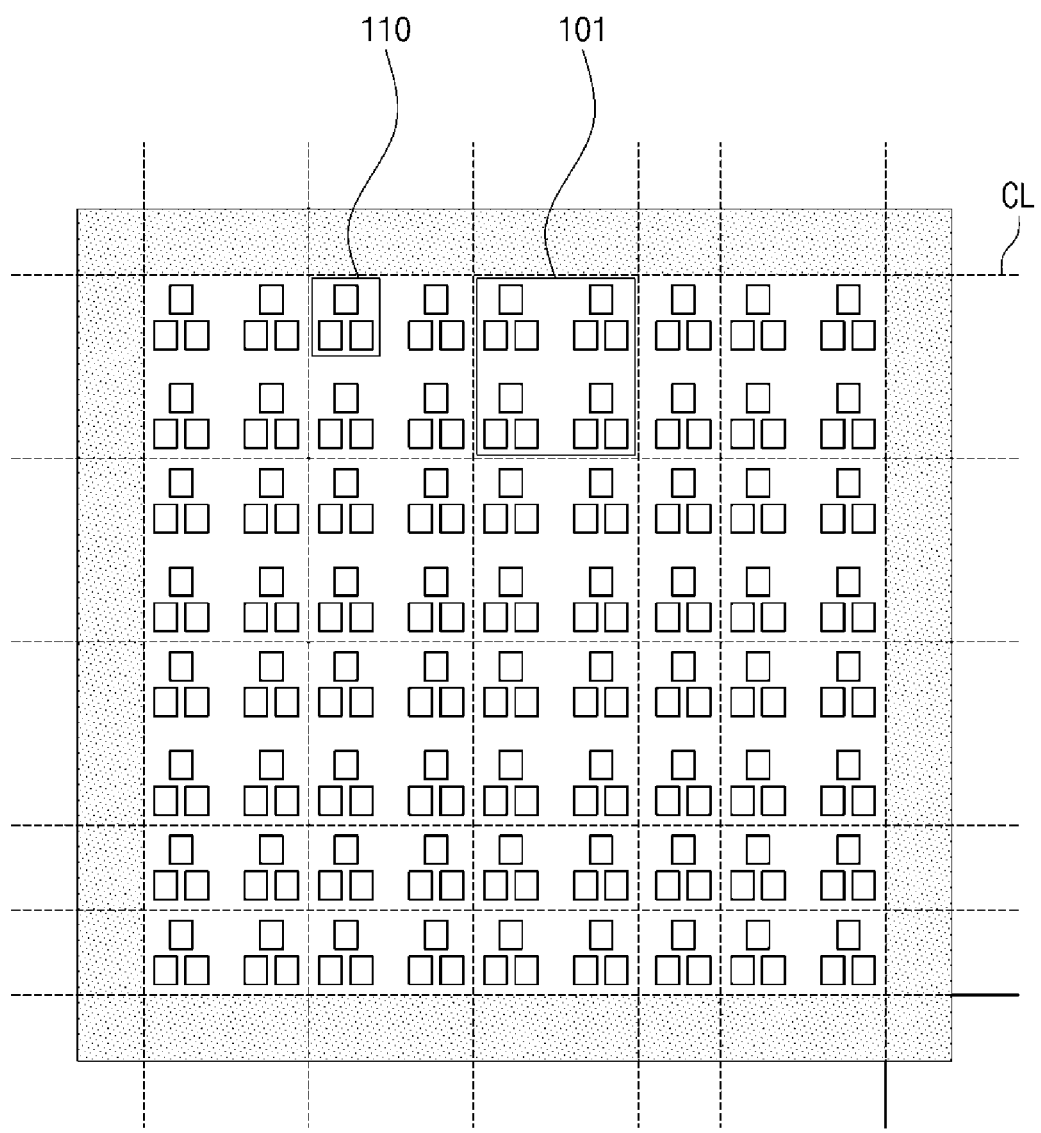
FIG. 16 is a view showing processes of forming a plurality of pixel units in a substrate of sufficient size and cutting the substrate into display units of various sizes.
Figure 17:
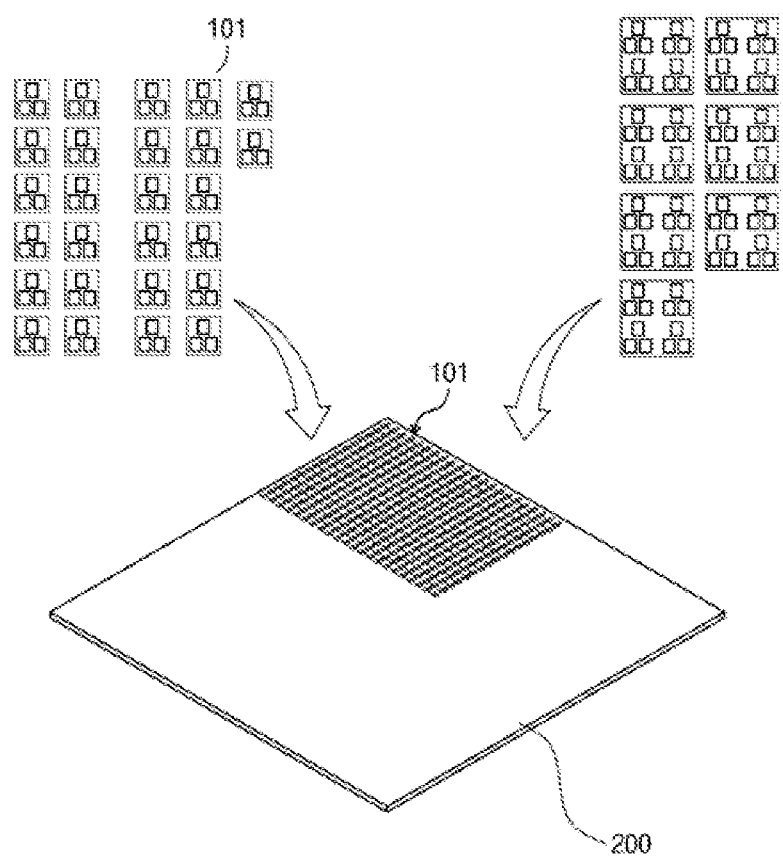
FIG. 17 is a view showing a process of assembling and mounting display units of various sizes on a base substrate such as a printed circuit board.

FIG. 16 is a view showing processes of forming a plurality of pixel units 110 using a substrate 10 of sufficient size and cutting the substrate 10 into display units 101 of various sizes, and FIG. 17 is a view showing a process of assembling and mounting the cut display units 101 of various sizes on a base substrate 10 such as a printed circuit board.

Referring to FIG. 16, the pixel units 110 may be formed on the substrate 10 according to the above-described embodiments, and the substrate 10 may be cut along a cutting line CL into the display units 101 of various sizes. The display unit 101 may have various sizes by the cutting process to include only one pixel unit 110 or to include two, four, or six pixel units 110.

Referring to FIG. 17, the display units 101 having various sizes may be assembled to each other in proper form, and thus the displaying apparatuses of various sizes may be manufactured. In this case, the term "displaying apparatus" used herein indicates an electronic apparatus that displays arbitrary visual information, such as a text, a video, a photograph, and a 2- or 3-dimensional image, and hereinafter, the displaying apparatus manufactured by the above-described method will be described.

Figure 18:
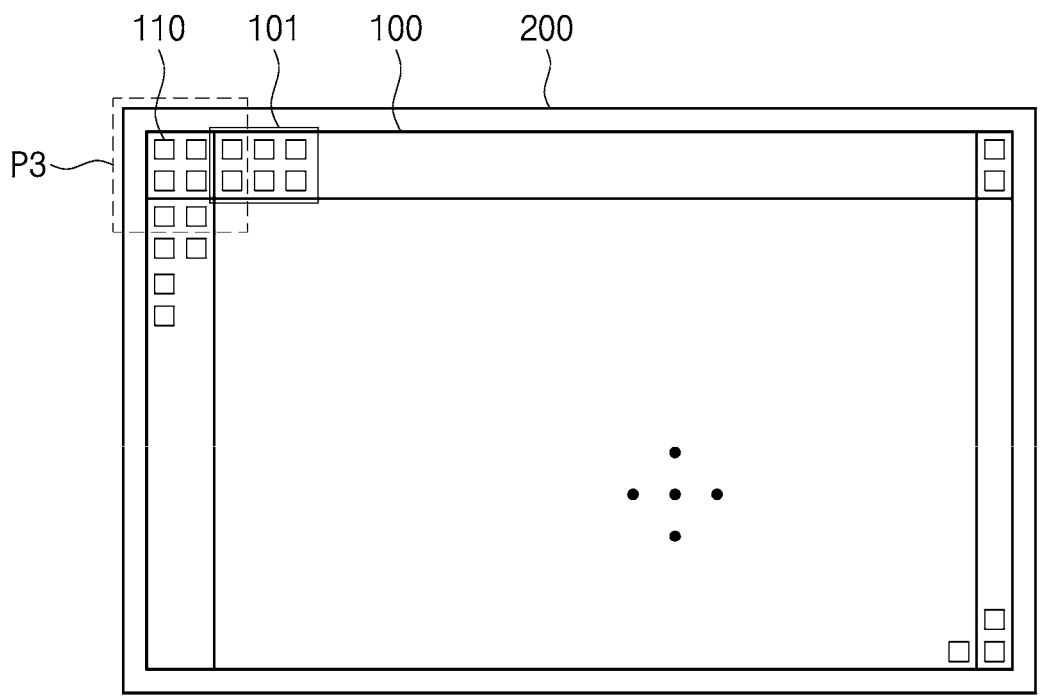
FIG. 18 is a plan view showing a displaying apparatus manufactured by the above described manufacturing method.
Figure 19:
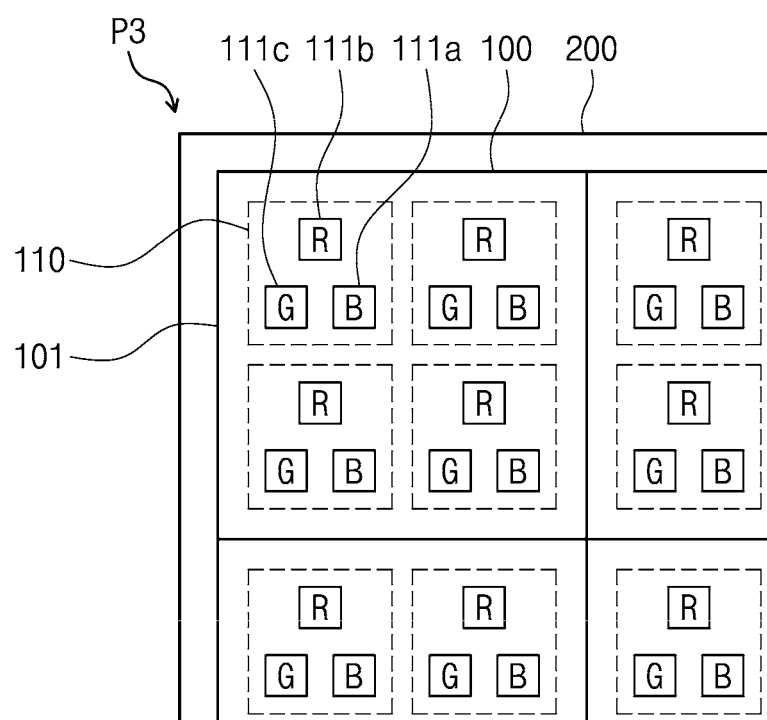
FIG. 19 is an enlarged plan view showing a portion P3 of FIG. 18.

FIG. 18 is a plan view showing a displaying apparatus manufactured by the above-described manufacturing method, and FIG. 19 is an enlarged plan view showing a portion P3 of FIG. 18.

Referring to FIGS. 18 and 19, the displaying apparatus according to the exemplary embodiment may have various shapes, such as a closed polygonal shape with straight sides like a rectangular shape, a circular or oval shape with a curved side, and a semi-circular or semi-oval shape with a straight side and a curved side. In the exemplary embodiment, the displaying apparatus having rectangular shape is shown.

The displaying apparatus may include the display units 101 assembled to include the pixel units 110. In the exemplary embodiment, each pixel unit 110 may include a green pixel, a red pixel, and a blue pixel, and the first, second, and third pixels 111a, 111b, and 111c may correspond to the green pixel, the red pixel, and the blue pixel, respectively. However, the pixel included in each pixel unit should not be limited thereto or thereby. For instance, each pixel unit may include a cyan pixel, a magenta pixel, and a yellow pixel.

The pixel units 110 and/or the pixels 111a, 111b, and 111c are arranged in a matrix form. The expression that the pixel units 110 and/or the pixels 111a, 111b, and 111c are arranged in the matrix form does not indicate only that the pixel units 110 and/or the pixels 111a, 111b, and 111c are arranged exactly in line along rows or columns, and detailed locations of the pixel units 110 and/or the pixels 111a, 111b, and 111c may be changed while being arranged along the rows or columns taken as a whole, such as a zigzag form.

Figure 20:
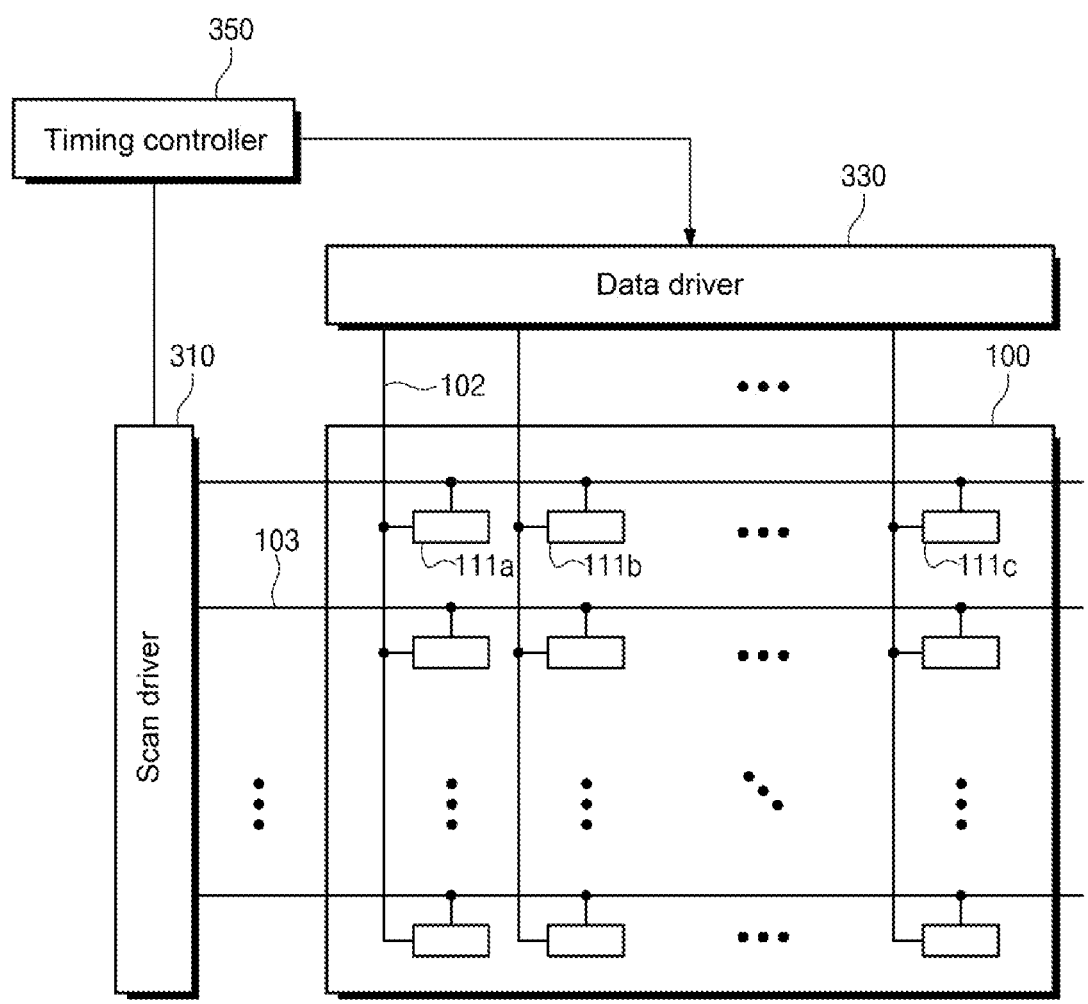
FIG. 20 is a block diagram showing a displaying apparatus according to an exemplary embodiment.

FIG. 20 is a block diagram showing a displaying apparatus according to an exemplary embodiment.

Referring to FIG. 20, the displaying apparatus according to the exemplary embodiment includes a timing controller 350, a scan driver 310, a data driver 330, a line part, and pixel units. In a case where the pixel units include a plurality of pixels, each pixel is individually connected to the scan driver 310 and the data driver 330 via the line part.

The timing controller 350 receives various control signals and image data, which are required to drive the displaying apparatus, from an external source (e.g., a system that transmits the image data). The timing controller 350 rearranges the received image data and applies the rearranged image data to the data driver 330. In addition, the timing controller 350 generates scan control signals and data control signals, which are required to drive the scan driver 310 and the data driver 330, and applies the generated scan control signals and the data control signals to the scan driver 310 and the data driver 330, respectively.

The scan driver 310 receives the scan control signals from the timing controller 350 and generates scan signals in response to the scan control signals.

The data driver 330 receives the data control signals from the timing controller 350 and generates data signals in response to the data control signals.

The line part includes a plurality of signal lines. In detail, the line part includes first lines 103 that connect the scan driver 310 and the pixels and second lines 102 that connect the data driver 330 and the pixels. In the exemplary embodiment, the first lines 103 may be scan lines, and the second lines 102 may be data lines. Accordingly, hereinafter the first lines and the second lines will be described as the scan lines and the data lines, respectively. In addition, the line part may further include lines that connect the timing controller 350 and the scan driver 310, the timing controller 350 and the data driver 330, or other components to each other to transmit signals.

The scan lines 103 transmit the scan signals generated by the scan driver 310 to the pixels. The data signals generated by the data driver 330 are applied to the data lines 102. The data signals applied to the data lines 102 are input to pixels of a horizontal pixel unit line selected by the scan signal.

The pixels 111a, 111b, and 111c are connected to the scan lines 103 and the data lines 102. The pixels 111a, 111b, and 111c selectively emit the light in response to the data signals provided from the data lines 102 when the scan signals from the scan lines 103 are applied thereto. As an example, each of the pixels 111a, 111b, and 111c emits the light at a brightness corresponding to the data signal applied thereto during each frame period. The pixels 111a, 111b, and 111c, to which the data signals corresponding to a black brightness are applied, do not emit the light during corresponding frame period.

In the exemplary embodiment, the pixels 111a, 111b, and 111c may be driven in passive matrix or active matrix manners. When the displaying apparatus is driven in the active matrix manner, the displaying apparatus may be driven by being further supplied with first and second power sources in addition to the scan signals and the data signals.

Figure 21A:
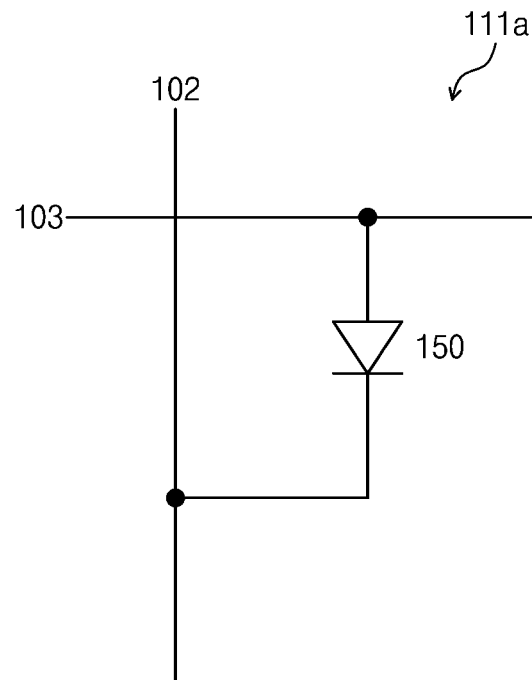
FIG. 21A is a circuit diagram showing one pixel among pixels for a passive matrix type displaying apparatus.

FIG. 21A is a circuit diagram showing one pixel among pixels for a passive matrix type displaying apparatus. In this case, the pixel may be one of the pixels, e.g., the red pixel, the green pixel, and the blue pixel, and the first pixel 111a is shown in the present exemplary embodiment.

Referring to FIG. 21A, the first pixel 111a includes the light emitting device 150 connected between the scan line 103 and the data line 102. The light emitting device 150 may be a light emitting diode including the first electrode and the second electrode. The first and second electrodes are respectively connected to the common pad and the data pad of the light emitting apparatus. The common pad and the data pad may be respectively connected to the scan line 103 and the data line 102, or vice versa.

When a voltage equal to or greater than a threshold voltage is applied to between the first electrode and the second electrode, the light emitting device 150 emits the light at a brightness corresponding to a level of the voltage applied thereto. That is, the light emission of the first pixel 111a may be controlled by controlling a voltage of the scan signal applied to the scan line 103 and/or a voltage of the data signal applied to the data line 102.

In the exemplary embodiment, one light emitting device 150 connected between the scan line 103 and the data line 102 is shown, but the number of the light emitting devices 150 connected between the scan line 103 and the data line 102 should not be limited to one. That is, plural light emitting devices 150 may be connected between the scan line 103 and the data line 102, and in this case, the light emitting devices 150 may be connected to each other in parallel or series.

Figure 21B:
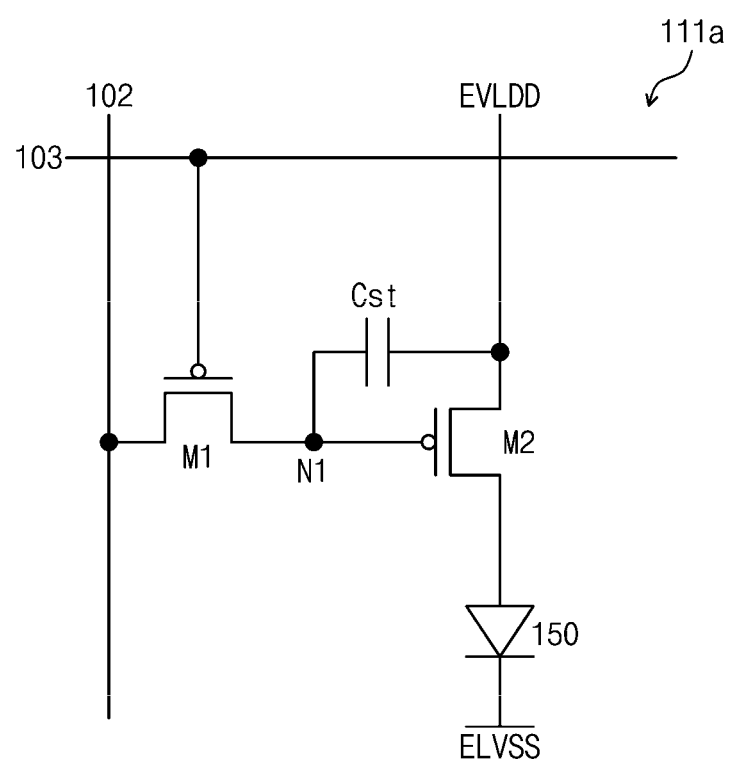
FIG. 21B is a circuit diagram showing a first pixel among pixels for an active matrix type displaying apparatus.

FIG. 21B is a circuit diagram showing a first pixel 111a among pixels for an active matrix type displaying apparatus. When the displaying apparatus is the active matrix type displaying apparatus, the first pixel 111a may be driven by being further supplied with the first and second power sources ELVDD and ELVSS in addition to the scan signals and the data signals.

Referring to FIG. 21B. the first pixel 111a includes one or more light emitting devices 150 and a transistor part TFT connected to the light emitting device 150.

A first electrode of the light emitting device 150 is connected to the first pixel power source ELVDD via the transistor part TFT, and a second electrode of the light emitting device 150 is connected to the second pixel power source ELVSS. The first pixel power source ELVDD and the second pixel power source ELVSS may have different electric potentials from each other. As an example, the second pixel power source ELVSS may have the electric potential lower than the electric potential of the first pixel power source ELVDD by the threshold voltage of the light emitting device 150 or more. Each of the light emitting devices 150 emits the light at a brightness corresponding to a driving current controlled by the transistor part TFT.

According to the exemplary embodiment, the transistor part TFT includes first and second transistors M1 and M2 and a storage capacitor Cst. However, a configuration of the transistor part TFT should not be limited to the embodiment shown in FIG. 17B.

The first transistor M1 (switching transistor) includes a source electrode connected to the data line 102, a drain electrode connected to a first node N1, and a gate electrode connected to the scan line 103. The first transistor M1 is turned on upon receiving the scan signal having the voltage sufficient to turn on the first transistor M1 through the scan line 103 to electrically connect the data line 102 and the first node N1. In this case, the data signal of the corresponding frame is applied to the data line 102, and thus the data signal is applied to the first node N1. The storage capacitor Cst is charged with the data signal applied to the first node N1.

The second transistor M2 (driving transistor) includes a source electrode connected to the first pixel power source ELVDD, a drain electrode connected to the first electrode of the light emitting device, and a gate electrode connected to the first node N1. The second transistor M2 controls an amount of the driving current supplied to the light emitting device 150 in response to the voltage of the first node N1.

One electrode of the storage capacitor Cst is connected to the first pixel power source ELVDD, and the other electrode of the storage capacitor Cst is connected to the first node N1. The storage capacitor Cst is charged with the voltage corresponding to the data signal applied to the first node N1 and maintains the charged voltage until a data signal of a next frame is provided.

For the convenience of explanation, FIG. 21B shows the transistor part TFT including two transistors. However, the number of the transistors included in the transistor part TFT should not be limited to two, and the configuration of the transistor part TFT may be changed in various ways. For example, the transistor part TFT may include more transistors and more capacitors. In addition, in the present exemplary embodiment, configurations of the first and second transistors, the storage capacitor, and the lines are not shown in detail, however the first and second transistors, the storage capacitor, and the lines may be changed in various ways within the scope of implementing the circuit according to the exemplary embodiment.

Figure 22:
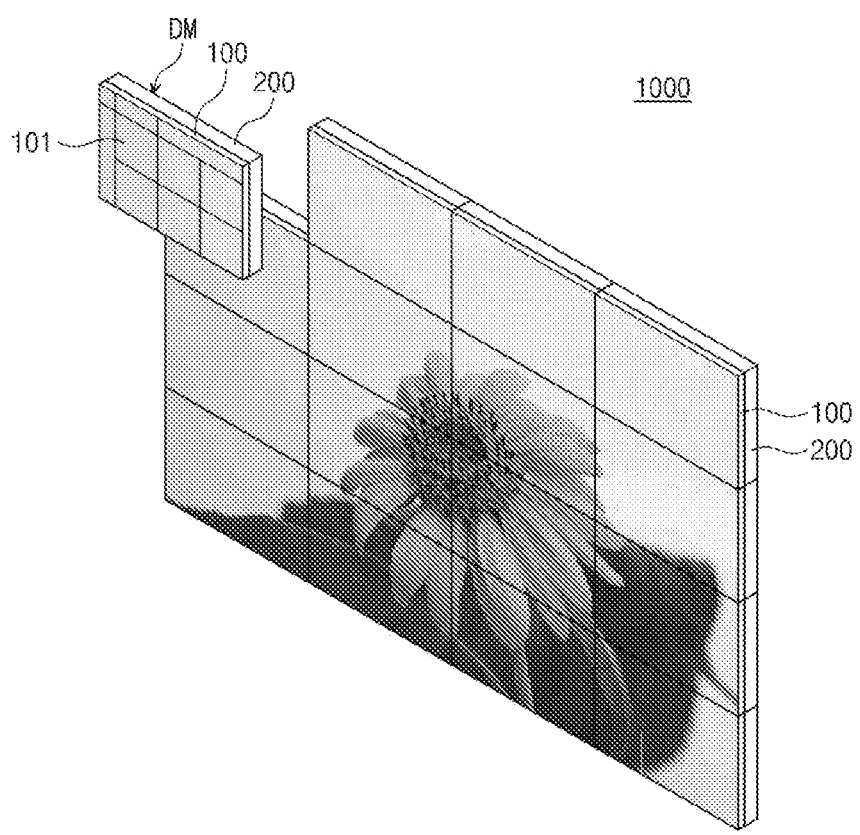
FIG. 22 is a perspective view showing a large-sized multi-module displaying apparatus e according to an exemplary embodiment.

According to the exemplary embodiment, the large-sized displaying apparatus may be implemented by the displaying apparatus according to the above-described embodiments alone, however, when regarding the displaying apparatus according to the above-described embodiments as one display module, it is possible to implement a displaying apparatus with a larger area than that of the conventional displaying apparatus by assembling a plurality of display modules to each other. FIG. 22 is a perspective view showing a large-sized multi-module displaying apparatus 1000 according to an exemplary embodiment.

Referring to FIG. 22, the multi-module displaying apparatus 1000 may include a plurality of display modules DM, and FIG. 18 shows 4 by 4 (4×4) display modules DM that form one multi-module displaying apparatus. In the present exemplary embodiment, the display modules DM may have the structure of at least one of the above-described embodiments. For instance, each display module DM may include a display part 100 and a base substrate 200 and may include a plurality of the display units 101 having different areas from each other as the display module DM shown in a first row and a first column of FIG. 18.

In the present exemplary embodiment, each of the display modules DM or at least some display modules may be independently driven. As another way, at least some display modules DM may be dependently driven in conjunction with other display modules DM. In the case where the display modules DM are driven in conjunction with each other, one image may be displayed as shown in FIG. 18.

In the present exemplary embodiment, the display modules DM have the same size as each other, however the present disclosure should not be limited thereto or thereby. That is, at least one display module DM may have a size different from that of the other display modules DM. In addition, at least one display module DM may have a different number of pixels from that of the other display modules DM, and thus they may have different resolutions from each other. Further, in a case where the resolution of all areas does not need to be the same, the multi-module displaying apparatus may be manufactured by arranging the display modules DM having different resolutions from each other.

Figure 23:
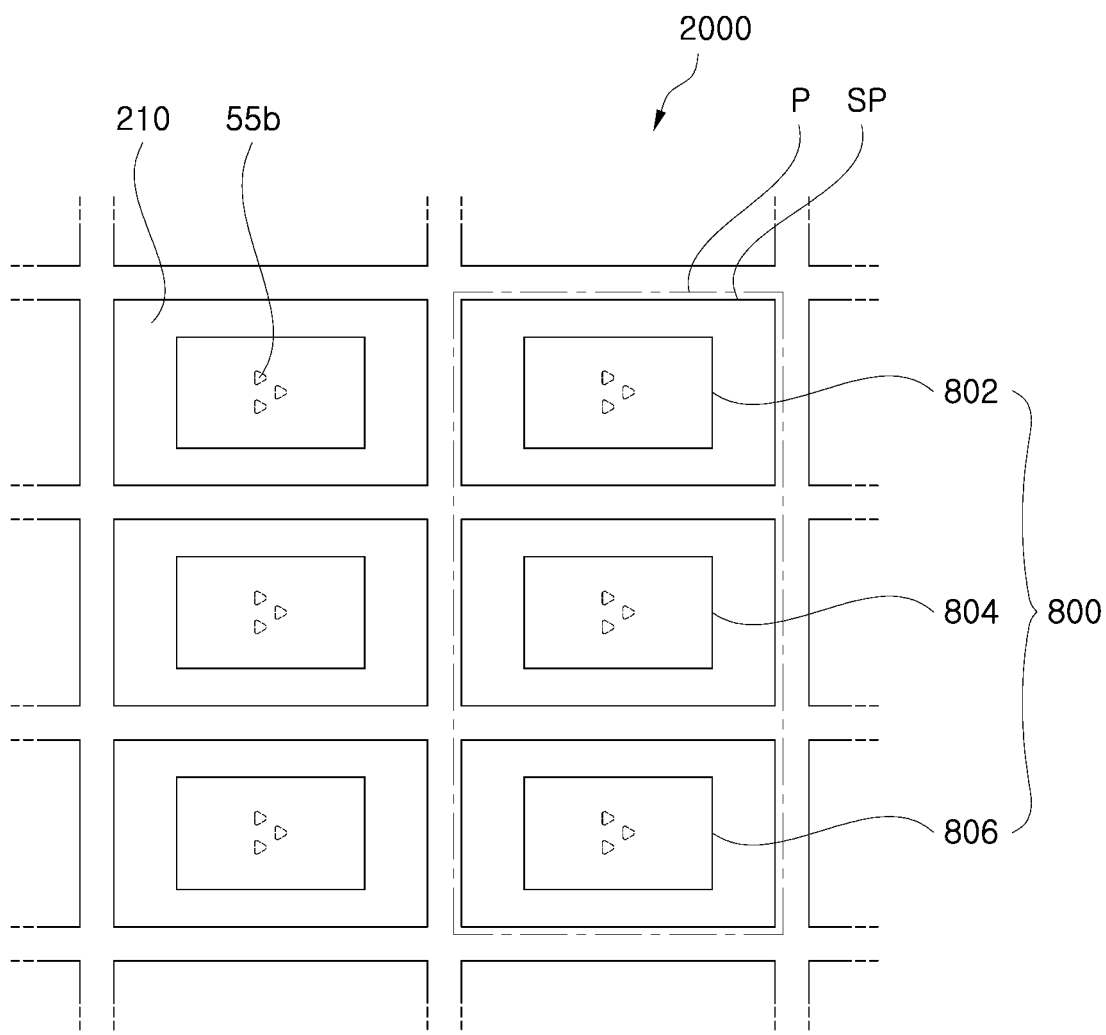
FIG. 23 is a schematic plan view illustrating a displaying apparatus according to another exemplary embodiment.
Figure 24A:
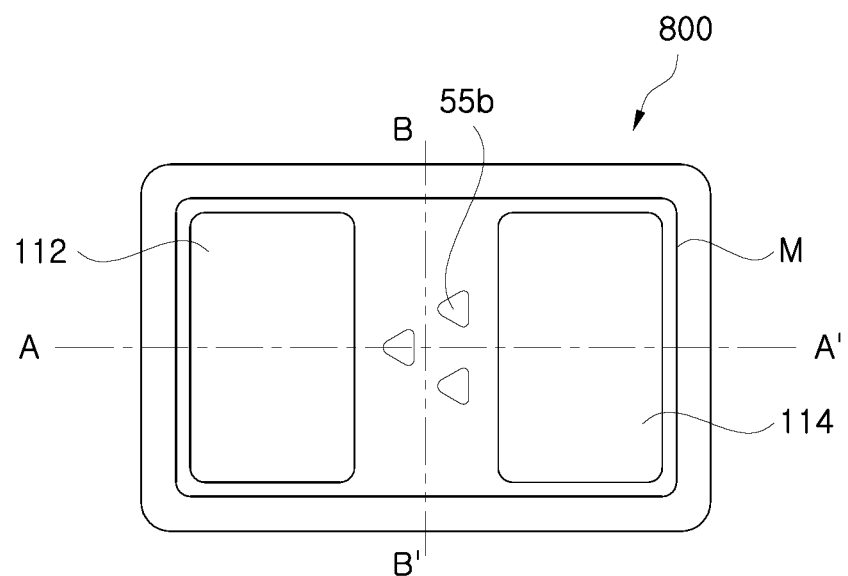
FIGS. 24A and 24B are a schematic plan view and a cross-sectional view illustrating a light emitting device of the displaying apparatus according to the other exemplary embodiment, respectively.
Figure 24B:
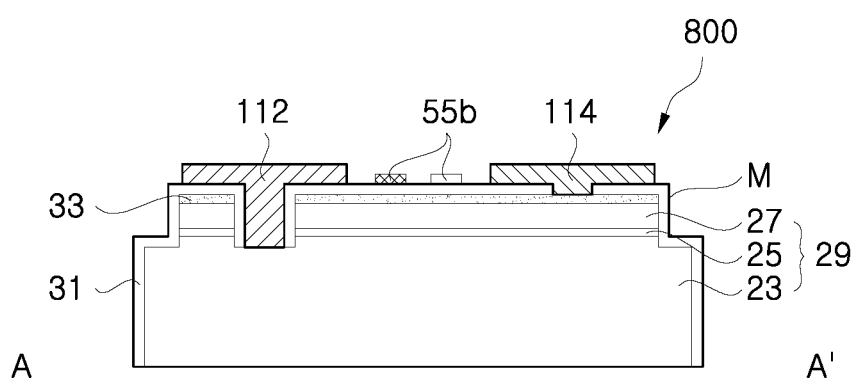

FIG. 23 is a schematic plan view illustrating a displaying apparatus according to another exemplary embodiment and FIGS. 24A and 24B are a schematic plan view and a cross-sectional view illustrating a light emitting device of the displaying apparatus according to the other exemplary embodiment, respectively.

Referring to FIG. 23, a displaying apparatus 2000 comprises a panel substrate 210 and a plurality of light emitting devices 800.

The panel substrate 210 may comprise a circuit for a passive matrix drive or an active matrix drive. In one exemplary embodiment, the panel substrate 210 may comprise wires and resistors therein, and in another embodiment, the panel substrate 210 may comprise wires, transistors, and capacitors. The panel substrate 210 may also have pads on its top surface allowing electrical access to the disposed circuit. Although the present disclosure describes that the panel substrate 210 comprises the circuit, the panel substrate 210 may be a transparent substrate capable of transmitting light.

The plurality of light emitting devices 800 are arranged on the panel substrate 210. Each light emitting device 800 may constitute one subpixel SP. The light emitting device 800 has first and second electrode pads 112 and 114, and the first and second electrode pads 112 and 114 may be electrically connected to the panel substrate 210.

In the present disclosure, the light emitting devices 800 may comprise a blue light emitting device 802, a green light emitting device 804, and a red light emitting device 806. The blue light emitting device 802 may be an inorganic light emitting diode emitting blue light and may comprise an AlGaInN-based well layer. The green light emitting device 804 may be an inorganic light emitting diode emitting green light, and may comprise an AlGaInP-based well layer or an AlInGaN-based well layer. The red light emitting device 806 may be an inorganic light emitting diode emitting red light, and may comprise an AlGaInP-based well layer. Furthermore, the light emitting devices 800 are not limited to the light emitting devices 802, 804, and 806 emitting light of a single color, and one light emitting device 800 may have a plurality of well layers having a stacked structure so as to emit light of various colors such as blue, green, and red.

In the present disclosure, the blue light emitting device 802, the green light emitting device 804, and the red light emitting device 806 are disposed in different subpixels SPs, respectively and one or more light emitting devices may be disposed in one subpixel SP. Three subpixels SPs in which the blue light emitting device 802, the green light emitting device 804 and the red light emitting device 806 are disposed, respectively, may form one pixel P.

A specific example of the light emitting device 800 will be described with reference to FIGS. 24A to 24B. FIG. 24A is a schematic plan view illustrating a light emitting device 800 according to an exemplary embodiment, and FIG. 24B is a sectional view taken along the line AA' in FIG. 24A. For convenience of explanation, first and second electrode pads 112 and 114 are illustrated as being disposed over, but the light emitting device 800 may be flip-bonded on the panel substrate 210 of FIG. 23, and in this case the first and second electrode pads 112 and 114 may be disposed under.

Referring to FIGS. 24A and 24B, the light emitting device 800 may comprise a light emitting structure 29, an ohmic-layer 33, an insulation layer 31, the first electrode pad 112, and the second electrode pad 114, and a connection tip 55b may be disposed on the light emitting device 800.

The light emitting structure 29 comprises a first conductivity type semiconductor layer 23, an active layer 25, and a second conductivity type semiconductor layer 27. The active layer 25 may be disposed on the first conductivity type semiconductor layer 23, and the second conductivity type semiconductor layer 27 may be disposed on the active layer 25.

The active layer 25 may have a multi-quantum well structure in particular. A wavelength of light emitted by the light emitting device 800 may be varied according to a composition of the active layer 25, and thus it may become a blue light emitting device 802, a green light emitting device 804, or a red light emitting device 806.

In addition, the first conductivity type semiconductor layer 23 may be an n-type semiconductor layer, and the second conductivity type semiconductor layer 27 may be a p-type semiconductor layer. In the present disclosure, a mesa M may be formed over the first conductivity type semiconductor layer 23. The mesa M may be formed by etching the active layer 25 and the second conductivity type semiconductor layer 27, and may comprise a portion of the first conductivity type semiconductor layer 23.

The ohmic-layer 33 may be disposed on the second conductivity type semiconductor layer 27. The ohmic-layer 33 is in ohmic contact with the second conductivity type semiconductor layer 27. The ohmic-layer 33 may comprise a reflection layer, and the reflection layer reflects light generated in the active layer 25 to prevent the light from being absorbed by the first and second electrode pads 112 and 114 or a substrate and lost. In one example, the ohmic-layer 33 may comprise an ohmic-contact layer and a reflection layer. However, the present disclosure is not limited thereto, but the ohmic-layer 33 may be formed of a transparent metal layer or a transparent conductive oxide layer.

The insulation layer 31 may cover the ohmic-layer 33 and the mesa M, and may also cover a portion of an upper surface and sides of the first conductivity type semiconductor layer 23. As it will be described later, the insulation layer 31 may cover sides of a via hole formed for allowing the first electrode pad 112 to be electrically connected to the first conductivity type semiconductor layer 23. The insulation layer 31 may be formed of a single layer or multiple layers of a silicon oxide layer or a silicon nitride layer. Furthermore, the insulation layer 31 may be formed of a distributed Bragg reflector.

The first electrode pad 112 is electrically connected to the first conductivity type semiconductor layer 23. As illustrated in FIG. 24B, the first electrode pad 112 is disposed over the insulation layer 31, and electrically connected to the second conductivity type semiconductor layer 27 through the via hole passing through the second conductivity type semiconductor layer 27 and the active layer 25. As illustrated, the first electrode pad 112 may be directly connected to the first conductivity type semiconductor layer 23. The insulation layer 31 covers the sides of the via hole and prevents the first electrode pad 112 from being short-circuited to the second conductivity type semiconductor layer 27 or the active layer 25.

The second electrode pad 114 is electrically connected to the second conductivity type semiconductor layer 27. The second electrode pad 114 may be disposed over the insulation layer 31, and electrically connected to the ohmic-layer 33 through an opening formed in the insulation layer 31. In the present disclosure, the ohmic-layer 33 is formed of a conductive material, and electrically connects the second electrode pad 114 to the second conductivity type semiconductor layer 27.

One or more connection tips 55b may be disposed over the insulation layer 31, and may be disposed between the first electrode pad 112 and the second electrode pad 114. The connection tip 55b may be formed in a process of transferring the light emitting device 800 to the panel substrate 210. An upper surface of the connection tip 55b may not be a flat surface but a generally irregular inclined surface, and may have an uneven structure. In addition, a plurality of connection tips 55b disposed on one light emitting device 800 may have different lengths one another. In the present disclosure, the connection tip 55b may comprise an organic material such as poly dimethylpolysiloxane (PDMS), epoxy, acryl, color polyimide, or others. However, the present disclosure is not limited thereto, but the connection tip 55b may comprise a material other than an organic material.

In the present disclosure, the plurality of connection tips 55b may be disposed on the light emitting device 800, and the plurality of connection tips 55b may be arranged asymmetrically to a particular direction. For example, as shown in FIG. 24A, three connection tips 55b may be disposed on the light emitting device 800, and the three connection tips 55b may be arranged asymmetrically to the line BB'. One connection tip 55b is disposed on a left side of the line BB', and the other two connection tips 55b are disposed on a right side of the line BB'.

Figure 24C:
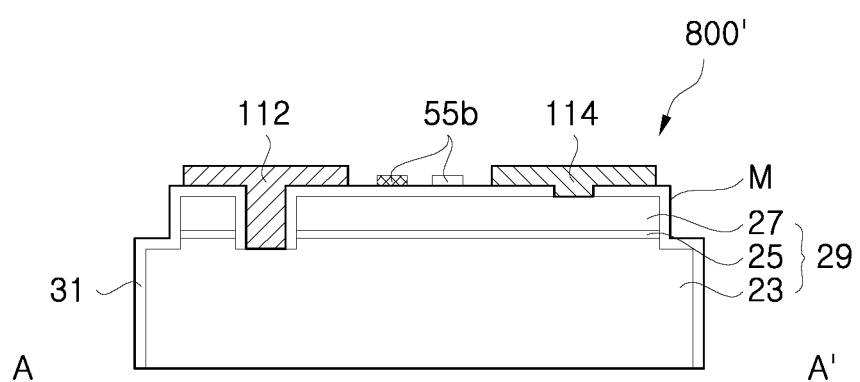
FIG. 24C is a schematic cross-sectional view illustrating a modified example of the light emitting device.

FIG. 24C is a schematic cross-sectional view illustrating a modified example of the light emitting device.

Referring to FIG. 24C, a light emitting device 800' according to the present exemplary embodiment is generally similar to the light emitting device 800 described above, but there is a difference that the ohmic-layer 33 is omitted. In describing the present disclosure, the same contents as those described in the other exemplary embodiment will be omitted in order to avoid redundancy.

As shown, since the ohmic-layer 33 is omitted, a second electrode pad 114 may be electrically connected directly to a second conductivity type semiconductor layer 27. Since the light emitting device 800' has a relatively small size, current can be evenly spread over a wide area of the light emitting device 800' even if the ohmic-layer 33 is omitted.

In the meantime, although the connection tip 55b in the above exemplary embodiment is illustrated and described as formed on the same side as the surface where the first and second electrode pads 112 and 114 are disposed on, the connection tip 55b may be formed on an opposite side of the light emitting device 800 to the first and second electrode pads 112 and 114. Formation of the connection tip 55b under the light emitting device 800 is related to a method of transferring the light emitting devices 800, and can be understood through a later description of a method of transferring the light emitting devices 800.

FIGS. 25A to 25K are schematic cross-sectional views illustrating a method of manufacturing a displaying apparatus according to the first exemplary embodiment.

Figure 25A:
FIGS. 25A, 25B, 25C, 25D, 25E, 25F, 25G, 25H, 25I, 25J, and 25K are schematic cross-sectional views illustrating a method of manufacturing the displaying apparatus according to the other exemplary embodiment.

Referring to FIG. 25A, a light emitting device 800 is formed on a substrate 51. The substrate 51 may be a substrate for growing the light emitting device 800. The substrate 51, for example, may be a sapphire substrate or a GaN substrate for growing an AlInGaN-based semiconductor layer, or a GaAs substrate for growing an AlInGaP-based semiconductor layers. For example, if the light emitting device 800 is a blue light emitting device 800 or a green light emitting device 800, the sapphire substrate or the GaN substrate may be used, and if the light emitting device 800 is a red light emitting device 800, the GaAs substrate may be used.

Figure 25B:
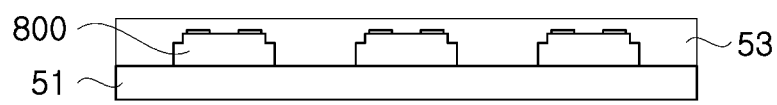

Referring to FIG. 25B, a first mask layer 53 is formed on the substrate 51 so as to cover a plurality of light emitting devices 800. The first mask layer 53 may be formed to completely cover the plurality of light emitting devices 800, and may formed over the light emitting devices 800 to have a predetermined thickness.

Figure 25C:
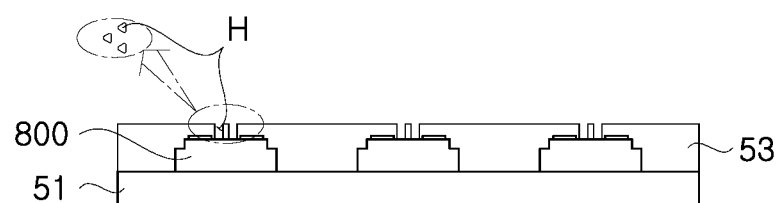

Referring to FIG. 25C, a plurality of holes Hs are formed in the first mask layer 53. Each of the plurality of holes Hs may be formed over the plurality of light emitting devices 800, and at least one hole H may be formed on each of the light emitting devices 800. In the present disclosure, three holes Hs are formed on each light emitting device 800, and the three holes Hs are arranged asymmetrically to at least one direction where the light emitting devices 800 are arranged. Here, the three holes Hs in the drawing are arranged asymmetrically to a direction which is perpendicular to the direction where the light emitting devices 800 are arranged.

The first mask layer 53 may be formed of a photosensitive material, and the plurality of holes Hs may be formed through a photolithography process. The plurality of holes Hs may be formed through an exposure and development processes, but the present disclosure is not necessarily limited thereto, but an etching process may be used. The plurality of holes Hs may be formed in a triangular shape as shown in the drawing. However, the number of holes Hs is not necessarily limited to three.

Figure 25D:
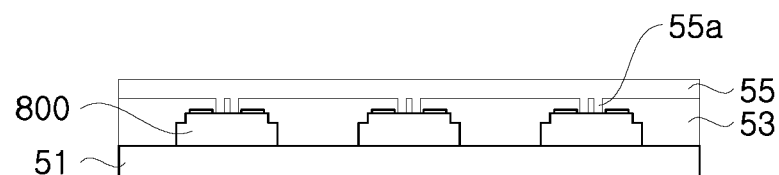

Referring to FIG. 25D, a connection layer 55 is formed on the first mask layer 53. The connection layer 55 is formed on the first mask layer 53 while filling the plurality of holes Hs formed in the first mask layer 53. Since at least one hole H is formed over each light emitting device 800, the connection layer 55 may be connected to the light emitting device 800 through at least one hole H formed over the light emitting device 800. A connection portion 55a connected to the light emitting device 800 by filling the hole H is formed together while the connection layer 55 is formed.

The connection layer 55 may be formed of an organic material such as poly dimethylpolysiloxane (PDMS), epoxy, acryl, color polyimide, or the like, but it is not limited thereto. Here, the connection layer 55 may have a light transmittance of 90% or more, and a refractive index may be 1.4 to 1.7.

Figure 25E:
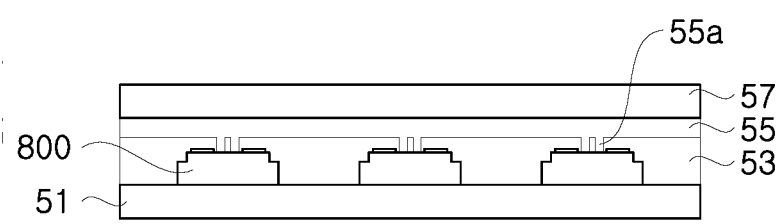

Referring to FIG. 25E, a first temporary substrate 57 is coupled to an upper surface of the connection layer 55. The first temporary substrate 57 may be a polymer substrate such as PET, PEN, PI sheet, or others, or may be a substrate such as glass, PC, PMMA, or others. When the first temporary substrate 57 is coupled to the upper surface of the connection layer 55, bubbles generated in the connection layer 55 in a vacuum state may be removed, and a hardening process of the connection layer 55 may be performed at a temperature lower than a melting point of the first mask layer 53. In this process, the first temporary substrate 57 may be coupled to the connection layer 55.

Figure 25F:
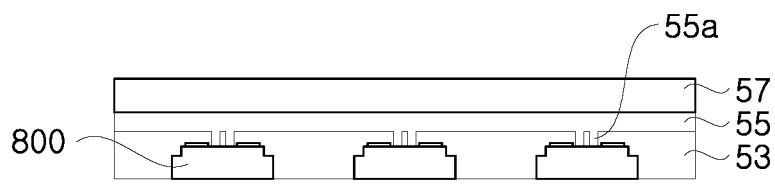

When the first temporary substrate 57 is coupled to the connection layer 55, the substrate 51 is removed from the light emitting devices 800 as in FIG. 25F. The substrate 51 may be removed by a laser lift-off process or a wet etching process. For example, if the substrate 51 is a sapphire substrate, the substrate 51 may be removed by the laser lift-off process or a chemical lift-off process, and if the substrate 51 is a GaAs substrate, the GaAs substrate may be removed by the wet etching process.

Figure 25G:
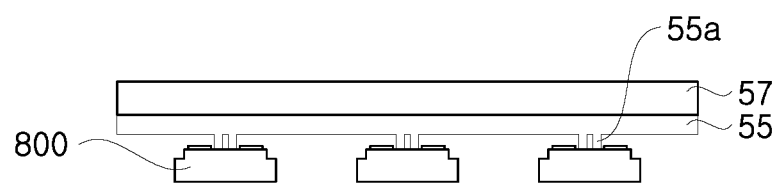

Referring to FIG. 25G, the first mask layer 53 is removed from the light emitting devices 800 with the substrate 51 removed. The first mask layer 53 may be removed by using, for example, acetone, a dedicated striper, etching, or others. As the first mask layer 53 is removed, each of the light emitting devices 800 is connected to the connection layer 55 through the at least one connection portion 55a and maintained as shown in the drawing.

Figure 25H:
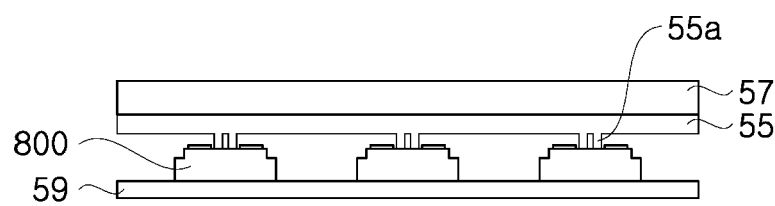

Referring to FIG. 25H, after the first mask layer 53 is removed from the light emitting devices 800, a second temporary substrate 59 is coupled to lower surfaces of the light emitting devices 800. The second temporary substrate 59 may be a rubber or UV sheet, or may be a polymer substrate such as PET, PEN, PI sheet, or others, or a substrate such as glass, PC, PMMA, or others.

Figure 25I:
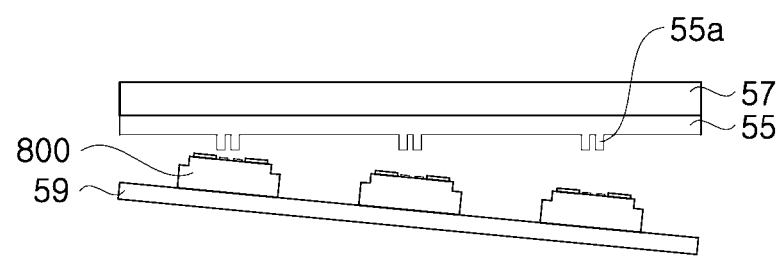

When coupling the second temporary substrate 59 to the light emitting devices 800 is completed, the light emitting devices 800 are removed from the connection layer 55 by using the second temporary substrate 59 as shown in FIG. 25I. By applying an external force in an opposite direction to the first temporary substrate 57, i.e., downward, to the second temporary substrate 59 coupled to the light emitting devices 800, the at least one connection portion 55a connected to the light emitting devices 800 is cut, and the light emitting devices 800 are separated from the connection layer 55.

The external force applied to the second temporary substrate 59 as shown in the drawing, may be applied in a direction perpendicular to the connection layer 55 at one side of the second temporary substrate 59. Accordingly, each of the light emitting devices 800 may be separated from the connection layer 55 in such a manner that the at least one connection portion 55a connected to each light emitting device 800 is sequentially cut from one side of the second temporary substrate 59.

Figure 25J:
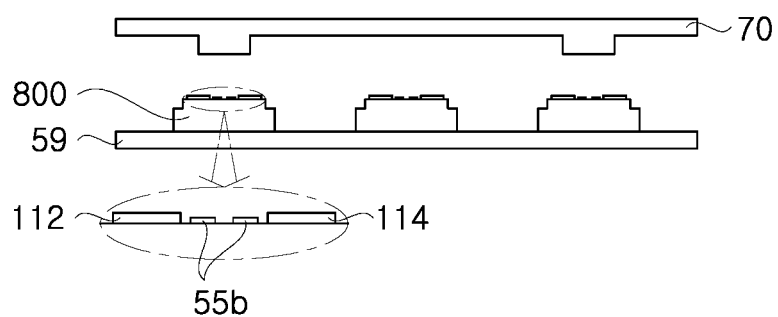

Referring to FIG. 25J, the light emitting devices 800 separated from the connection layer 55 are disposed on the second temporary substrate 59 with a predetermined interval. In the meantime, a connection tip 55b may be formed on each of the light emitting devices 800 as a residue while the connection portion 55a is cut. Accordingly, the connection tip 55b is formed of the same material as the connection layer 55, and formed while the connection portion 55a is cut by an external force, so that thicknesses of the connection tips 55b may be irregular and different from one another.

Figure 25K:
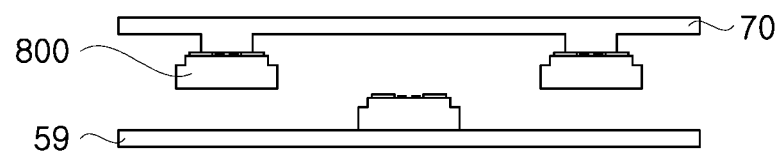

Referring to FIGS. 25J and 25K, a portion of the light emitting devices 800 disposed on the second temporary substrate 59 is transferred to another substrate by using a pickup 70. The pickup 70 may comprise an elastomeric stamp, for example.

The pickup 70 picks up and transfers a portion of the plurality of light emitting devices 800, and selectively picks up the light emitting devices 800 arranged in accordance with an interval of the panel substrate 210. Accordingly, as shown in the drawing, the pickup 70 doesn't pick up adjacent light emitting devices 800 together, but picks up the light emitting devices 800 at a certain interval at a time. The interval of the light emitting devices 800 to be picked up may vary depending on an interval of pixels in the panel substrate 210 onto which the light emitting devices 800 is transferred.

The pickup 70 picks up the light emitting devices 800 disposed with an interval matching an interval of the pixels Ps shown in FIG. 23, and one of the blue light emitting device 802, the green light emitting device 804, and the red light emitting device 806 may be picked up to be arranged in one pixel P.

In the present disclosure, the light emitting devices 800 may be picked up with the first and second electrode pads 112 and 114 disposed thereon. Accordingly, an additional temporary substrate may be used in a process of mounting the light emitting devices 800 on the panel substrate 210 by using the pickup 70. That is, the light emitting devices 800 picked up through the pickup 70 may be first arranged on the additional temporary substrate at the interval of the pixels Ps. The blue light emitting device 802, the green light emitting device 804, and the red light emitting device 806 may be all arranged on the additional temporary substrate at the interval of the pixels Ps. The blue light emitting devices 802, the green light emitting devices 804, and the red light emitting devices 806 disposed on the additional temporary substrate may be transferred to the panel substrate 210 at once. The light emitting devices 800 may be transferred for the first and second electrode pads 112 and 114 to be bonded to the panel substrate 210.

FIGS. 26A to 26L are schematic cross-sectional views illustrating a method of manufacturing a displaying apparatus according to a second exemplary embodiment.

Figure 26A:
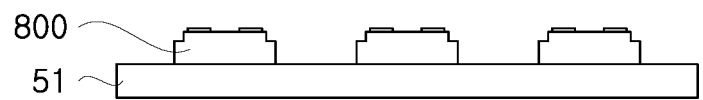
FIGS. 26A, 26B, 26C, 26D, 26E, 26F, 26G, 26H, 26I, 26J, 26K, and 26L are schematic cross-sectional views illustrating a method of manufacturing a displaying apparatus according to another exemplary embodiment.

Referring to FIG. 26A, light emitting devices 800 are formed on a substrate 51. The substrate 51 may be a substrate for growing semiconductor layers of the light emitting devices 800. If the light emitting device 800 is a blue light emitting device 802 or a green light emitting device 804, a sapphire substrate or a GaN substrate may be used, and if the light emitting device 800 is a red light emitting device 806, a GaAs substrate may be used.

Figure 26B:
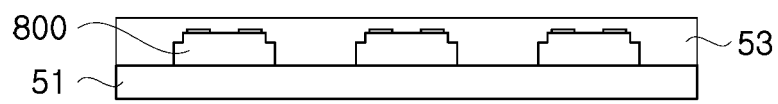

Referring to FIG. 26B, a first mask layer 53 is formed on the substrate 51 to cover a plurality of light emitting devices 800. The first mask layer 53 may be formed to cover all of the plurality of light emitting devices 800, and may be formed over the light emitting devices 800 to have a predetermined thickness.

Figure 26C:
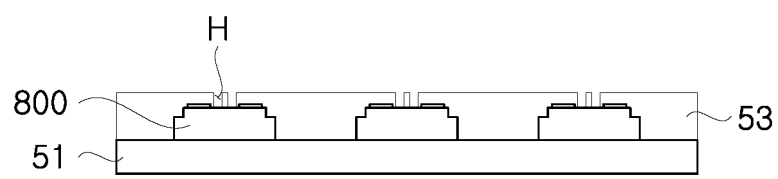

Subsequently, referring to FIG. 26C, a plurality of holes Hs are formed in the first mask layer 53. At least one hole H may be formed on each of the light emitting devices 800. In the present disclosure, three holes Hs are formed on each light emitting device 800, and the three holes Hs are arranged asymmetrically to at least one direction where the light emitting devices 800 are arranged. Here, the three holes Hs in the drawing are arranged asymmetrically to a direction which is perpendicular to the direction where the light emitting devices 800 are arranged.

The first mask layer 53 may be formed of a photosensitive material, and the plurality of holes Hs may be formed through a photolithography process. For example, the holes Hs may be formed through an exposure and development processes, but it is not limited thereto, but an etching process may be used. The plurality of holes Hs may be formed in a triangular shape as shown in the drawing.

Figure 26D:
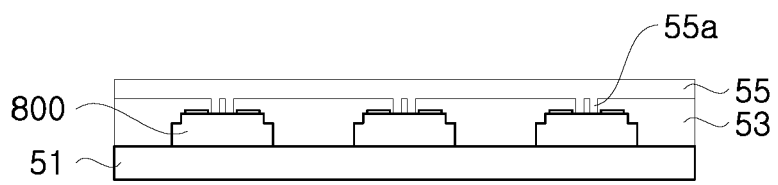

Referring to FIG. 26D, a connection layer 55 is formed on the first mask layer 53. The connection layer 55 is formed on the first mask layer 53 while filling the plurality of holes Hs formed in the first mask layer 53. Since each of the plurality of holes Hs is formed over the light emitting device 800, the connection layer 55 may be connected to the light emitting devices 800 through at least one hole H formed over the light emitting device 800. A portion of the connection layer 55 may form a connection portion 55a by filling the at least one hole H formed over the light emitting device 800.

The connection layer 55 may be formed of an organic material such as poly dimethylpolysiloxane (PDMS), epoxy, acryl, color polyimide, or the like, but it is not limited thereto. Here, the coupling layer 55 may have a light transmittance of 90% or more, and a refractive index may be 1.4 to 1.7.

Figure 26E:
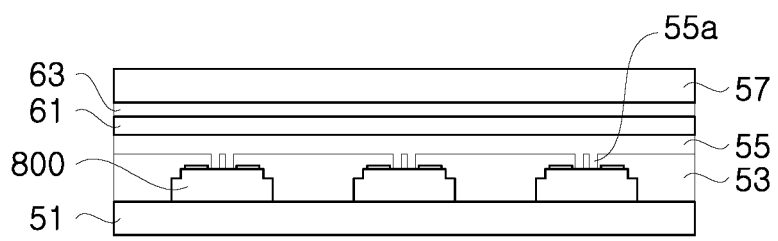

Referring to FIG. 26E, a first temporary substrate 57 is coupled to an upper surface of the connection layer 55. The first temporary substrate 57 may be a polymer substrate such as PET, PEN, PI sheet, or others, or may be a substrate such as glass, PC, PMMA, or others. A film layer 61 and a buffer layer 63 may be disposed between the first temporary substrate 57 and the connection layer 55, respectively. For example, the film layer 61 may be disposed over the connection layer 55, the buffer layer 63 may be disposed over the film layer 61, and the first temporary substrate 57 may be disposed over the buffer layer 63. The buffer layer 63 may be formed of a material melted by heat or UV irradiation.

When the first temporary substrate 57 is coupled to the upper surface of the connection layer 55, bubbles generated in the connection layer 55 in a vacuum state may be removed, and a hardening process of the connection layer 55 may be performed at a temperature lower than a melting point of the first mask layer 53. In this process, the first temporary substrate 57 may be coupled to the connection layer 55.

Figure 26F:
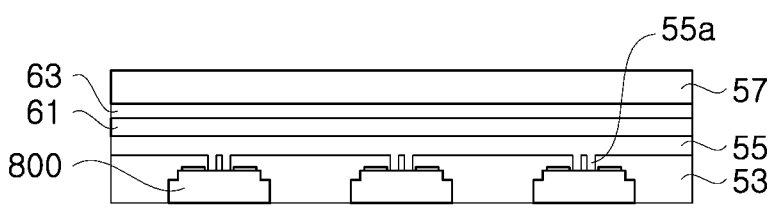
Figure 26G:
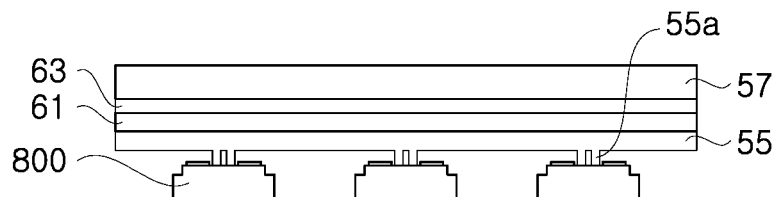

Referring to FIG. 26F, the substrate 51 is removed from the light emitting devices 800. The substrate 51 may be removed by a laser lift-off process or a wet etching process. For example, if a sapphire substrate, it may be removed by the laser lift-off process or a chemical lift-off process, and a GaAs substrate may be removed by the wet etching process.

Referring to FIG. 4G, the first mask layer 53 is removed from the light emitting devices 800 with the substrate 51 removed. The first mask layer 53 may be removed by using, for example, acetone, a dedicated striper, dry etching, or others. Accordingly, the light emitting devices 800 are connected to the connection layer 55 through at least one connection portion 55*a* connected to each light emitting device 800 and maintained as shown in the drawing.

Figure 26H:
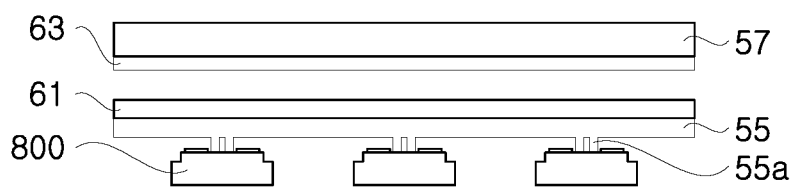

Referring to FIG. 26H, the first temporary substrate 57 coupled to an upper surface is removed. The first temporary substrate 57 may be removed by irradiating heat or UV. The first temporary substrate 57 may be removed without damaging the film layer 61 because the buffer layer 63 is formed of a material melted by heat or UV irradiation.

Figure 26I:
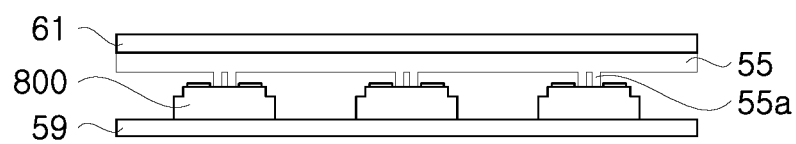
Figure 26J:
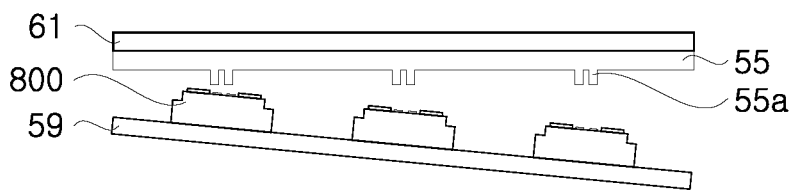

Referring to FIG. 26I, a second temporary substrate 59 is coupled to a lower surface of the light emitting devices 800. The second temporary substrate 59 may be a rubber or UV sheet, or may be a polymer substrate such as PET, PEN, PI sheet, or others, or a substrate such as glass, PC, PMMA, or others.

When the second temporary substrate 59 is coupled to the light emitting devices 800, the light emitting devices 800 are removed from the connection layer 55 by using the second temporary substrate 59 as shown in FIG. 4J. By applying an external force downward to the second temporary substrate 59 coupled to the light emitting devices, the at least one connection portion 55*a* connected to the light emitting devices 800 is cut, and the light emitting devices 800 are separated from the connection layer 55.

The external force applied to the second temporary substrate 59 as shown in the drawing, may be applied in a direction perpendicular to the connection layer 55 at one side of the second temporary substrate 59. Accordingly, each of the light emitting devices 800 may be separated from the connection layer 55 in such a manner that the connection portions 55*a* connected to each light emitting device 800 is sequentially cut.

Figure 26K:
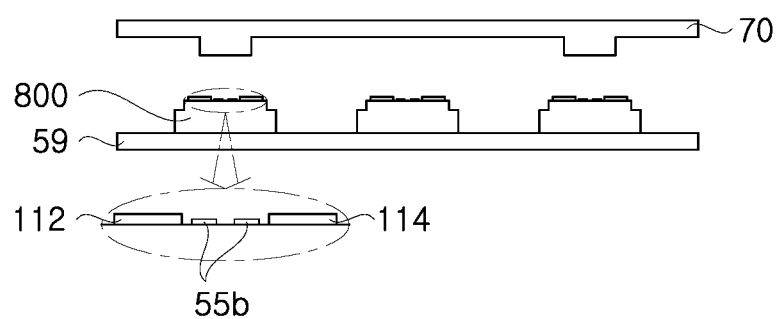

Referring to FIG. 26K, the light emitting devices 800 separated from the connection layer 55 are disposed on the second temporary substrate 59 with a predetermined interval. At least one connection tip 55*b* may be formed on each of the light emitting devices 800 as a residue while the connection portion 55*a* is cut. The connection tip 55*b* is formed of the same material as the connection layer 55, and formed while the connection portion 55*a* is cut by an external force, so that thicknesses of the connection tips 55*b* may be different from one another. Also, the thicknesses of the connection tips 55*b* may be less than thicknesses of the first and second electrode pads 112 and 114 as shown in the drawing.

Figure 26L:
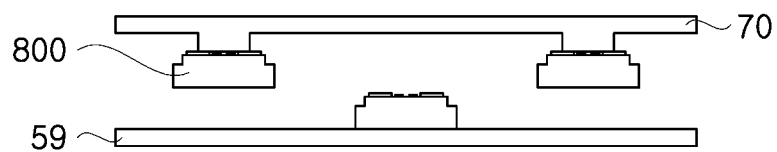

And referring to FIGS. 26K and 26L, a portion of the light emitting devices 800 disposed on the second temporary substrate 59 is transferred to another substrate by using a pickup 70. A substrate onto which the light emitting devices 800 are transferred may be the panel substrate 210 of the displaying apparatus 2000, or the light emitting devices 800 may be transferred to a location for another process, if necessary.

FIGS. 27A to 27K are schematic cross-sectional views illustrating a method of manufacturing a displaying apparatus according to a third exemplary embodiment.

Figure 27A:
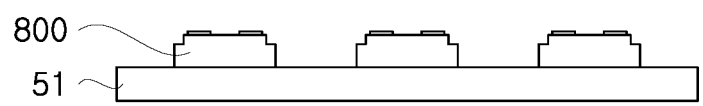
FIGS. 27A, 27B, 27C, 27D, 27E, 27F, 27G, 27H, 27I, 27J, and 27K are schematic cross-sectional views illustrating a method of manufacturing a displaying apparatus according to another exemplary embodiment.

Referring to FIG. 27A, a light emitting device 800 is formed on a substrate 51. The substrate 51 is a substrate for growing semiconductor layers of the light emitting device 800, and may be a sapphire substrate, a GaN substrate, or a GaAs substrate. For example, the substrate 51 may be the sapphire substrate if the light emitting device 800 is a blue light emitting device 800 or a green light emitting device 800, and it may be the GaAs substrate if the light emitting device 800 is a red light emitting device 800.

Figure 27B:
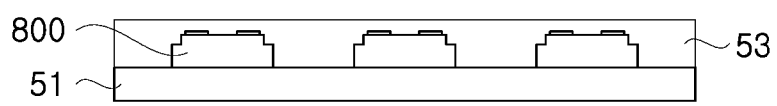

Referring to FIG. 27B, a first mask layer 53 is formed on a substrate 51 so as to cover a plurality of light emitting devices 800. The first mask layer 53 may be formed to completely cover the plurality of light emitting devices 800, and may formed over the light emitting devices 800 to have a predetermined thickness. The first mask layer 53 may be formed of a photosensitive material, for example.

Figure 27C:
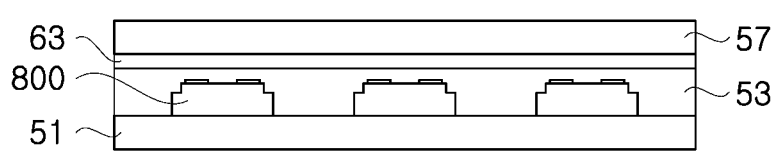

Referring to FIG. 27C, a first temporary substrate 57 is coupled onto the first mask layer 53. The first temporary substrate 57 may be a polymer substrate such as PET, PEN, PI sheet, or others, or may be a substrate such as glass, PC, PMMA, or others. A buffer layer 63 may be disposed between the first temporary substrate 57 and the first mask layer 53. The buffer layer 63 may be disposed on the first mask layer 53, and the first temporary substrate 57 may be disposed on the buffer layer 63.

Figure 27D:

Referring to FIG. 27D, the substrate 51 is removed from the light emitting devices 800. The substrate 51 may be removed using a laser lift-off process, a wet etching process, or others. If the substrate 51 is a sapphire substrate, the substrate 51 may be removed by the laser lift-off process or a chemical lift-off process. If the substrate 51 is a GaAs substrate, the substrate 51 may be removed by the wet etching process.

Figure 27E:
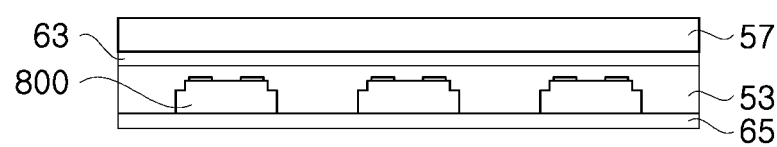

Referring to FIG. 27E, a lower surface of the light emitting devices 800 and a lower surface of the first mask layer 53 may be exposed as the substrate 51 is removed. A second mask layer 65 is formed under the light emitting devices 800 and the first mask layer 53. The second mask layer 65 may cover the lower surface of the light emitting devices 800 and may have a thickness smaller than that of the first mask layer 53.

Figure 27F:
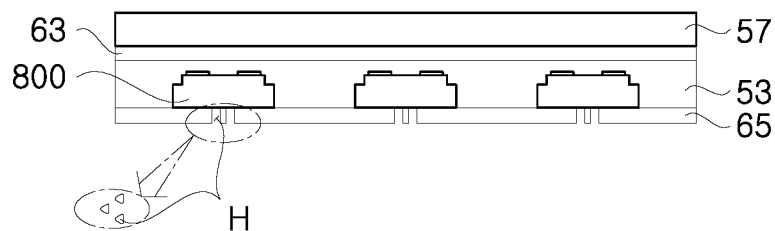

Referring to FIG. 27F, a plurality of holes Hs are formed in the second mask layer 65. At least one hole H may be formed under each light emitting device 800. In the present disclosure, three holes Hs are formed under each light emitting device 800, and the three holes Hs are arranged asymmetrically to at least one direction where the light emitting devices 800 are arranged. Here, the three holes Hs in the drawing are arranged asymmetrically to a direction which is perpendicular to the direction where the light emitting devices 800 are arranged.

The second mask layer 65 may be formed with a photosensitive material as the first mask layer 53, and the plurality of holes Hs may be formed by a photolithography process. The plurality of holes Hs may be formed in a triangular shape as shown in the drawing.

Figure 27G:
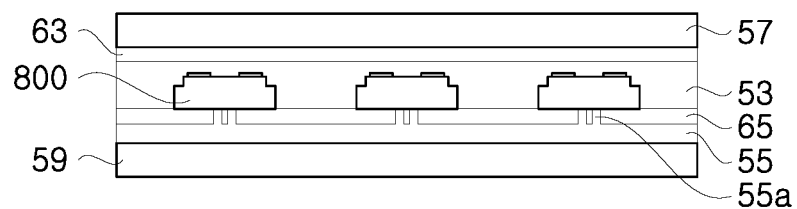

Referring to FIG. 27G, a connection layer 55 is formed under the second mask layer 65. The connection layer 55 is formed under the second mask layer 65 while filling the plurality of holes Hs formed in the second mask layer 65. Since each of the plurality of holes Hs is formed under the light emitting device 800, the connection layer 55 may be connected to the light emitting devices 800 through the holes Hs formed under the light emitting devices 800. Connection portions 55a filling the holes Hs are formed together with the connection layer 55. The connection portions 55a may directly contact the first conductivity type semiconductor layer 23.

The connection layer 55 may comprise an organic material such as poly dimethylpolysiloxane (PDMS), epoxy, acryl, color polyimide, or the like, but it is not limited thereto. Here, the coupling layer 55 may have a light transmittance of 90% or more, and a refractive index may be 1.4 to 1.7.

And a second temporary substrate 59 is coupled to a lower surface of the connection layer 55. The second temporary substrate 59 may be a polymer substrate the same as the first temporary substrate 57 such as PET, PEN, PI sheet, or others, or may be a substrate such as glass, PC, PMMA, or others.

Figure 27H:
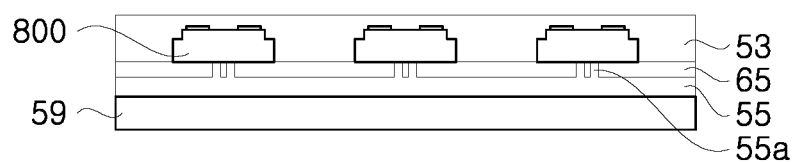

Referring to FIG. 27H, the first temporary substrate 57 coupled to an upper surface is removed. The first temporary substrate 57 may be removed by irradiating heat or UV. The first temporary substrate 57 may be removed from the first mask layer 53 because the buffer layer 63 is formed of a material melted by heat or UV irradiation.

Figure 27I:
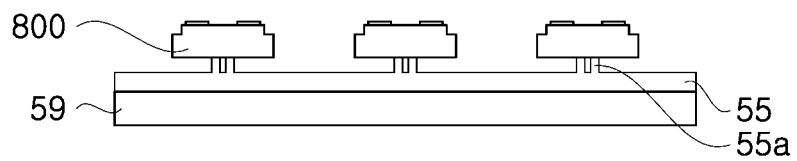

Referring to FIG. 27I, the first mask layer 53 and the second mask layer 65 are removed from the light emitting devices 800. The first mask layer 53 and the second mask layer 65 may be removed by using, for example, acetone, a dedicated striper, dry etching, or others. As shown in the drawing, the light emitting devices 800 are connected to the connection layer 55 by at least one connection portion 55a connected to each light emitting device 800 and maintained.

Figure 27J:
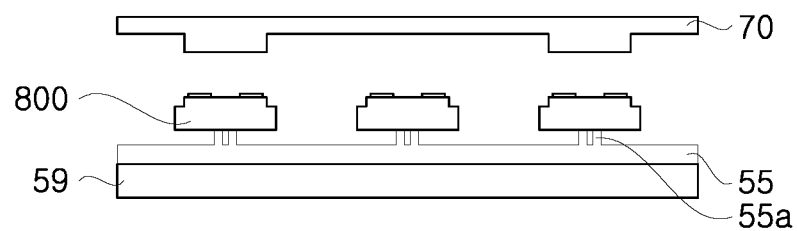

Once the first and second mask layers 53 and 65 are removed, the light emitting devices 800 are disposed over the second temporary substrate 59 while being connected to the connection layer 55 and the connection portion 55a as shown in FIG. 27J. A portion of the light emitting devices 800 disposed over the second temporary substrate 59 may be transferred to another substrate using a pickup 70.

Figure 27K:
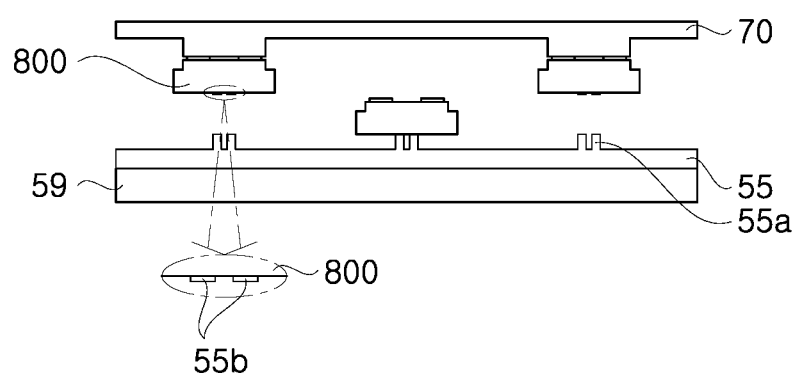

Referring to FIG. 27K, each of the light emitting devices 800 picked up by the pickup 70 is separated from the connection layer 55 by cutting the connection portion 55a from the connection layer 55. The pickup 70 picks up the light emitting devices 800 over the light emitting devices 800, and the connection portion 55a is disposed under the light emitting device 800. Accordingly, at least one connection tip 55b may be formed under each of the light emitting devices 800.

Figure 28A:
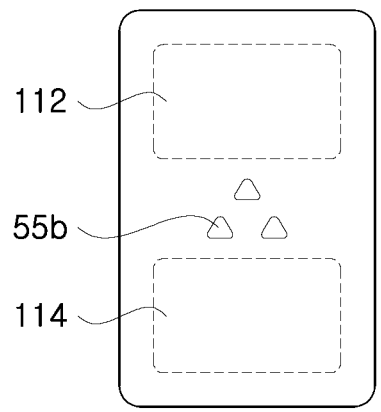
FIGS. 28A, 28B, 28C, 28D, 28E, 28F, 28G, 28H, 28I, 28J, 28K, 28L, 28M, 28N, and 28O are plan views illustrating modified examples of the light emitting device.
Figure 28B:
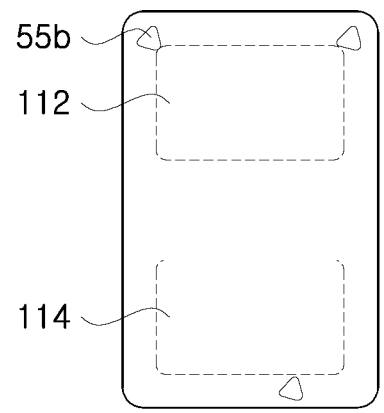
Figure 28C:
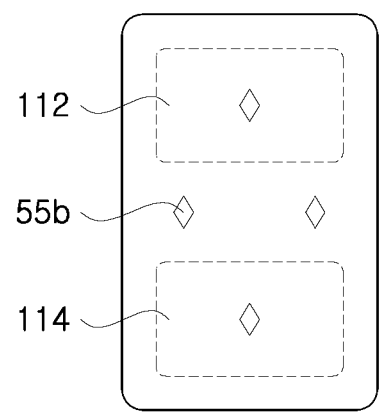
Figure 28D:
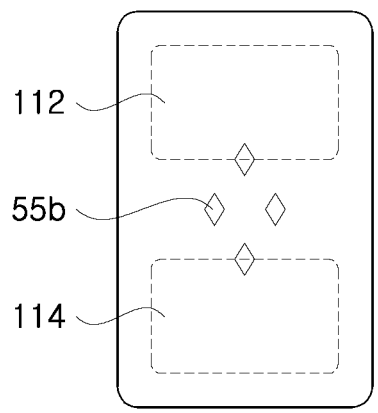
Figure 28E:
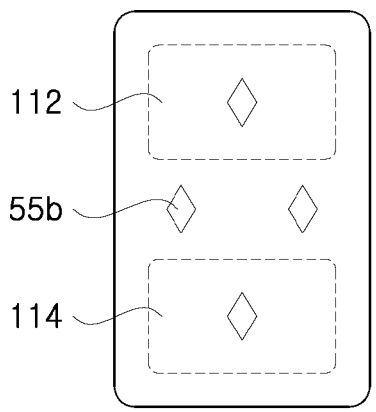
Figure 28F:
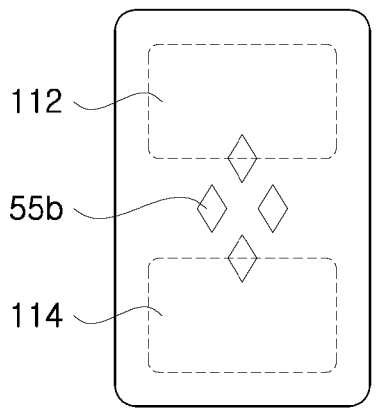
Figure 28G:
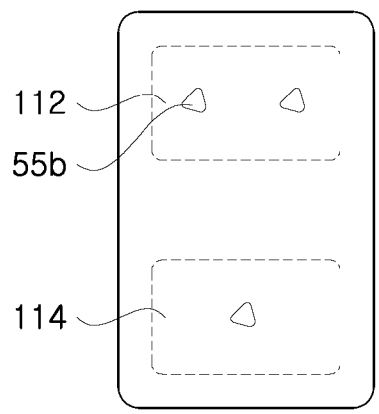
Figure 28H:
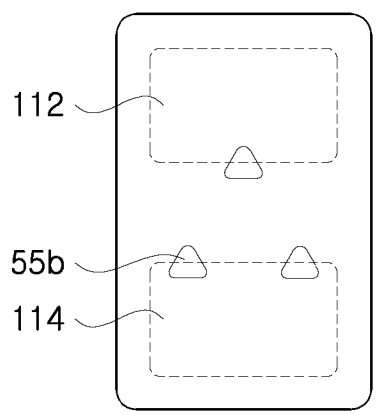
Figure 28I:
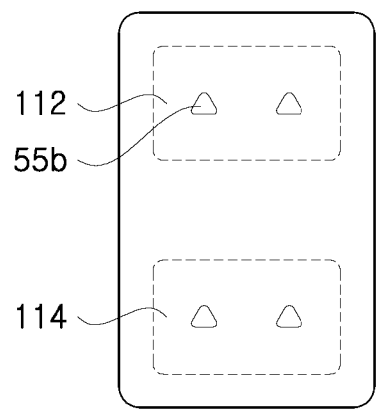
Figure 28J:
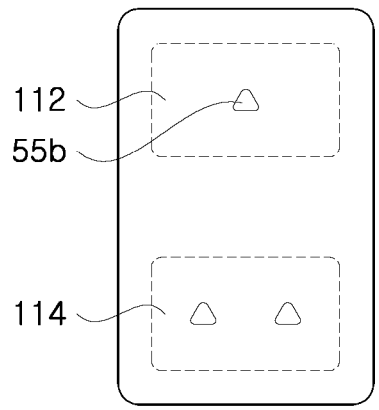
Figure 28K:
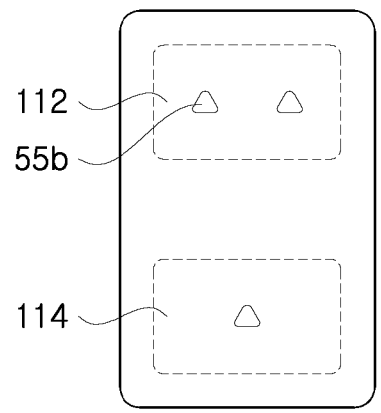
Figure 28L:
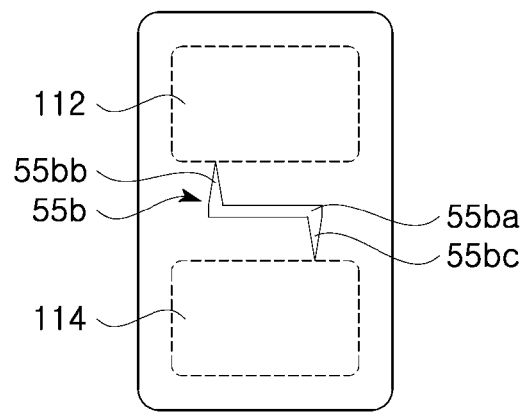
Figure 28M:
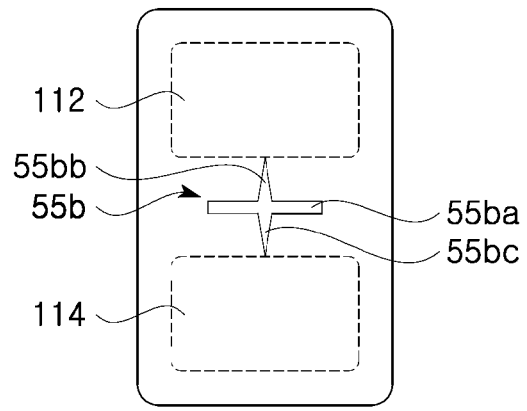
Figure 28N:
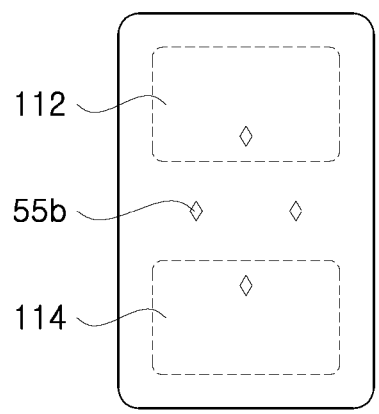
Figure 28O:
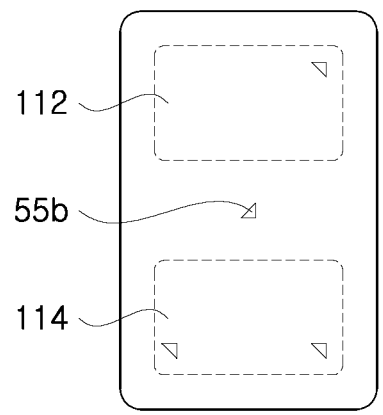

FIGS. 28A to 28O are plan views illustrating modified examples of the light emitting device.

In light emitting devices 800 according to the modified examples shown in FIGS. 28A to 28O as in another exemplary embodiment, a connection tip 55b is disposed on an opposite side to first and second electrode pads 112 and 114. Hereinafter, for convenience of explanation, a location of the connection tip 55b is described as a location relative to the first and second electrode pads 112 and 114. However, the connection tip 55b and the first and second electrode pads 112 and 114 are disposed on opposite sides of the light emitting device 800, and they do not contact each other.

Referring to FIG. 28A, in a first modified example, three connection tips 55b formed in the light emitting device 800 are provided, and disposed between the first and second electrode pads 112 and 114. That is, the three connection tips 55b are formed on an upper surface of the light emitting device 800. The first and second electrode pads 112 and 114 are formed under the light emitting device 800. A shape of the three connection tips 55b may be formed in a triangular shape. At this time, a total area of the three connection tips 55b may be 1.26% as compared with a planar area of the light emitting device 800.

Referring to FIG. 28B, in a second modified example, three connection tips 55b formed in the light emitting device 800 are provided, and disposed outside of the first and second electrode pads 112 and 114. Two connection tips 55b are disposed near the first electrode pad 112, and disposed near two outer corners of the first electrode pad 112. And one remaining connection tip 55b is disposed outside the second electrode pad 114. At this time, the two connection tips 55b disposed on sides of the first electrode pad 112 may be disposed in a direction different from a direction where the first and second electrode pads 112 and 114 are disposed.

And a total area of the three connection tips 55b may be 0.65% as compared with the planar area of the light emitting device 800.

Referring to FIG. 28C, in a third modified example, four connection tips 55b formed on the light emitting device 800 are provided, and are widely disposed on the plane of the light emitting device 800. That is, two of the four connection tips 55b are disposed at a location overlapping with the first and second electrode pads 112 and 114, and the other two are disposed between the first and second electrode pads 112 and 114. At this time, each of the two connection tips 55b disposed at a location overlapping with the first and second electrode pads 112 and 114 may be disposed at centers of the first and second electrode pads 112 and 114.

Here, the connection tips 55b may be formed in a diamond shape, and the four connection tips 55b may be disposed at each corner of the diamond shape. At this time, a total area of the four connection tips 55b may be 1.22% as compared with the planar area of the light emitting device 800.

Referring to FIG. 28D, in a fourth modified example, four connection tips 55b formed in the light emitting device 800 are provided. Portions of two of the four connection tips 55b are disposed to overlap with the first and second electrode pads 112 and 114, and the other two are disposed between the first and second electrode pads 112 and 114. The connection tips 55b of the fourth modified example may be disposed at a relatively small interval as compared with the connection tips 55b of the third modified example.

Each of the connection tips 55b may be formed in a diamond shape, and the four connection tips 55b may be disposed at each corner of the diamond shape. At this time, a total area of the four connection tips 55b may be 1.22% as compared with the planar area of the light emitting device 800.

Referring to FIG. 28E, in a fifth modified example, four connection tips 55b formed in the light emitting device 800 are provided. The connection tips 55b of the fifth modified example may be disposed in the same manner as the connection tips 55b of the third modified example. At this time, a total area of the connection tips 55b of the fifth modified example is formed larger than that of the connection tips 55b of the third modified example, and may be 2.71% as compared with the planar area of the light emitting device 800.

Referring to FIG. 28F, in a sixth modified example, four connection tips 55b formed in the light emitting device 800 are provided. The connection tips 55b of the sixth modified example may be disposed in the same manner as the connection tips 55b of the fourth modified example. At this time, a total area of the connection tips 55b of the sixth modified example is formed larger than that of the connection tips 55b of the fourth modified example, and may be 2.71% as compared with the planar area of the light emitting device 800.

Referring to FIG. 28G, in a seventh modified example, three connection tips 55b formed in the light emitting device 800 are provided, and disposed at locations overlapping with the first and second electrode pads 112 and 114. That is, two connection tips 55b are disposed at locations overlapping with the first electrode pads 112, and the remaining connection tip 55b is disposed at a location overlapping with the second electrode pads 114. The two connection tips 55b disposed on a side of the first electrode pad 112 may be disposed in a direction different from a direction in which the first and second electrode pads are disposed.

A total area of the three connection tips 55b may be 0.58% as compared with the planar area of the light emitting device 800.

Referring to FIG. 28H, in an eighth modified example, three connection tips 55b formed in the light emitting device 800 are provided, and disposed at locations overlapping with the first and second electrode pads 112. One of the three connection tips 55b is disposed at a location partially overlapping with the first electrode pad 112, and the other two connection tips 55b are disposed at a location partially overlapping with the second electrode pad 114. At this time, the three connection tips 55b may be formed in a triangular shape, and the three connection tips 55b may be disposed at each corner of the triangular shape. And the connection tips 55b of the eighth modified example are formed larger than the connection tips 55b of the first modified example, and may be 2.76% as compared with the planar area of the light emitting device 800.

Referring to FIG. 28I, in a ninth modified example, four connection tips 55b formed in the light emitting device 800 are provided, and disposed at locations overlapping with the first and second electrode pads 112 and 114. Two of the four connection tips 55b are disposed at locations overlapping with the first electrode pad 112, and the other two are disposed at locations overlapping with the second electrode pad 114. Here, the connection tips 55b of the ninth modified example may be formed in a triangular shape. And a total area of the connection tips 55b may be 1.68% as compared with the planar area of the light emitting device 800.

Referring to FIG. 28J, in a tenth modified example, three connection tips 55b formed in the light emitting device 800 are provided, and disposed at locations overlapping with the first and second electrode pads 112 and 114. One of the three connection tips 55b is disposed at a location overlapping with the first electrode pad 112, and the other two are disposed at a location overlapping with the second electrode pad 114. And a total area of the connection tips 55b may be 1.26% as compared with the planar area of the light emitting device 800.

Referring to FIG. 28K, in an eleventh modified example, three connection tips 55b formed in the light emitting device 800 are provided, and the connection tips 55b are disposed at locations overlapping with the first and second electrode pads 112 and 114. Two of the three connection tips 55b are disposed at locations overlapping with the first electrode pad 112, and the other one is disposed at a location overlapping with the second electrode pad 114. And a total area of the connection tips 55b may be 1.26% as compared with the planar area of the light emitting device 800.

Referring to FIG. 28L, in a twelfth modified example, a connection tip 55b formed in the light emitting device 800 is disposed between the first and second electrode pads 112 and 114. The connection tip 55b is formed to have a base 55ba having a longitudinal length perpendicular to a direction where the first and second electrode pads 112 and 114 are disposed, a first extension 55bb disposed at one longitudinal end of the base 55ba and extending toward the electrode pad 112, and a second extension 55bc disposed at the other longitudinal end of the base 55ba and extending toward the second electrode pad 114. At this time, each of the first and second extensions 55bb and 55bc may be formed in a shape having a narrower width as a distance from the base 55ba increases.

At this time, a total area of the connection tip 55b may be 1.92% as compared with the planar area of the light emitting device 800.

Referring to FIG. 28M, in a thirteenth modified example, a connection tip 55b formed in the light emitting device 800 is disposed between the first and second electrode pads 112 and 114. The connection tip 55b is formed to have a base 55ba having a longitudinal length perpendicular to a direction where the first and second electrode pads are disposed, a first extension 55bb at a center of the base 55ba extending toward the electrode pad 112, and a second extension 55bc at a center of the base 55ba extending toward the second electrode pad 114. At this time, each of the first and second extensions 55bb and 55bc may be formed in a shape having a narrower width as a distance from the base 55ba increases.

At this time, a total area of the connection tip 55b may be 1.161% as compared with the planar area of the light emitting device 800.

Referring to FIG. 28N, in a fourteenth modified example, four connection tips 55b formed in the light emitting device 800 are provided. Two of the four connection tips 55b are disposed at locations overlapping with the first and second electrode pads 112 and 114, and the other two are disposed between the first and second electrode pads 112 and 114. At this time, each of the connection tips 55b disposed on the first and second electrode pads 112 and 114 may be disposed at an edge of the first and second electrode pads 112 and 114, respectively. At this time, the connection tip 55b overlapped with the first electrode pad 112 may be disposed at a location close to the second electrode pad 114 from the first electrode pad 112, and the connection tip 55b overlapped with the second electrode pad 114 may be disposed at a location close to the first electrode pad 112 from the second electrode pad 114. At this time, a total area of the four connection tips 55b may be 0.49% as compared with the planar area of the light emitting device 800.

Referring to FIG. 28O, in the fifteenth modified example, four connection tips 55b formed in the light emitting device 800 are provided. One connection tip is disposed approximately at a center of the light emitting device 800, two connection tips are disposed at locations overlapped with the second electrode pad 114, and one connection tips is disposed at a location overlapped with the first electrode pad 112. Three connection tips 55b are disposed in a triangular shape at an outer periphery of the light emitting device 800, and the one connection tip 55b at the center of the light emitting device 800 may be located in the triangle formed by the three connection tips 55b.

The two connection tips disposed at the locations overlapped with the second electrode pad 114 may be disposed near one edge of the second electrode pad 114, and may be disposed to be opposite to each other with respect to an elongated straight line passing through the center.

In the meantime, the one connection tip disposed at the location overlapped with the first electrode pad 112 may be disposed near one edge of the first electrode pad 112, and may be disposed apart from the elongated straight line passing through the center.

Each of the connection tips may have a right triangular shape, and the connection tip disposed at the center of the light emitting device 800 may be disposed in a direction opposite to the other connection tips as shown in the drawing.

When the light emitting devices are separated from the connection layer using the connection tips, the connection tip overlapped with the first electrode pad 112 may be formed first, then the connection tip near the center may be formed, and the connection tips overlapped with the second electrode pad 114 may be formed last. Accordingly, the light emitting devices may be easily separated from the connection layer, and it is possible to prevent cracks that may occur in the light emitting device.

Furthermore, when the light emitting device 800 is picked up or mounted, the light emitting device 800 may be unstably picked up or mounted depending on locations of the connection tips, and thus cracks may be caused. On the contrary, by arranging the connection tips at both side edges of the light emitting device 800 and near the center of the light emitting device 800, respectively, the light emitting device 800 may be stably picked up or mounted, and it is possible to prevent cracks that may occur in the light emitting device.

A total area of the four connection tips 55*b* may be 0.8% as compared with the planar area of the light emitting device 800.

When areas of the connection tips 55*b* formed in the light emitting device 800 are formed to be different from one another, Table 1 shows a comparison between area ratios of the connection tips 55*b* and success probabilities of picking up the light emitting device 800.

TABLE 1

|  | Area ratio (Based on the area of the light emitting device) | Pickup success rate of the light emitting device |
| --- | --- | --- |
| 1st Modified Example | 1.26% | Not less than 50% |
| 2nd Modified Example | 0.65% | Good |
| 3rd Modified Example | 1.22% | Not less than 50% |
| 4th Modified Example | 1.22% | Not less than 50% |
| 5th Modified Example | 2.71% | Bad |
| 6th Modified Example | 2.71% | Bad |
| 7th Modified Example | 0.58% | Good |
| 8th Modified Example | 2.76% | NG |
| 9th Modified Example | 1.68% | Less than 50% |
| 10th Modified Example | 1.26% | Not less than 50% |
| 11th Modified Example | 1.26% | About 50% |
| 12th Modified Example | 1.92% | Less than 50% |
| 13th Modified Example | 1.61% | Less than 50% |
| 14th Modified Example | 0.49% | Good |
| 15th Modified Example | 0.8% | Good |

Through the first to fifteenth modified examples, it is confirmed that the pick-up success rate of the light emitting devices 800 is satisfactory when the area ratio of the connection tips 55*b* is about 1.2% or less as compared with the planar area of the light emitting device 800.

Figure 29A:
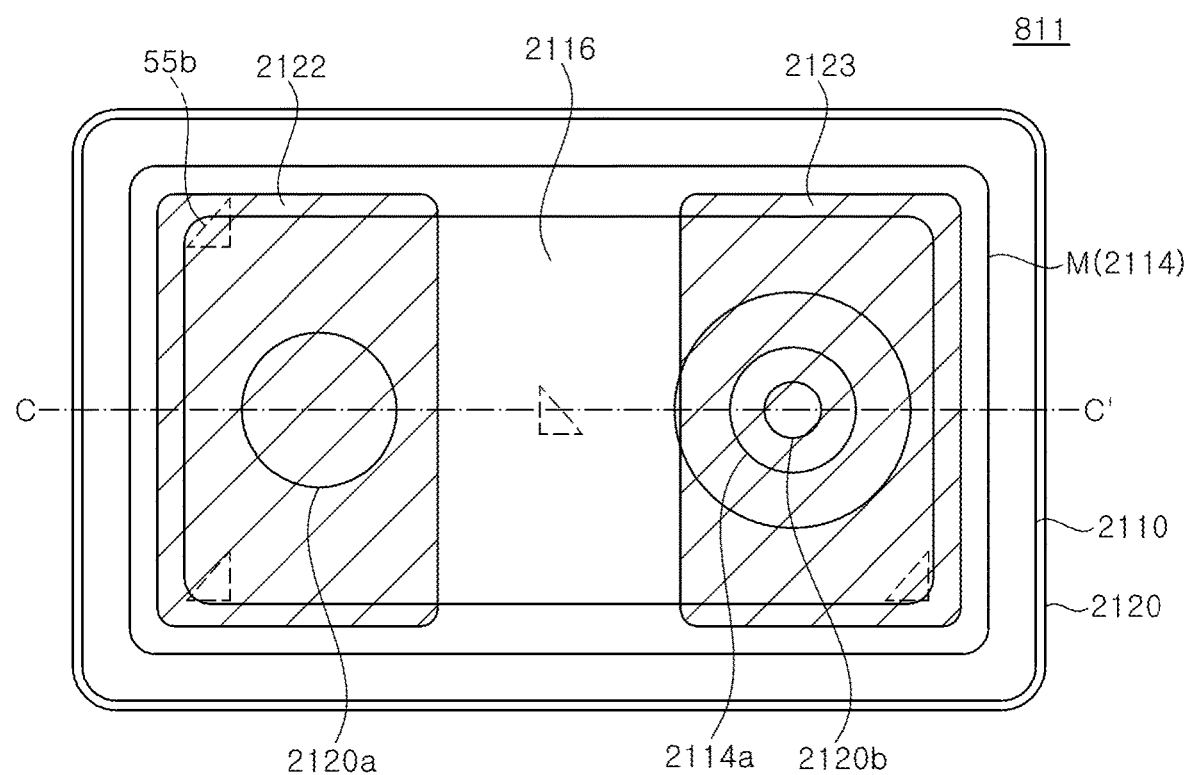
FIG. 29A is a schematic plan view illustrating a light emitting device according to another exemplary embodiment of another exemplary embodiment.
Figure 29B:
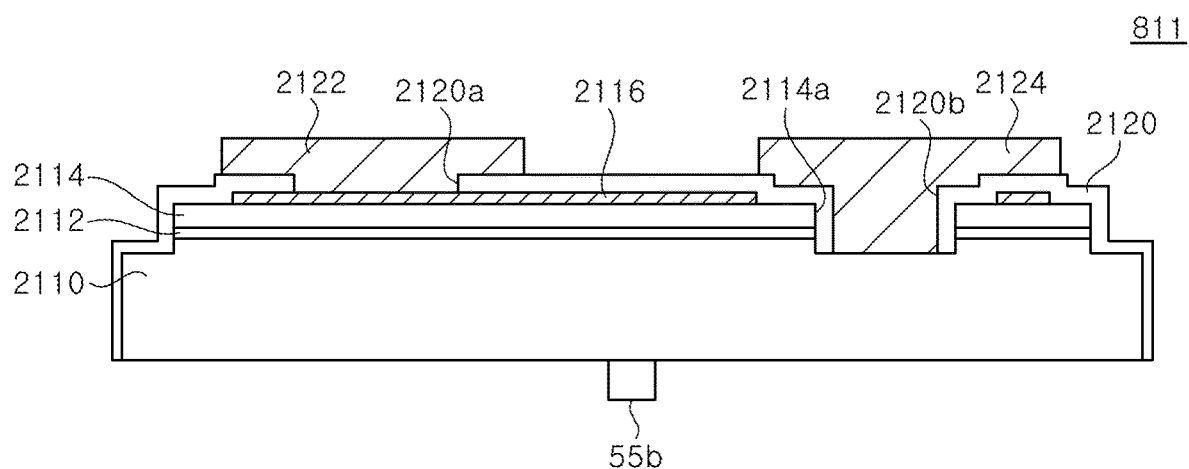
FIG. 29B is a schematic cross-sectional view taken along the line of C-C'.

FIG. 29A is a schematic plan view illustrating a light emitting device 811 according to another exemplary embodiment, and FIG. 29B is a schematic cross-sectional view taken along the line C-C' in FIG. 29A. Although the first light emitting device 811 of one of the light emitting devices used for the pixel P is exemplarily described, but it can also be applied to other light emitting devices described later, for example, a second and third light emitting devices 813 and 815.

Referring to FIGS. 29A and 29B, the first light emitting device 811 may comprise a first conductivity type semiconductor layer 2110, an active layer 2112, and a second conductivity type semiconductor layer 2114, an ohmic-contact layer 2116, an insulation layer 2120, a first terminal 2122, and a second terminal 2124. In the meantime, connection tips 55*b* may be disposed on a side of the first conductivity type semiconductor layer 2110 opposite to the first terminal 2122 and the second terminal 2124.

The first conductivity type semiconductor layer 2110, the active layer 2112, and the second conductivity type semiconductor layer 2114 may be grown on a substrate. The substrate may be a variety of substrates capable of growing semiconductors such as a gallium nitride substrate, a GaAs substrate, a Si substrate, a sapphire substrate, especially a patterned sapphire substrate, or others. The growth substrate may be separated from the semiconductor layers using techniques such as mechanical polishing, laser lift off, chemical lift off, or others. However, the present disclosure is not limited thereto, and a portion of the substrate may remain to form at least a portion of the first conductivity type semiconductor layer 2110.

In the case of a light emitting device emitting green light, semiconductor layers may comprise indium gallium nitride (InGaN), gallium nitride (GaN), gallium phosphide (GaP), aluminum gallium indium phosphide (AlGaInP), or aluminum gallium phosphide (AlGaP). In one exemplary embodiment, in the case of a light emitting device emitting red light, semiconductor layers may comprise aluminum gallium arsenide (AlGaAs), gallium arsenide phosphide (GaAsP), aluminum gallium indium phosphide, or gallium phosphide (GaP). In one exemplary embodiment, in the case of a light emitting device emitting blue light, a semiconductor layer may comprise gallium nitride (GaN), indium gallium nitride (InGaN), or zinc selenide (ZnSe).

The semiconductor layers comprise specifically the first conductivity type semiconductor layer 2110, the active layer 2112, and the second conductivity type semiconductor layer 2114. As the first conductivity type and the second conductivity type are opposite in polarity, when the first conductivity type is n-type, the second conductivity type is p, and when the second conductivity type is p-type, the second conductivity type is n-type The first conductivity type semiconductor layer 2110, the active layer 2112 and the second conductivity type semiconductor layer 2114 may be formed on a substrate in a chamber using a known method such as metal organic chemical vapor deposition (MOCVD). In addition, the first conductivity type semiconductor layer 2110 comprises n-type impurities (for example, Si, Ge, and Sn), and the second conductivity type semiconductor layer 2114 comprises p-type impurities (for example, Mg, Sr and Ba). In one exemplary embodiment, the first conductivity type semiconductor layer 2110 may comprise GaN or AlGaN containing Si as a dopant, and the second conductivity type semiconductor layer 2114 may comprise GaN or AlGaN containing Mg as a dopant.

Although each of the first conductivity type semiconductor layer 2110 and the second conductivity type semiconductor layer 2114 is illustrated as a single layer in the drawings, these layers may be multiple layers, or may comprise superlattice layers. The active layer 2112 may comprise a single quantum well structure or a multiple quantum well structure, and a composition ratio of a nitride-based semiconductor is adjusted to emit a desired wavelength. For example, the active layer 2112 may emit blue light, green light, red light, or ultraviolet light.

The second conductivity type semiconductor layer 2114 and the active layer 2112 have a mesa (M) structure and are disposed on the first conductivity type semiconductor layer 2110. The mesa M may comprise the second conductivity type semiconductor layer 2114 and the active layer 2112, and may comprise a portion of the first conductivity type semiconductor layer 2110 as shown in FIG. 29B. When the mesa M is disposed on a portion of the first conductivity type semiconductor layer 2110, an upper surface of the first conductivity type semiconductor layer 2110 may be exposed around the mesa M.

In addition, the mesa M may have a through hole 2114a exposing the first conductivity type semiconductor layer 2110. The through hole 2114a may be disposed close to one side edge of the mesa M, but the present disclosure is not limited thereto, the through hole 2114a may be disposed at a center of the mesa M.

The ohmic-contact layer 2116 is disposed on the second conductivity type semiconductor layer 2114 to be in ohmic-contact with the second conductivity type semiconductor layer 2114. The ohmic-contact layer 2116 may be formed as a single layer or a multiple layer, or may be formed of a transparent conductive oxide layer or a metal layer. Examples of the transparent conductive oxide layers include ITO, ZnO or others, and examples of the metal layers include metals such as Al, Ti, Cr, Ni, Au, or an alloy thereof.

The insulation layer 2120 covers the mesa M and the ohmic-contact layer 2116. Further, the insulation layer 2120 may cover an upper surface and side surfaces of the first conductivity type semiconductor layer 2110 exposed around the mesa M. In the meantime, the insulation layer 2120 may have an opening 2120a exposing the ohmic-contact layer 2116 and an opening 2120b exposing the first conductivity type semiconductor layer 2110 in the through hole 2114a. The insulation layer 2120 may be formed of a single- or multi-layer of a silicon oxide layer or a silicon nitride layer. In addition, the insulation layer 2120 may comprise an insulated reflector, such as a distributed Bragg reflector.

The first terminal 2122 and the second terminal 2124 are disposed on the insulation layer 2120. The first terminal 2122 may be electrically connected to the ohmic-contact layer 2116 through the opening 2120a, and the second terminal 2124 may be electrically connected to the first conductivity type semiconductor layer 2110 through the opening 2120b.

The first and/or second terminals 2122 and 2124 may have a single-, or a multi-layer metal. The first and/or second terminals 2122 and 2124 may include metals such as Al, Ti, Cr, Ni, Au, or an alloy thereof.

In the meantime, the connection tips 55b may be disposed as described with reference to FIG. 28O, but the present disclosure is not limited thereto, they may be disposed at other locations. However, it is possible to effectively prevent occurrence of cracks in the light emitting device by disposing the connection tips 55b as described with reference to FIG. 28O.

In the exemplary embodiment, the light emitting device 811 is roughly described with reference to drawings. The light emitting device 811 may further include a layer with additional functionality in addition to the above-mentioned layers. For instance, various layers, such as a reflection layer that reflects the light, an additional insulation layer that insulates specific components, and a solder prevention layer that prevents a solder from being diffused, may be included in the light emitting device 811.

In addition, when a flip-chip type light emitting device is formed, a mesa may be formed in various shapes, locations and shapes of the first and second terminals 2122 and 2124 may be variously changed. In addition, the ohmic-contact layer 2116 may be omitted, and the first terminal 2122 may directly contact the second conductivity type semiconductor layer 2114. Further, a second contact layer may be formed on the first conductivity type semiconductor layer 2110, and the second terminal 2124 may be connected to the second contact layer as in the case of the light emitting devices 511 and 611 described above.

Figure 30A:
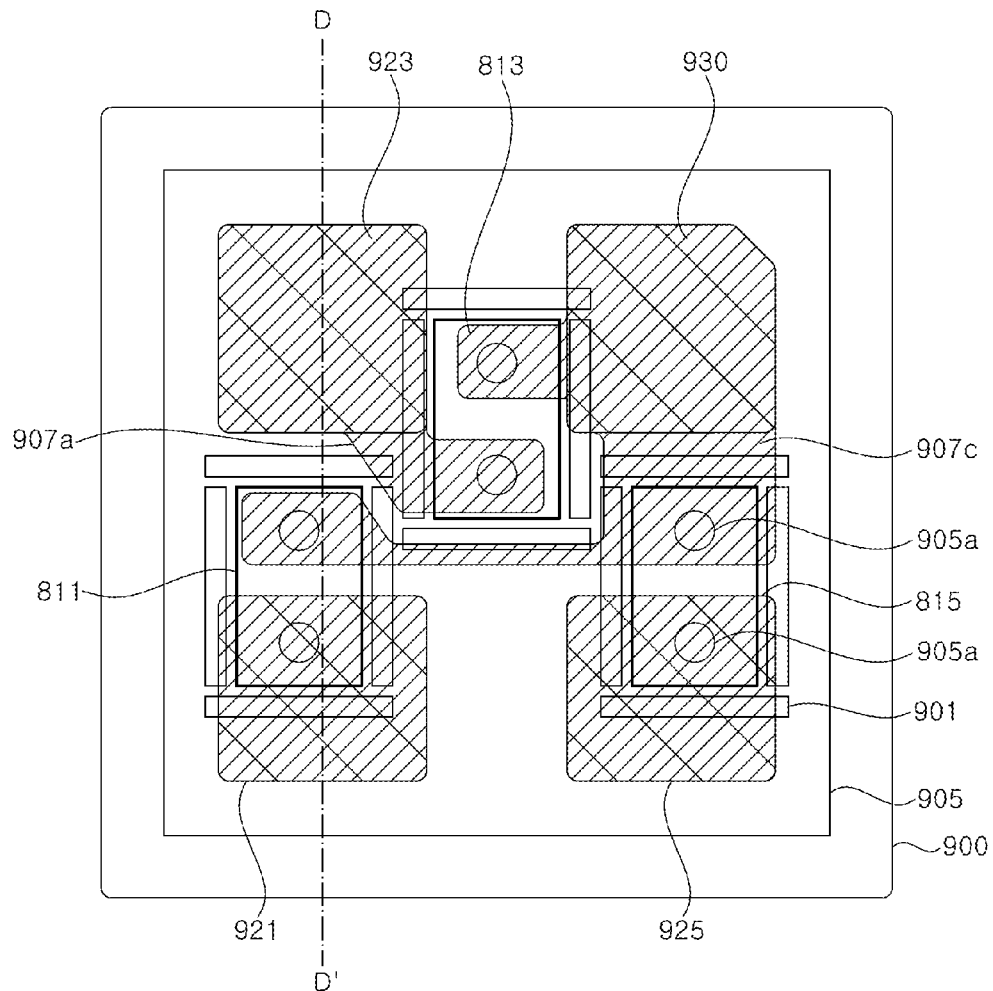
FIG. 30A is a schematic plan view illustrating a pixel region according to another exemplary embodiment.
Figure 30B:
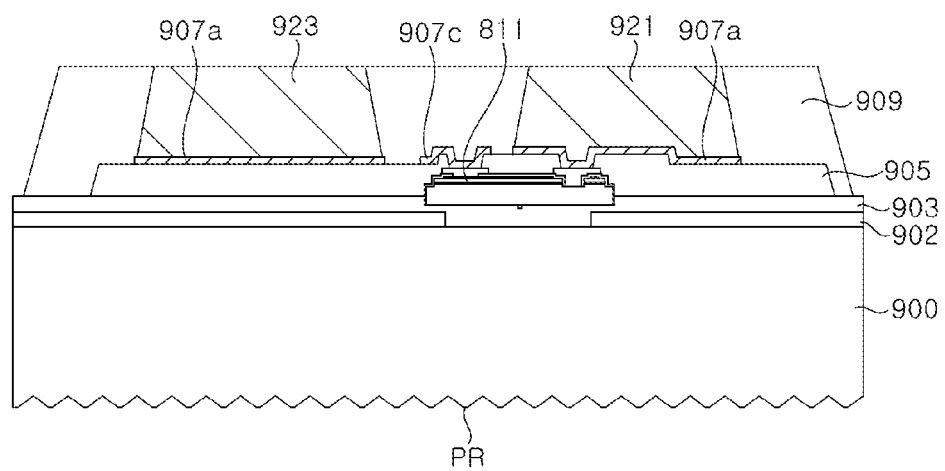
FIG. 30B is schematic cross-sectional view taken along the line of D-D'.

FIG. 30A is a schematic plan view illustrating a pixel region Pa according to another exemplary embodiment, and FIG. 30B is a schematic cross-sectional view taken along the line D-D' in FIG. 30A. Here, the pixel Pa represents a region where a single pixel P is disposed in a light emitting module or a pixel unit including at least one pixel P.

Referring to FIGS. 30A and 30B, the pixel region Pa may comprise a base substrate 900, first to third light emitting devices 811, 813 and 815, alignment markers 901, a light blocking layer 902, an adhesive layer 903, a step adjustment layer 905, connection layers 907a, 907b, and 907c, bumps 921, 923, 925 and 930, and a protection layer 909.

In the present exemplary embodiment, the base substrate 900 does not include a circuit. The base substrate 900 is a light-transmitting substrate such as a glass substrate, a quartz substrate, or a sapphire substrate.

Although a single pixel region Pa is shown here, a plurality of pixels P may be formed on the single base substrate 900.

The base substrate 900 is disposed on a light emitting surface of the displaying apparatus and light emitted from the light emitting devices 811, 813, and 815 is emitted to outside through the base substrate 900. The base substrate 900 may have projections and depressions PR on the light emitting surface, and light emission efficiency may be improved through the projections and depressions PR, and more uniform light may be emitted. The base substrate 900 may have a thickness of, for example, 50 um to 500 um.

The light blocking layer 902 may comprise an absorbing material that absorbs light, such as carbon black. The light absorbing material prevents the light generated in the light emitting devices 811, 813 and 815 from leaking to a side in a region between the base substrate 900 and the light emitting devices 811, 813 and 815, and thus contrast of the displaying apparatus may be improved.

The light blocking layer 902 may have a window for providing a light path so that the light generated in the light devices 811, 813, and 815 is incident on the base substrate 900. For this purpose, the light blocking layer 902 may be subjected to patterning to expose the base substrate 900. A width of the window may be smaller than that of the light emitting device.

The adhesive layer 903 is attached on the base substrate 900. The adhesive layer 903 may be attached to the entire surface of the base substrate 900, and used to attach the light emitting devices 811, 813, and 815. The adhesive layer 903 may fill the window formed in the light blocking layer 902.

The adhesive layer 903 transmits light emitted from the light emitting devices 811, 813, and 815 to a light-transmitting layer. The adhesive layer 903 may comprise diffusers such as SiO2, TiO2, or ZnO to diffuse light. The light diffusing material prevents the light emitting devices 811, 813, and 815 from being observed from the light emitting surface.

The alignment markers 901 (shown in FIG. 30A, but omitted in FIG. 30B) indicate locations for disposing the first to third light emitting devices 811, 813, and 815. Alignment markers 901 may be formed on the base substrate 900 or on the adhesive layer 903.

In the meantime, each of the first to third light emitting devices 811, 813, and 815 are disposed on regions formed by the alignment markers 901. The first to third light emitting devices 811, 813 and 815 may be a green light emitting device, a red light emitting device, or a blue light emitting device, for example. In the present exemplary embodiment, the first to third light emitting devices 811, 813 and 815 are illustrated as arranged in a triangle, but the present disclosure is not limited thereto, they may be arranged linear.

The first to third light emitting devices 811, 813, and 815 may be those described above with reference to FIGS. 29A and 29B, but the present disclosure is not limited thereto, and various light emitting devices having a horizontal or flip-chip structure may be used.

The step adjustment layer 905 covers the first to third light emitting devices 811, 813, and 815. The step adjustment layer 905 has openings 905a exposing the first and second terminals 2122 and 2124 of the light emitting devices. The step adjustment layer 905 may be formed to equalize a height of a location where the bumps are formed when forming the bumps. The step adjustment layer 905 may be formed of polyimide, for example.

Connection layers 907a and 907c are formed on the step adjustment layer 905. Connection layers 907a, 907b, and 907c are electrically connected to the first and second terminals 2122 and 2122 of the first to third light emitting devices 811, 813, and 815 through the openings 905a of the step adjustment layer 905.

For example, the connection layers 907a are electrically connected to the first conductivity type semiconductor layer of the second light emitting device 813, and the connection layer 907c is electrically connected to the second conductivity type semiconductor layers of the first to third light emitting devices 811, 813, and 185. The connection layers 907a and 907c may be formed together on the step adjustment layer 905, and may include Au, for example.

Bumps 921, 923, 925, and 930 are formed on the connection layers 907a. For example, the first bump 921 may be electrically connected to the first conductivity type semiconductor layer of the first light emitting device 811 through the connection layer 907a, and the second bump 923 may be electrically connected to the first conductivity type semiconductor layer of the second light emitting device 813 through the connection layer 907a, and the third bump 925 may be electrically connected to the first conductivity type semiconductor layer of the third light emitting device 815 through the connection layer 907a. In the meantime, the fourth bump 930 may be commonly connected to the second conductivity type semiconductor layers of the first to third light emitting devices 811, 813, and 815 through the connection layer 907c. The bumps 921, 923, 925, and 930 may be formed of a solder for example.

In the meantime, a protection layer 909 may cover side surfaces of the bumps 921, 923, 925, and 930, and may cover the step adjustment layer 905. Further, the protection layer 909 may cover the adhesive layer 903 exposed around the step adjustment layer 905. The protection layer 909 may be formed of a photosensitive solder resist (PSR), for example, and thus the bumps 921, 923, 925, and 930 may be formed after patterning the protection layer 909 through photolithography and development. The protection layer 909 may also be formed of a light-absorbing material such as a white reflective material or black epoxy to prevent light leakage.

Although some exemplary embodiments have been described above, it should be understood that these embodiments are provided for illustration only and are not to be construed in any way as limiting the present disclosure. It should be understood that features or components of one exemplary embodiment can also be applied to other exemplary embodiments without departing from the spirit and scope.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A displaying apparatus, comprising:
a panel substrate;
a plurality of light emitting devices arranged on the panel substrate; and
at least one connection tip disposed on one surface of each of the light emitting devices,
wherein each of the light emitting devices comprises:
a light emitting structure comprising a first conductivity type semiconductor layer, a second conductivity type semiconductor layer and an active layer interposed between the first and second conductivity type semiconductor layers; and
first and second electrode pads disposed on the light emitting structure, and
wherein the at least one connection tip is formed of material with a light transmittance of at least 90%.

2. The displaying apparatus of claim 1, wherein the at least one connection tip is disposed on the light emitting structure, and is disposed between the first and second electrode pads.

3. The displaying apparatus of claim 2, wherein a thickness of the at least one connection tip is smaller than a thicknesses of the first and second electrode pads.

4. The displaying apparatus of claim 1, wherein the at least one connection tip is disposed on an opposite side of the light emitting structure opposite to the first and second electrode pads.

5. The displaying apparatus of claim 4, wherein the at least one connection tip contacts the first conductivity type semiconductor layer.

6. The displaying apparatus of claim 1, wherein:
a plurality of connection tips are disposed on each of the light emitting devices, and
the plurality of connection tips arranged on each of the light emitting devices are disposed asymmetrically to at least one alignment direction of the light emitting devices arranged on the panel substrate.

7. The displaying apparatus of claim 6, wherein:
the at least one connection tip comprises three connection tips arranged in a triangular shape,
one of the three connection tips is disposed along a first row, and
the other two connection tips are disposed along another row adjacent to the first row.

8. The displaying apparatus of claim 7, wherein:
the at least one connection tip further comprises a connection tip disposed at a center of the light emitting device, and
the connection tip disposed at the center of the light emitting device is disposed in the triangle shape formed by the three connection tips.

9. The displaying apparatus of claim 8, wherein the connection tips have right triangular shapes.

10. The displaying apparatus of claim 9, wherein the connection tip disposed at the center of the light emitting device is disposed in a different direction from that of the other connection tips.

11. The displaying apparatus of claim 6, wherein the plurality of connection tips have different thicknesses.

12. The displaying apparatus of claim 1, wherein an area ratio of the connection tip to a planar area of the light emitting device is 1.2% or less.

13. The displaying apparatus of claim 1, wherein the first electrode pad is electrically connected to the first conductivity type semiconductor layer through a via-hole formed in the second conductivity type semiconductor layer and the active layer.

14. The displaying apparatus of claim 1, wherein the light emitting device further comprises an insulation layer covering the second conductivity type semiconductor layer and side surfaces of the first conductivity type semiconductor layer.

15. The displaying apparatus of claim 14, wherein:
the light emitting device further comprises an ohmic-layer disposed on the second conductivity type semiconductor layer, and
the insulation layer covers the ohmic-layer and side surfaces of the first conductivity type semiconductor layer.

16. The displaying apparatus of claim 1, further comprising:
bumps electrically connected to the light emitting devices;
a base substrate disposing opposite to the bumps and transmitting light emitted from the light emitting devices;
a step adjustment layer disposed between the bumps and the light emitting devices to cover the light emitting devices; and
an adhesive layer disposed between the base substrate and the light emitting devices to adhere the light emitting devices to the base substrate,
wherein the step adjustment layer and the adhesive layer cover side surfaces of the light emitting device.

17. The displaying apparatus of claim 16, further comprising: a protection layer covering side surfaces of the bumps and the step adjustment layer.

18. The displaying apparatus of claim 16, wherein the connection tips are buried in the adhesive layer.

19. The displaying apparatus of claim 16, wherein the base substrate has irregularities on a surface thereof.

20. The displaying apparatus of claim 16, further comprising: a light blocking layer disposed between the adhesive layer and the base substrate, wherein the light blocking layer has a window transmitting light generated in the light emitting device, and a width of the window is smaller than that of the light emitting device.

* * * * *